United States Patent
Sakariya et al.

(10) Patent No.: US 11,373,986 B2
(45) Date of Patent: Jun. 28, 2022

(54) LIGHT EMITTING DEVICE REFLECTIVE BANK STRUCTURE

(71) Applicant: Apple Inc., Cupertino, CA (US)

(72) Inventors: Kapil V. Sakariya, Los Altos, CA (US); Andreas Bibl, Los Altos, CA (US); Hsin-Hua Hu, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/998,917

(22) Filed: Aug. 20, 2020

(65) Prior Publication Data
US 2021/0028153 A1    Jan. 28, 2021

Related U.S. Application Data

(63) Continuation of application No. 16/028,611, filed on Jul. 6, 2018, now Pat. No. 10,784,236, which is a
(Continued)

(51) Int. Cl.
  *H01L 29/06* (2006.01)
  *H01L 31/00* (2006.01)
  (Continued)

(52) U.S. Cl.
  CPC ........ *H01L 25/0753* (2013.01); *H01L 25/167* (2013.01); *H01L 33/06* (2013.01);
  (Continued)

(58) Field of Classification Search
  CPC ..... H01L 25/0753; H01L 33/06; H01L 33/36; H01L 25/167; H01L 33/44; H01L 33/62; H01L 33/60; H01L 2224/82; H01L 2224/24137; H01L 2224/73267; H01L 2224/92244; H01L 2224/83; H01L 2224/95; H01L 2924/0002; H01L 2224/18;
  (Continued)

(56) References Cited

U.S. PATENT DOCUMENTS 5,592,358 A   1/1997  Shamouilian et al.
5,839,187 A   11/1998 Sato et al.
(Continued)

FOREIGN PATENT DOCUMENTS

CN        1832212 A    9/2006
CN      101091262 A    12/2007
(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Ismail A Muse
(74) *Attorney, Agent, or Firm* — Aikin & Gallant, LLP

(57) ABSTRACT

Reflective bank structures for light emitting devices are described. The reflective bank structure may include a substrate, an insulating layer on the substrate, and an array of bank openings in the insulating layer with each bank opening including a bottom surface and sidewalls. A reflective layer spans sidewalls of each of the bank openings in the insulating layer.

13 Claims, 35 Drawing Sheets

Related U.S. Application Data continuation of application No. 15/426,947, filed on Feb. 7, 2017, now Pat. No. 10,043,784, which is a continuation of application No. 14/864,570, filed on Sep. 24, 2015, now Pat. No. 9,620,487, which is a continuation of application No. 13/710,443, filed on Dec. 10, 2012, now Pat. No. 9,178,123.

(51) Int. Cl.

| | | |
|---|---|---|
| *H01L 25/075* | (2006.01) | |
| *H01L 33/60* | (2010.01) | |
| *H01L 25/16* | (2006.01) | |
| *H01L 33/44* | (2010.01) | |
| *H01L 33/62* | (2010.01) | |
| *H01L 33/06* | (2010.01) | |
| *H01L 33/36* | (2010.01) | |

(52) U.S. Cl.
CPC ............ *H01L 33/36* (2013.01); *H01L 33/44* (2013.01); *H01L 33/60* (2013.01); *H01L 33/62* (2013.01); *H01L 2224/18* (2013.01); *H01L 2224/24137* (2013.01); *H01L 2224/73267* (2013.01); *H01L 2224/82* (2013.01); *H01L 2224/83* (2013.01); *H01L 2224/92244* (2013.01); *H01L 2224/95* (2013.01); *H01L 2924/0002* (2013.01)

(58) Field of Classification Search
CPC ................. H01L 33/48; H01L 27/3246; H01L 2924/12041
See application file for complete search history.

(56) References Cited

U.S. PATENT DOCUMENTS

| | | | |
|---|---|---|---|
| 5,851,664 | A | 12/1998 | Bennett et al. |
| 5,888,847 | A | 3/1999 | Rostoker et al. |
| 5,903,428 | A | 5/1999 | Grimard et al. |
| 5,996,218 | A | 12/1999 | Shamouilian et al. |
| 6,071,795 | A | 6/2000 | Cheung et al. |
| 6,335,263 | B1 | 1/2002 | Cheung et al. |
| 6,403,985 | B1 | 6/2002 | Fan et al. |
| 6,420,242 | B1 | 7/2002 | Cheung et al. |
| 6,521,511 | B1 | 2/2003 | Inoue et al. |
| 6,531,996 | B1 | 3/2003 | Murade |
| 6,558,109 | B2 | 5/2003 | Gibbel |
| 6,613,610 | B2 | 9/2003 | Iwafuchi et al. |
| 6,629,553 | B2 | 10/2003 | Odashima et al. |
| 6,670,038 | B2 | 12/2003 | Sun et al. |
| 6,786,390 | B2 | 9/2004 | Yang et al. |
| 6,878,607 | B2 | 4/2005 | Inoue et al. |
| 6,911,666 | B2 | 6/2005 | Voutsas |
| 7,033,842 | B2 | 4/2006 | Haji et al. |
| 7,148,127 | B2 | 12/2006 | Oohata et al. |
| 7,160,633 | B2 | 1/2007 | Tai et al. |
| 7,161,184 | B2 | 1/2007 | Miyagi et al. |
| 7,208,337 | B2 | 4/2007 | Eisert et al. |
| 7,224,118 | B2 | 5/2007 | Yamazaki et al. |
| 7,353,596 | B2 | 4/2008 | Shida et al. |
| 7,358,158 | B2 | 4/2008 | Aihara et al. |
| 7,413,918 | B2 | 8/2008 | Tran et al. |
| 7,482,696 | B2 | 1/2009 | Shei et al. |
| 7,495,389 | B2 | 2/2009 | Noguchi et al. |
| 7,510,889 | B2 | 3/2009 | Pan et al. |
| 7,585,703 | B2 | 9/2009 | Matsumura et al. |
| 7,723,764 | B2 | 5/2010 | Oohata et al. |
| 7,732,233 | B2 * | 6/2010 | Lin .................... H01L 33/486 438/28 |
| 7,791,267 | B2 | 9/2010 | Baek et al. |
| 7,795,629 | B2 | 9/2010 | Watanabe et al. |
| 7,795,804 | B2 | 9/2010 | Kim |
| 7,797,820 | B2 | 9/2010 | Shida et al. |
| 7,838,410 | B2 | 11/2010 | Hirao et al. |
| 7,872,418 | B2 | 1/2011 | Hata et al. |
| 7,880,184 | B2 | 2/2011 | Iwafuchi et al. |
| 7,884,543 | B2 | 2/2011 | Doi |
| 7,888,690 | B2 | 2/2011 | Iwafuchi et al. |
| 7,906,787 | B2 | 3/2011 | Kang |
| 7,910,945 | B2 | 3/2011 | Donofrio et al. |
| 7,927,976 | B2 | 4/2011 | Menard |
| 7,928,465 | B2 | 4/2011 | Lee et al. |
| 7,972,875 | B2 | 7/2011 | Rogers et al. |
| 7,994,711 | B2 | 8/2011 | Nakamura et al. |
| 7,999,454 | B2 | 8/2011 | Winters et al. |
| 8,023,248 | B2 | 9/2011 | Yonekura et al. |
| 8,049,410 | B2 | 11/2011 | Suh et al. |
| 8,497,143 | B2 | 7/2013 | Han |
| 8,497,512 | B2 | 7/2013 | Nakamura et al. |
| 8,618,565 | B2 | 12/2013 | Kim et al. |
| 8,833,982 | B2 | 9/2014 | Funakubo |
| 8,835,940 | B2 | 9/2014 | Hu et al. |
| 8,912,020 | B2 | 12/2014 | Bedell et al. |
| 8,917,016 | B2 | 12/2014 | Yamazaki et al. |
| 8,921,869 | B2 | 12/2014 | Welch et al. |
| 8,963,137 | B2 | 2/2015 | Lee et al. |
| 2001/0029088 | A1 | 10/2001 | Odajima et al. |
| 2002/0076848 | A1 | 6/2002 | Spooner et al. |
| 2002/0158835 | A1 | 10/2002 | Kobayashi et al. |
| 2003/0017360 | A1 | 1/2003 | Tai et al. |
| 2003/0094615 | A1 | 5/2003 | Yamazaki et al. |
| 2003/0177633 | A1 | 9/2003 | Haji et al. |
| 2004/0208210 | A1 | 10/2004 | Inoguchi |
| 2004/0217704 | A1 | 11/2004 | Iwase et al. |
| 2004/0256620 | A1 | 12/2004 | Yamazaki et al. |
| 2005/0051776 | A1 | 3/2005 | Miyagi et al. |
| 2005/0104530 | A1 | 5/2005 | Chung et al. |
| 2005/0116620 | A1 | 6/2005 | Kobayashi |
| 2005/0167682 | A1 | 8/2005 | Fukasawa |
| 2005/0218468 | A1 | 10/2005 | Owen et al. |
| 2005/0274959 | A1 | 12/2005 | Kim et al. |
| 2005/0285830 | A1 | 12/2005 | Iwabuchi |
| 2006/0018120 | A1 * | 1/2006 | Linehan .................. H01L 33/62 362/247 |
| 2006/0071225 | A1 | 4/2006 | Beeson et al. |
| 2006/0169993 | A1 * | 8/2006 | Fan ....................... H01L 27/153 257/88 |
| 2006/0202210 | A1 | 9/2006 | Mok et al. |
| 2006/0208271 | A1 | 9/2006 | Kim et al. |
| 2006/0238463 | A1 | 10/2006 | Kim et al. |
| 2007/0018182 | A1 * | 1/2007 | Beeson .................. H01L 33/405 257/98 |
| 2007/0158667 | A1 | 7/2007 | Wu et al. |
| 2007/0166851 | A1 | 7/2007 | Tran et al. |
| 2007/0176198 | A1 * | 8/2007 | Lee ........................ H05K 1/021 257/99 |
| 2007/0194333 | A1 * | 8/2007 | Son ..................... H01L 25/0753 257/88 |
| 2007/0194336 | A1 * | 8/2007 | Shin ..................... H01L 33/483 257/98 |
| 2007/0228386 | A1 | 10/2007 | Shie et al. |
| 2007/0284564 | A1 | 12/2007 | Biwa et al. |
| 2008/0093606 | A1 | 4/2008 | Pan et al. |
| 2008/0163481 | A1 | 7/2008 | Shida et al. |
| 2008/0265744 | A1 | 10/2008 | Doi |
| 2008/0265752 | A1 | 10/2008 | Meijer et al. |
| 2008/0315239 | A1 * | 12/2008 | Lin ................... H01L 23/49822 257/99 |
| 2009/0014749 | A1 | 1/2009 | Matsuda |
| 2009/0015149 | A1 | 1/2009 | Lee et al. |
| 2009/0045733 | A1 | 2/2009 | Suh et al. |
| 2009/0050907 | A1 | 2/2009 | Yuan et al. |
| 2009/0068774 | A1 | 3/2009 | Slater et al. |
| 2009/0114934 | A1 | 5/2009 | Horng et al. |
| 2009/0152577 | A1 * | 6/2009 | Chan .................... H01L 33/405 257/94 |
| 2009/0217517 | A1 | 9/2009 | Pique et al. |
| 2009/0284501 | A1 | 11/2009 | Nathan et al. |
| 2009/0290273 | A1 | 11/2009 | Shih et al. |
| 2009/0314991 | A1 | 12/2009 | Cho et al. |
| 2010/0022039 | A1 | 1/2010 | Chang |
| 2010/0051910 | A1 | 3/2010 | Choi |

(56) References Cited

U.S. PATENT DOCUMENTS

| | | |
|---|---|---|
| 2010/0181589 A1 | 7/2010 | Huang et al. |
| 2010/0188794 A1 | 7/2010 | Park et al. |
| 2010/0193822 A1 | 8/2010 | Inobe et al. |
| 2010/0213467 A1 | 8/2010 | Lee et al. |
| 2010/0248484 A1 | 9/2010 | Bower et al. |
| 2010/0270567 A1 | 10/2010 | Emerson et al. |
| 2010/0295078 A1 | 11/2010 | Chen et al. |
| 2011/0003410 A1 | 1/2011 | Tsay et al. |
| 2011/0057866 A1 | 3/2011 | Konicek |
| 2011/0068674 A1 | 3/2011 | Takenaka et al. |
| 2011/0073838 A1 | 3/2011 | Khan et al. |
| 2011/0084291 A1 | 4/2011 | Jeong et al. |
| 2011/0114969 A1 | 5/2011 | Lee et al. |
| 2011/0169429 A1 | 7/2011 | Ing et al. |
| 2011/0198598 A1 | 8/2011 | Kim et al. |
| 2011/0220927 A1 | 9/2011 | Min |
| 2011/0227114 A1 | 9/2011 | Kim et al. |
| 2011/0266561 A1 | 11/2011 | Rogers et al. |
| 2011/0278627 A1 | 11/2011 | Kim et al. |
| 2011/0284867 A1 | 11/2011 | Tran et al. |
| 2011/0284887 A1 | 11/2011 | Wu et al. |
| 2011/0291151 A1 | 12/2011 | Matsuda |
| 2012/0018746 A1 | 1/2012 | Hsieh |
| 2012/0025167 A1 | 2/2012 | Chu et al. |
| 2012/0056223 A1 | 3/2012 | Hsieh et al. |
| 2012/0064642 A1 | 3/2012 | Huang et al. |
| 2012/0074446 A1* | 3/2012 | Choi .......... H01L 23/544 257/98 |
| 2012/0091466 A1 | 4/2012 | Doan et al. |
| 2012/0134065 A1 | 5/2012 | Furuya et al. |
| 2012/0146030 A1 | 6/2012 | You et al. |
| 2012/0155076 A1 | 6/2012 | Li et al. |
| 2012/0161193 A1 | 6/2012 | Hassan |
| 2012/0168714 A1 | 7/2012 | Chu et al. |
| 2012/0168776 A1 | 7/2012 | Nakamura et al. |
| 2012/0205689 A1 | 8/2012 | Welch et al. |
| 2012/0223875 A1 | 9/2012 | Lau et al. |
| 2012/0248481 A1 | 10/2012 | Seo |
| 2012/0319573 A1 | 12/2012 | Shi |
| 2012/0326188 A1 | 12/2012 | Han |
| 2013/0057178 A1 | 3/2013 | Doan |
| 2013/0126081 A1 | 5/2013 | Hu et al. |
| 2013/0126891 A1 | 5/2013 | Bibl et al. |
| 2013/0130440 A1 | 5/2013 | Hu et al. |
| 2013/0187179 A1 | 7/2013 | Tan et al. |
| 2013/0210194 A1 | 8/2013 | Bibl et al. |
| 2013/0234115 A1 | 9/2013 | Song et al. |
| 2013/0248816 A1 | 9/2013 | Chu et al. |
| 2013/0285086 A1 | 10/2013 | Hu et al. |
| 2014/0027709 A1 | 1/2014 | Higginson et al. |
| 2014/0084240 A1* | 3/2014 | Hu .......... H01L 27/156 257/13 |
| 2014/0084482 A1 | 3/2014 | Hu et al. |
| 2014/0159064 A1 | 6/2014 | Sakariya et al. |
| 2014/0332820 A1 | 11/2014 | Han et al. |

FOREIGN PATENT DOCUMENTS

| | | |
|---|---|---|
| CN | 101783099 A | 7/2010 |
| JP | A 54-105285 A | 7/1979 |
| JP | 55-000532 A | 1/1980 |
| JP | A 64-013743 A | 1/1989 |
| JP | 08-045972 A | 2/1996 |
| JP | 3406207 | 5/1999 |
| JP | 2004-303706 A | 10/2004 |
| JP | 2007-027638 A | 2/2007 |
| JP | 2007-173408 A | 7/2007 |
| JP | 2008-098442 A | 4/2008 |
| KR | 10-2004-0068504 | 7/2004 |
| KR | 2010-0089115 A | 8/2010 |
| KR | 10-1051488 B1 | 7/2011 |
| TW | 200306129 A | 11/2003 |
| TW | 200926887 A | 6/2009 |
| WO | WO 98-48319 A1 | 10/1998 |
| WO | WO 03/012884 A1 | 2/2003 |
| WO | WO 2004/068596 A1 | 8/2004 |
| WO | WO 2011/102030 A1 | 8/2011 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al., "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID Oct. 8-12, 2006, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

Long Xu-Ming, "Advanced Electronic Manufacturing Technology" pp. 372-373, Oct. 2010 (No English translation available, concise explanation of relevance provided in Chinese Application No. 201380064361.6 Office Action dated Nov. 6, 2018.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping For Next Generation Semiconductor Devices" Apr. 21, 1999, 4 pgs.

Geffroy, et al., "Organic light-emitting diode (OLED) technology: materials, devices and display technologies," 2006 Society of Chemical Industry, pp. 572-582.

Gohda, et al., "58.3: A 3.6-in. 202-ppi Full-Color AMPLED Display Fabricated by Ink-Jet Method," 2006 SID Digest, pp. 1767-1770.

Ohara, et al., "4.0-inch Active-Matrix Organic Light-Emitting Diode Display Integrated with Driver Circuits Using Amorphous IN—Ga—Zn-Oxide Thin-Film Transistors with Suppressed Variation," 2010 The Japan Society of Applied Physics, pp. 1-6.

Hekmatshoar, et al., "A novel TFT-OLED integration for OLED-independent pixel programming in amorphous-Si AMOLED pixels," 2008, Society for Information Display, Journal of the SID 16/1, pp. 183-188.

Sarma, et al., "Active Matrix OLED Using 150° C. a-Si TFT Backplane Built on Flexible Plastic Substrate," SPIE Symp. on

(56) References Cited

OTHER PUBLICATIONS

Aerospace/Defense Sending, Orlando, FL, Apr. 2003, and to be published in SPIE Proc., vol. 5080, paper 24 (2003), 12 pgs.
"Optical Coating," Wikipedia.org. from http://en.wikipedia.org/wiki/Optical_coating May 27, 2014, 6 pages.
Notification Concerning Transmittal of Preliminary Report on Patentability for International Application No. PCT/US2013/072913, dated Jun. 25, 2015, 8 pages.
PCT International Search Report and Written Opinion for International Application No. PCT/US2013/072913, dated Mar. 25, 2014, 11 pages.
Notification Concerning Transmittal of Preliminary Report on Patentability for International Application No. PCT/US2013/072914, dated Jun. 25, 2015, 9 pages.
PCT International Search Report and Written Opinion for International Application No. PCT/US2013/072914, dated Mar. 24, 2014, 11 pages.
Notification Concerning Transmittal of Preliminary Report on Patentability for International Application No. PCT/US2013/072916, dated Jun. 25, 2015, 9 pages.
PCT International Search Report and Written Opinion for International Application No. PCT/US2013/072916, dated Mar. 27, 2014, 12 pages.

\* cited by examiner

LIGHT EMITTING DEVICE REFLECTIVE BANK STRUCTURE

RELATED APPLICATIONS

This application is a continuation of co-pending U.S. patent application Ser. No. 16/028,611, filed Jul. 6, 2018, which is a continuation of U.S. patent application Ser. No. 15/426,947, filed Feb. 7, 2017, now U.S. Pat. No. 10,043,784, which is a continuation of U.S. patent application Ser. No. 14/864,570, filed Sep. 24, 2015, now U.S. Pat. No. 9,620,487, which is a continuation of U.S. patent application Ser. No. 13/710,443, filed on Dec. 10, 2012, now U.S. Pat. No. 9,178,123 which is incorporated herein by reference.

BACKGROUND

Field

The present invention relates to a reflective bank structure for light emitting devices. More particularly, embodiments of the present invention relate to a reflective bank structure for light emitting diode devices.

Background Information

Light emitting diode (LED) devices may include a p-type semiconductor layer, an n-type semiconductor layer, and one or more quantum well layers between the p-type semiconductor layer and the n-type semiconductor layer. The light emitting efficiency of a LED device system depends upon the internal quantum efficiency of the quantum well layer(s) and the light extraction efficiency from the system.

One implementation for increasing light extraction efficiency has been to include a reflective layer in the electrode layer opposite the light emission direction. For example, for a top emission structure, the bottom electrode may include a reflective layer, and vice versa. Light emitting from the lateral surfaces of a LED device may decrease light extraction efficiency.

One implementation for increasing light extraction efficiency from a horizontal LED chip is described in U.S. Pat. No. 7,482,696 in which a horizontal LED chip is placed within a cavity of an insulating submount with a pair of conductive-reflective films on sidewalls of the cavity. An n-side electrode on a bottom side surface of the horizontal LED chip is flip chip bonded to a pad on one of the conductive-reflective films, and a p-side electrode on the bottom side surface of the horizontal LED chip is flip chip bonded to a pad on the other conductive-reflective film. In this manner, the horizontal LED chip is packaged within the submount, and lateral emission through the side surfaces of the horizontal LED chip is reflected to increase light extraction efficiency of the package.

One implementation for increasing light extraction efficiency from a vertical LED device system is described in U.S. Pat. No. 7,884,543 in which a light emitting surface of the vertical LED device is mounted on a narrow wiring in a transparent substrate. A transparent resin is formed over and around the vertical LED device, and a reflective film is deposited over the transparent resin and the vertical LED device to direct light toward the light emitting surface.

SUMMARY OF THE INVENTION

Reflective bank structures for light emitting devices are described. In an embodiment, a reflective bank structure includes a substrate, an insulating layer on the substrate, an array of bank openings in the insulating layer, with each bank opening including a bottom surface and sidewalls, and a reflective layer spanning the sidewalls of each of the bank openings in the insulating layer. Each of the bank openings may have a width or height to accept a light emitting device. In an embodiment, each light emitting device is a vertical LED device. Where the light emitting devices are micro devices, such as vertical micro LED devices having a maximum width or length of 1 to 100 μm, each bank opening may have a maximum width or length of 1 to 100 μm or slightly larger to accommodate mounting of the array of vertical micro LED devices within the corresponding array of bank openings. In an embodiment, each vertical LED device has a top surface that is above a top surface of the insulating layer. Each vertical LED device may include a top conductive electrode and a bottom conductive electrode.

In an embodiment, a transparent passivation layer is formed that spans sidewalls of the array of vertical LED devices and at least partially fills the array of bank openings. For example, the transparent passivation layer may span and cover a quantum well structure within the array of vertical LED devices. In an embodiment, the transparent passivation layer does not completely cover the top conductive electrode of each vertical LED device. In this manner, a transparent conductor layer can be formed over and in electrical contact with the top conductive electrode, if present, for each vertical LED device.

The reflective layer may have a variety of configurations in accordance with embodiments of the invention. For example, the reflective layer may completely, or only partially, span the sidewalls of each of the bank openings. For example, the reflective layer may completely, only partially, or not cover the bottom surface of each of the bank openings. In an embodiment, the reflective layer is a continuous layer formed over the insulating layer and the substrate within the array of bank openings in the insulating and completely spans the sidewalls and covers the bottom surface of each of the bank openings.

The reflective layer may also be patterned. In an embodiment, the reflective layer is a patterned layer including an array of reflective bank layers corresponding to the array of bank openings, where each reflective bank layer spans the sidewalls of a corresponding bank opening. For example, the reflective layer may completely, or only partially, span the sidewalls of each of the bank openings. For example, the reflective layer may completely, only partially, or not cover the bottom surface of each of the bank openings. In an embodiment, each reflective bank layer does not cover a center of the bottom surface of a corresponding bank opening. In an embodiment, each reflective bank layer includes a sidewall layer that spans the sidewalls of the corresponding bank openings and a separate pad layer on the bottom surface the corresponding bank opening. In an embodiment, the sidewalls of each of the bank openings is characterized by a first and second laterally opposite sidewalls, and each reflective bank layer spans the first laterally opposite sidewall and does not span the second laterally opposite sidewall.

Embodiments of the invention may be utilized to incorporate a reflective bank structure on a variety of substrates, such as lighting or display substrates. In some embodiments, an integrated circuit may be incorporated within the substrate. For example a corresponding array of integrated circuits may be interconnected with the bottom surfaces of the array of bank openings. In some embodiments, an electrical line out or array of electrical lines out are interconnected with the bottom surfaces of the array of bank openings.

In an embodiment, a via opening is formed in the insulating layer. An electrical line out may be formed at the bottom surface of the via opening. In an embodiment, the via opening is connected with an integrated circuit in an underlying substrate. In an embodiment, an array of vertical LED devices are mounted within the corresponding array of bank openings and a transparent conductor layer is formed over and in electrical contact with the electrical line out and each vertical LED device. The patterned reflective layer may further include the array of reflective bank layers within the array of bank openings and a separate reflective via layer within the via opening.

In an embodiment, the patterned reflective layer includes the array of reflective bank layers within the array of bank openings and a separate reflective electrical line out on the insulating layer. In an embodiment, an array of vertical LED devices are mounted within the corresponding array of bank openings and a transparent conductor layer is formed over and in electrical contact with the electrical line out and each vertical LED device.

In an embodiment, an array of via openings are formed in the insulating layer. An array of electrical lines out may be formed at the bottom surface of each of the corresponding array of via openings. In an embodiment, the array of via openings are connected with an array of integrated circuits in an underlying substrate. In an embodiment, an array of vertical LED devices are mounted within the corresponding array of bank openings and an array of transparent conductor layers are formed, with each transparent conductor layer formed over and in electrical contact with a corresponding electrical line out and a corresponding vertical LED device. The patterned reflective layer may further include the array of reflective bank layers within the array of bank openings and an array of separate reflective via layers within the array of via openings.

In an embodiment, the patterned reflective layer includes the array of reflective bank layers within the array of bank openings and a separate array of reflective electrical lines out on the insulating layer. In an embodiment, an array of vertical LED devices are mounted within the corresponding array of bank openings and an array of transparent conductor layers are formed, with each transparent conductor layer formed over and in electrical contact with a corresponding electrical line out and a corresponding vertical LED device.

DETAILED DESCRIPTION OF THE INVENTION

Figure 1:
FIG. 1 is a cross-sectional side view illustration of an insulating layer formed on a substrate in accordance with an embodiment of the invention.

Embodiments of the present invention describe a reflective bank structure for receiving light emitting devices such as LED devices. For example, the reflective bank structure may be formed on a receiving substrate such as, but not limited to, a display substrate, a lighting substrate, a substrate with functional devices such as transistors or integrated circuits (ICs), or a substrate with metal redistribution lines. While some embodiments of the present invention are described with specific regard to vertical micro LED devices comprising p-n diodes, it is to be appreciated that embodiments of the invention are not so limited and that certain embodiments may also be applicable to other devices which are designed to perform a photonic function (LED, superluminescent diode (SLD), laser).

The terms "micro" device or "micro" LED structure as used herein may refer to the descriptive size of certain devices or structures in accordance with embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales. In an embodiment, a single micro LED device has a maximum dimension, for example length and/or width, of 1 to 100 μm.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning," "over," "to," "between," and "on" as used herein may refer to a relative position of one layer with respect to other layers. One layer "spanning," "over," or "on" another layer or bonded "to" another layer may be directly in contact with the other layer or may have one or more intervening layers. One layer "between" layers may be directly in contact with the layers or may have one or more intervening layers.

In one aspect, embodiments of the invention describe a reflective bank structure to increase light extraction efficiency from an array of light emitting devices. In an embodiment, a reflective bank structure includes a substrate, an insulating layer, an array of bank openings in the insulating layer with each bank opening including a bottom surface and sidewalls, and a reflective layer spanning the sidewalls of each of the bank openings in the insulating layer. Light emitting laterally from the light emitting devices can be reflected from the sidewalls in a light emitting direction of the system. Accordingly, in accordance with embodiments of the invention, lateral side emission may be a significant contribution to light emission efficiency.

In another aspect, embodiments of the invention describe a reflective bank structure to increase light extraction efficiency from an array of vertical LED devices. The vertical LED devices mounted within the array of bank openings can include top and bottom electrodes. For example, the top and bottom electrodes may have been annealed to provide ohmic contacts with the p-n diode layer of the vertical LED device. In addition, the top and bottom electrodes may be transparent, semi-transparent, opaque, or include a reflective layer. In this manner, the reflective bank structure can incorporate a variety of shapes of vertical LED devices, and is not limited to light emission from the vertical LED devices in the light emitting direction of the system.

In another aspect, embodiments of the invention describe a reflective bank structure for receiving an array of light emitting devices on a receiving substrate. In an embodiment, an array of light emitting devices are transferred from a carrier substrate to the receiving substrate with an array of transfer heads, which may be operated in accordance with electrostatic principles. Without being limited to a particular theory, embodiments of the invention utilize transfer heads and head arrays which operate in accordance with principles of electrostatic grippers, using the attraction of opposite charges to pick up micro devices. In accordance with embodiments of the present invention, a pull-in voltage is applied to a transfer head in order to generate a grip pressure on a light emitting device and pick up the light emitting device. In an embodiment, a grip pressure of greater than 1 atmosphere is generated. For example, each transfer head may generate a grip pressure of 2 atmospheres or greater, or even 20 atmospheres or greater without shorting due to dielectric breakdown of the transfer heads. In some embodiments, the transfer heads in the micro pick up array are separated by a pitch (x, y, and/or diagonal) that matches a pitch on the receiving substrate for the array of light emitting devices. For example, where the receiving substrate is a display substrate the pitch of the transfer heads may match the pitch of the pixel or subpixel array. Table 1 provides a list of exemplary implementation in accordance with embodiments of the invention for various red-green-blue (RGB) displays with 1920×1080p and 2560×1600 resolutions. It is to be appreciated that embodiments of the invention are not limited to RGB color schemes or the 1920×1080p or 2560×1600 resolutions, and that the specific resolution and RGB color scheme is for illustrational purposes only.

TABLE 1

| Display Substrate | Pixel Pitch (x, y) | Sub-Pixel pitch (x, y) | Pixels per inch (PPI) | Possible Transfer head array pitch |
|---|---|---|---|---|
| 55" 1920 × 1080 | (634 µm, 634 µm) | (211 µm, 634 µm) | 40 | X: Multiples or fractions of 211 µm<br>Y: Multiples or fractions of 634 µm |
| 10" 2560 × 1600 | (85 µm, 85 µm) | (28 µm, 85 µm) | 299 | X: Multiples or fractions of 28 µm<br>Y: Multiples or fractions of 85 µm |
| 4" 640 × 1136 | (78 µm, 78 µm) | (26 µm, 78 µm) | 326 | X: Multiples or fractions of 26 µm<br>Y: Multiples or fractions of 78 µm |
| 5" 1920 × 1080 | (58 µm, 58 µm) | (19 µm, 58 µm) | 440 | X: Multiples or fractions of 19 µm<br>Y: Multiples or fractions of 58 µm |

In the above exemplary embodiments, the 40 PPI pixel density may correspond to a 55 inch 1920×1080p resolution television, and the 326 and 440 PPI pixel density may correspond to a handheld device with retina display. In accordance with embodiments of the invention, thousands, millions, or even hundreds of millions of transfer heads can be included in a micro pick up array of a mass transfer tool depending upon the size of the micro pick up array. In accordance with embodiments of the invention, a 1 cm×1.12 cm array of transfer heads can include 837 transfer heads with a 211 µm, 634 µm pitch, and 102,000 transfer heads with a 19 µm, 58 µm pitch.

The number of light emitting devices picked up with the array of transfer heads may or may not match the pitch of transfer heads. For example, an array of transfer heads separated by a pitch of 19 µm picks up an array of light emitting micro devices with a pitch of 19 µm. In another example, an array of transfer heads separated by a pitch of 19 µm picks up an array of light emitting micro devices with a pitch of approximately 6.33 µm. In this manner the transfer heads pick up every third light emitting micro device for transfer to the receiving substrate including the reflective bank structure. In accordance with some embodiments, the top surface of the array of light emitting micro devices is higher than the top surface of the insulating layer so as to prevent the transfer heads from being damaged by or damaging the insulating layer (or any intervening layer) on the receiving substrate during placement of the light emitting micro devices within bank openings in the insulating layer.

FIG. 1 is a side view illustration of an insulating layer formed on a substrate in accordance with an embodiment of the invention. Substrate 100 may be a variety of substrates such as, but not limited to, a display substrate, a lighting substrate, a substrate with functional devices such as transistors or integrated circuits (ICs), or a substrate with metal redistribution lines. Depending upon the particular application, substrate 100 may be opaque, transparent, or semi-transparent to the visible wavelength (e.g. 380-750 nm wavelength), and substrate 100 may be rigid or flexible. For example, substrate 100 may be formed of glass, metal foil, metal foil covered with dielectric, or a polymer such as polyethylene terephthalate (PET), polyethelyne naphthalate (PEN), polycarbonate (PC), polyethersulphone (PES), aromatic fluorine-containing polyarylates (PAR), polycyclic olefin (PCO), and polyimide (PI).

Insulating layer 110 may be formed by a variety of techniques such as lamination, spin coating, CVD, and PVD. Insulating layer 110 may be opaque, transparent, or semi-transparent to the visible wavelength. Insulating layer 110 may be formed of a variety of materials such as, but not limited to, photodefinable acrylic, photoresist, silicon oxide (SiO$_2$), silicon nitride (SiN$_x$), poly(methyl methacrylate) (PMMA), benzocyclobutene (BCB), polyimide, acrylate, epoxy, and polyester. In an embodiment, insulating layer is formed of an opaque material such as a black matrix material. Exemplary insulating black matrix materials include organic resins, glass pastes, and resins or pastes including a black pigment, metallic particles such as nickel, aluminum, molybdenum, and alloys thereof, metal oxide particles (e.g. chromium oxide), or metal nitride particles (e.g. chromium nitride).

FIGS. 2A-2J are cross-sectional side view illustrations of a number of possible substrates and patterned insulating layer configurations in accordance with embodiments of the invention. It is to be appreciated that the particular embodiments illustrated in FIGS. 2A-2J are intended to be exemplary and not limiting. Furthermore, the embodiments illustrated are not necessarily exclusive of one another, and some embodiments illustrated may be combined.

Figure 2A:
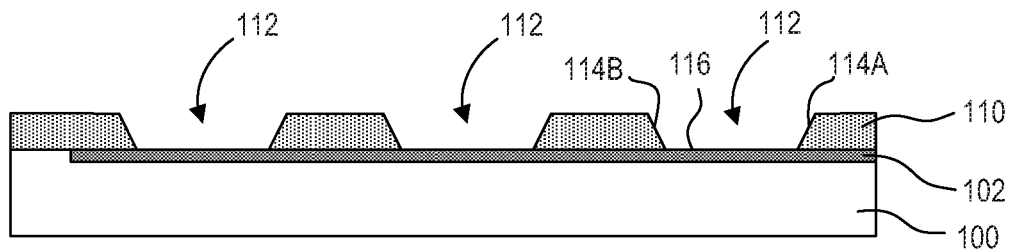
FIG. 2A is a cross-sectional side view illustration of an array of bank openings formed in an insulating layer in accordance with an embodiment of the invention.
Figure 2B:
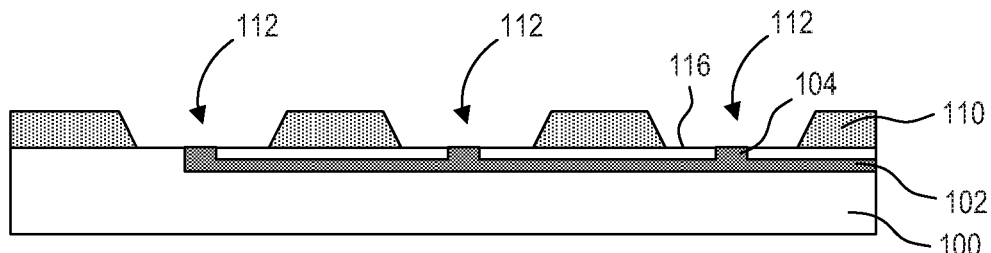
FIG. 2B is a cross-sectional side view illustration of an array of bank openings formed in an insulating layer in accordance with an embodiment of the invention.

Referring now to FIG. 2A, in an embodiment, an array of bank openings 112 are formed in the insulating layer 110 using a suitable technique such as lithography. As illustrated, bank openings 112 may include sidewalls 114A, 114B which are illustrated as being laterally opposite in the figures, and a bottom surface 116. In the embodiment illustrated in FIG. 2A, the bottom surfaces 116 of the bank openings 112 exposes an electrical line out 102 in the substrate 100. In the embodiment illustrated in FIG. 2B, vias 104 extend between the electrical line out 102 and the bottom surfaces 116. Depending upon the particular application, electrical line out 102 and vias 104 may be opaque, transparent, or semi-transparent to the visible wavelength. In an embodiment, electrical line out 102 functions as a contact or contact line such as an anode line or cathode line in the completed system. The material of the electrical line out may also be selected for low resistance, for example, copper.

Exemplary transparent conductive materials include amorphous silicon, poly-silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment electrical line out 102 is approximately 50 nm-1 µm thick ITO. In an embodiment, the electrical line out 102 and vias 104 include nanoparticles such as silver, gold, aluminum, molybdenum, titanium, tungsten, ITO, and IZO. The electrical line out 102 and vias 104 may also be reflective to the visible wavelength. In an embodiment, electrical line out 102 and vias 104 comprise a reflective metallic film such as aluminum, molybdenum, titanium, titanium-tungsten, silver, or gold, or alloys thereof.

In accordance with embodiments of the invention, the thickness of the insulating layer 110 and width of the openings 112 described with regard to the following figures may depend upon the height of the light emitting device to be mounted within the opening, height of the transfer heads transferring the light emitting devices, and resolution. In the specific example of a display substrate, the resolution, pixel density, and subpixel density may account for the width of the openings 112. For an exemplary 55 inch television with a 40 PPI and 211 μm subpixel pitch, the width may be anywhere from a few microns to 200 μm to account for a surrounding bank structure. For an exemplary display with 326 PPI and a 26 μm subpixel pitch, the width may be anywhere from a few microns to 15 μm to account for a 5 μm wide surrounding bank structure. For an exemplary display with 440 PPI and a 26 μm subpixel pitch, the width may be anywhere from a few microns to 17 μm to account for an exemplary 5 μm wide surrounding bank structure. Width of the bank structure may be any suitable size, so long as the structure supports the required processes and is scalable to the required PPI.

In accordance with embodiments of the invention, the thickness of the insulating layer 110 is not too thick in order for the reflective bank structure to function. Thickness may be determined by the light emitting device height and a predetermined viewing angle. For example, where sidewalls of the insulating layer make an angle with the substrate 100, shallower angles may correlate to a wider viewing angle of the system. In an embodiment, exemplary thicknesses of the insulating layer 110 may be between 1-50 μm.

Figure 2C:
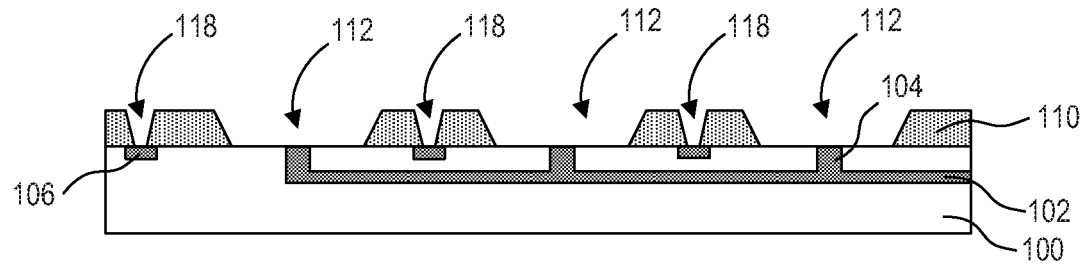
FIG. 2C is a cross-sectional side view illustration of an array of bank openings and a corresponding array of via openings formed in an insulating layer in accordance with an embodiment of the invention.

Referring now to FIG. 2C, in an embodiment, a corresponding array of via openings 118 are formed within the insulating layer 110 to expose the substrate 100. For example, each via opening 118 may correspond to a bank opening 112. In the embodiment illustrated in FIG. 2C, each via opening 118 exposes a second electrical line out 106 in the substrate 100. Second electrical line out 106 may be formed similarly as electrical line out 102. In an embodiment, electrical line out 106 functions as an contact or contact line such as an anode line or cathode line in the completed system. In an embodiment illustrated in FIG. 2D, a single via opening 118 is formed within the insulating layer 110 to correspond to a plurality of bank openings 112. Via openings 118 may have a width which is wide enough to deposit a conductive material within to make electrical contact with the underlying electrical line out.

Figure 2D:
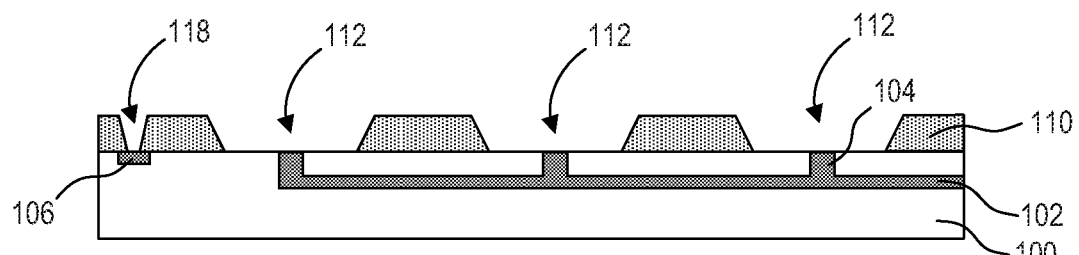
FIG. 2D is a cross-sectional side view illustration of an array of bank openings and a via opening formed in an insulating layer in accordance with an embodiment of the invention.
Figure 2E:
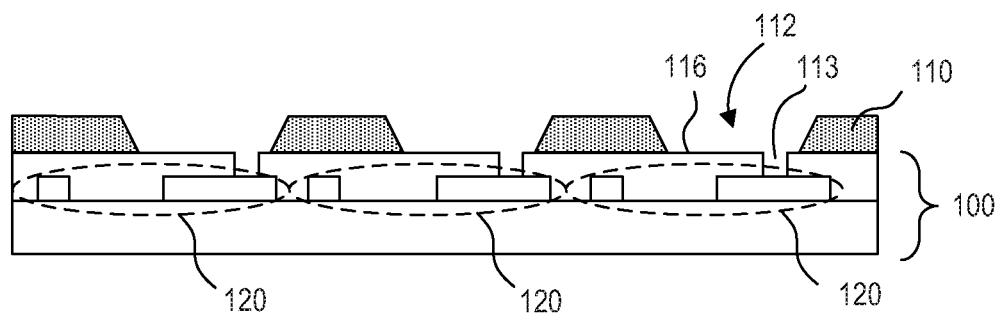
FIG. 2E is a cross-sectional side view illustration of an array of bank openings formed in an insulating layer over a substrate including circuitry in accordance with an embodiment of the invention.
Figure 2F:
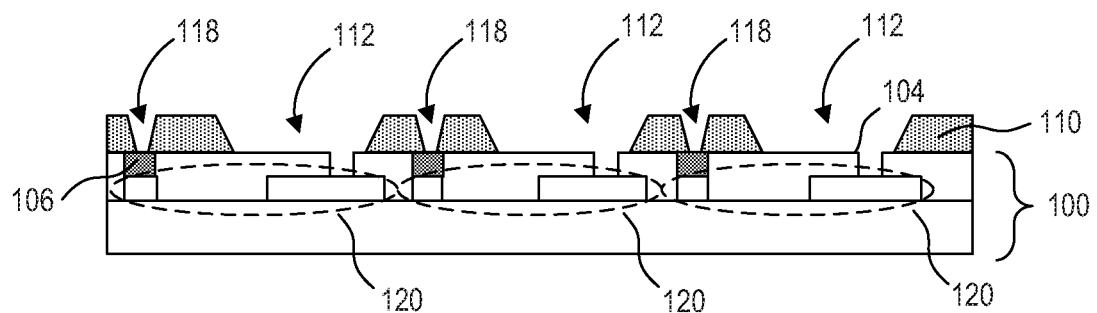
FIG. 2F is a cross-sectional side view illustration of an array of bank openings and a corresponding array of via openings formed in an insulating layer over a substrate including circuitry in accordance with an embodiment of the invention.
Figure 2G:
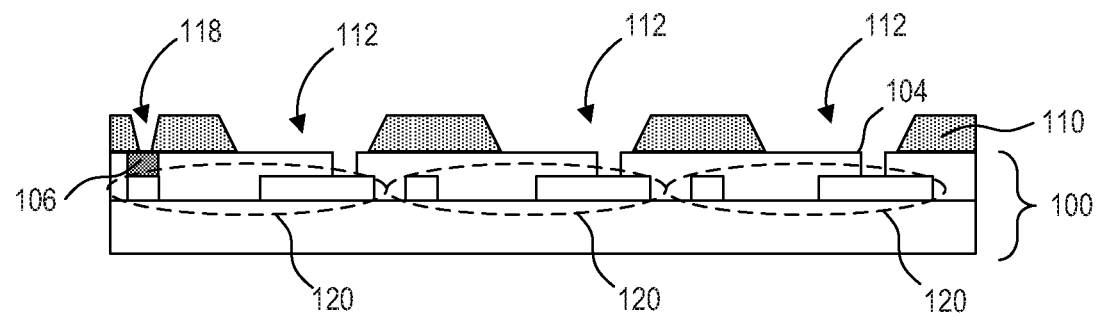
FIG. 2G is a cross-sectional side view illustration of an array of bank openings and a via opening formed in an insulating layer over a substrate including circuitry in accordance with an embodiment of the invention.

Referring now to FIGS. 2E-2J, in some embodiments, the substrate may include circuitry 120 to control the light emitting devices to be mounted. In the embodiments illustrated in FIGS. 2E-2G, a via opening 113 is formed in the bottom surface 116 of each bank opening 112 to connect with an integrated circuit (IC) 120 in substrate 100. In the particular embodiments illustrated, a corresponding array of ICs 120 are interconnected with the bottom surfaces 116 of the array of bank openings 112. In the embodiment illustrated in FIG. 2F, a corresponding array of via openings 118 are formed within the insulating layer 110 to expose the substrate 100. For example, each via opening 118 may correspond to a bank opening 112. In the embodiment illustrated in FIG. 2F, each via opening 118 exposes a second electrical line out 106 in the substrate 100. In an embodiment, electrical line out 106 functions as a contact or contact line such as an anode line or cathode line in the completed system. In an embodiment electrical line out 106 is connected with one or more integrated circuits 120. In an embodiment illustrated in FIG. 2G, a single via opening 118 is formed within the insulating layer 110 to correspond to a plurality of bank openings 112. As illustrated in FIGS. 2E-2F, the electrical lines out 106 may also be interconnected with the corresponding array of ICs 120.

Figure 2H:
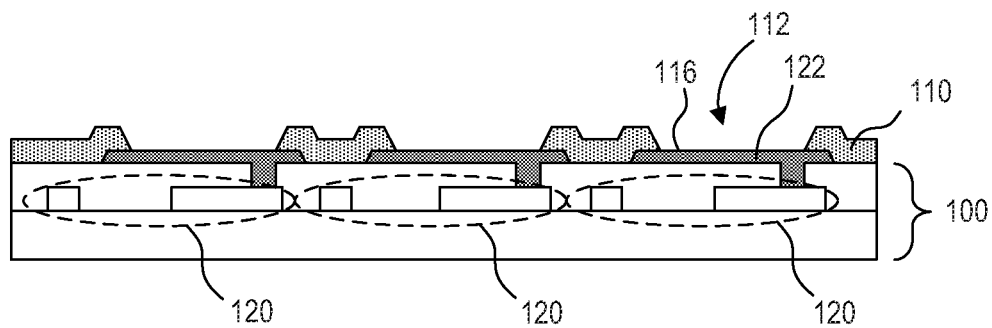
FIG. 2H is a cross-sectional side view illustration of an array of bank openings formed in an insulating layer over a substrate including circuitry in accordance with an embodiment of the invention.
Figure 2I:
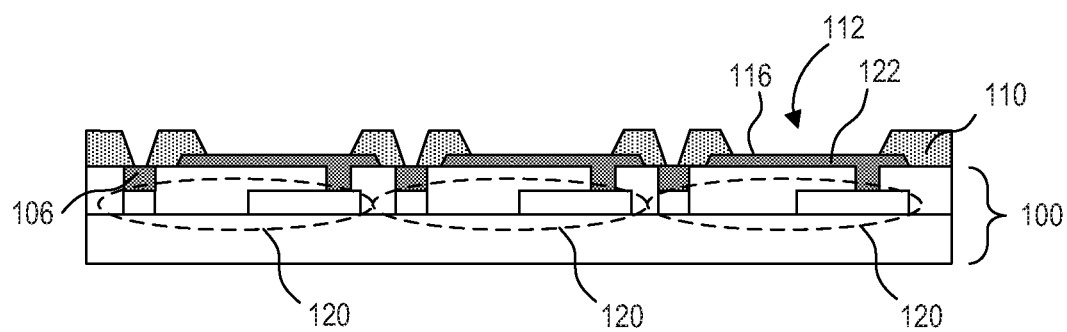
FIG. 2I is a cross-sectional side view illustration of an array of bank openings and a corresponding array of via openings formed in an insulating layer over a substrate including circuitry in accordance with an embodiment of the invention.
Figure 2J:
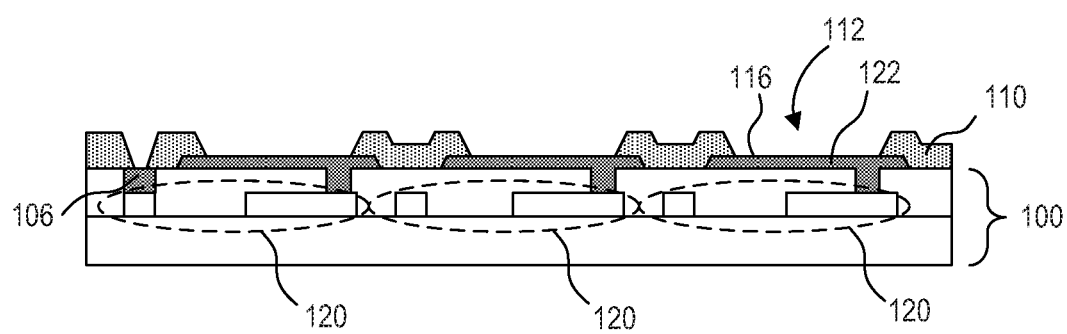
FIG. 2J is a cross-sectional side view illustration of an array of bank openings and a via opening formed in an insulating layer over a substrate including circuitry in accordance with an embodiment of the invention.

Referring now to FIGS. 2H-2J, in some embodiments, the bottom surfaces 116 of the array of bank openings 112 are on an array of conductive contact pads 122 interconnected with a corresponding array of ICs 120. Conductive contact pads 122 may be formed of the same materials as the electrical lines out 102, 106 described above. In the embodiment illustrated in FIG. 2I, a corresponding array of via openings 118 are formed within the insulating layer 110 to expose the substrate 100. For example, each via opening 118 may correspond to a bank opening 112. In the embodiment illustrated in FIG. 2I, each via opening 118 exposes a second electrical line out 106 in the substrate 100. Electrical line out 106 may function as an contact or contact line such as an anode line or cathode line in the completed system. In an embodiment illustrated in FIG. 2J, a single via opening 118 is formed within the insulating layer 110 to correspond to a plurality of bank openings 112. As illustrated in FIGS. 2I-2J, the electrical lines out 106 may also be interconnected with the corresponding array of ICs 120.

The receiving substrate 100 in FIGS. 2E-2J may be an active matrix LED (AMLED) backplane. For example, each IC 120 may be a traditional 2T1C (two transistors, one capacitor) circuit including a switching transistor, a driving transistor, and a storage capacitor. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for current distribution to the driver transistor and the light emitting device, or for their instabilities.

Figure 3A:
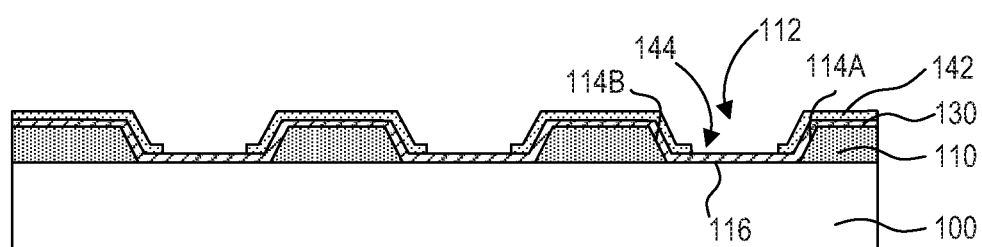
FIG. 3A is a cross-sectional side view illustration of a continuous reflective layer formed over an array of bank openings in accordance with an embodiment of the invention.
Figure 3B:
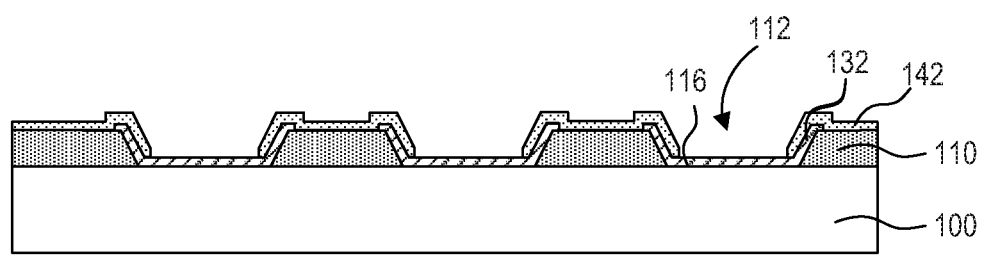
FIG. 3B is a cross-sectional side view illustration of an array of reflective bank layers formed over an array of bank openings in accordance with an embodiment of the invention.
Figure 3C:
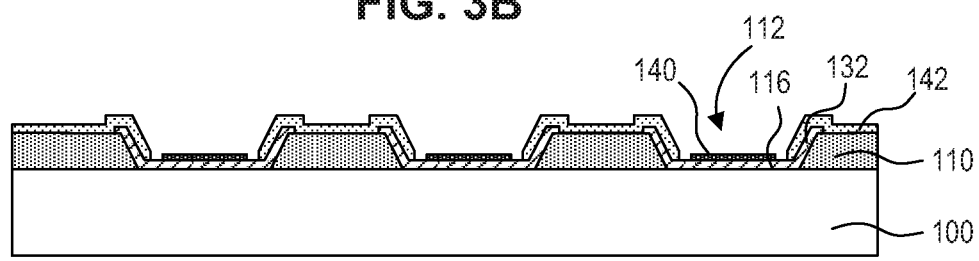
FIG. 3C is a cross-sectional side view illustration of an array of bonding layers formed on an array of reflective bank layers in accordance with an embodiment of the invention.
Figure 3D:
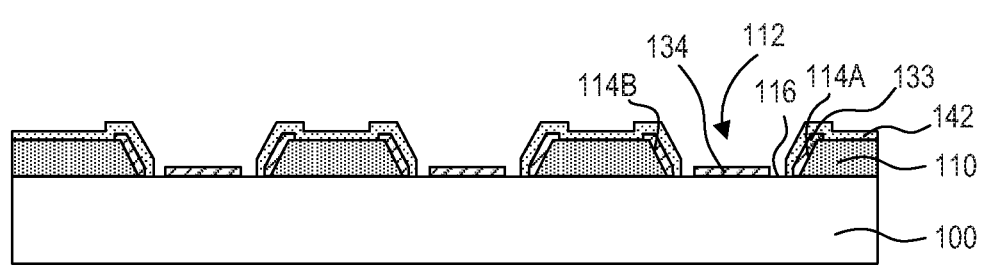
FIG. 3D is a cross-sectional side view illustration of an array of bank layers including a sidewall layer and a separate pad layer in accordance with an embodiment of the invention.
Figure 3E:
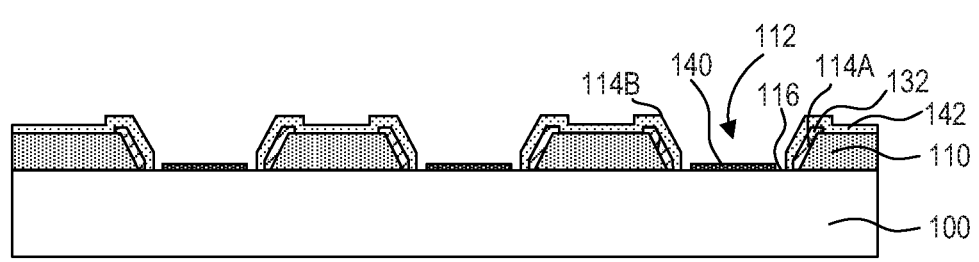
FIG. 3E is a cross-sectional side view illustration of an array of bonding layers formed on a bottom surface of an array of bank openings in accordance with an embodiment of the invention.
Figure 3F:
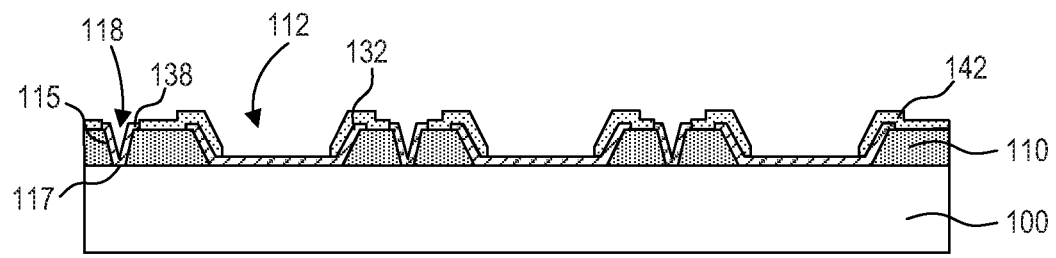
FIG. 3F is a cross-sectional side view illustration of an array of reflective bank layers and a corresponding array of reflective via layers in accordance with an embodiment of the invention.
Figure 3G:
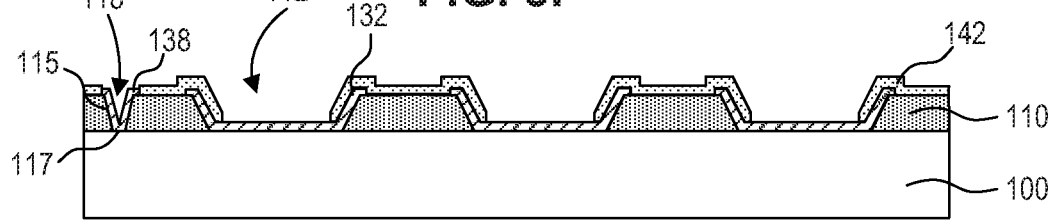
FIG. 3G is a cross-sectional side view illustration of an array of reflective bank layers and a reflective via layer in accordance with an embodiment of the invention.
Figure 3H:
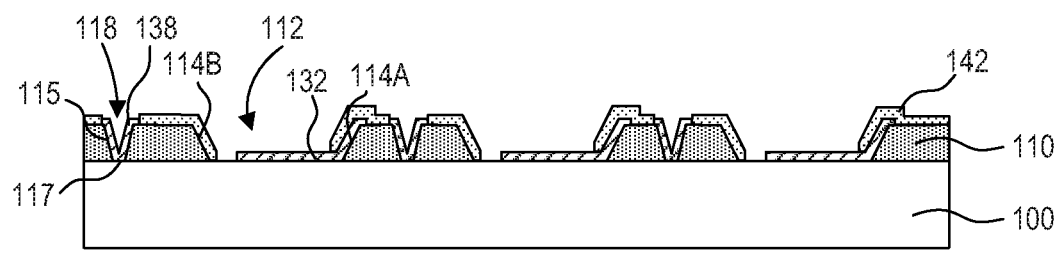
FIG. 3H is a cross-sectional side view illustration of an array of reflective bank layers spanning one laterally opposite sidewall of an array of bank openings, and a corresponding array of reflective via layers in accordance with an embodiment of the invention.
Figure 3I:
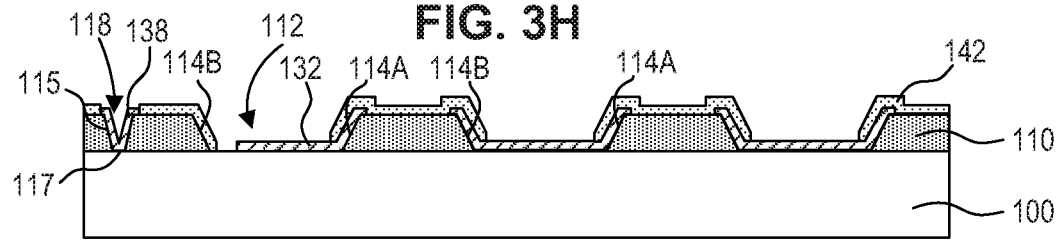
FIG. 3I is a cross-sectional side view illustration of a reflective bank layer spanning one laterally opposite sidewall of a bank opening and a reflective via layer in accordance with an embodiment of the invention.
Figure 3J:
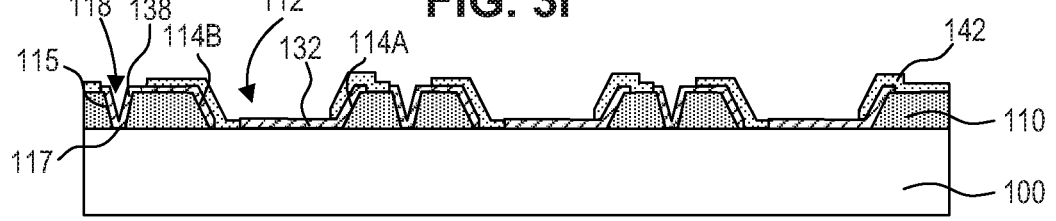
FIG. 3J is a cross-sectional side view illustration of an array of reflective bank layers spanning one laterally opposite sidewall of an array of bank openings, and a corresponding array of reflective via layers spanning the other laterally opposite sidewall of the array of bank openings in accordance with an embodiment of the invention.
Figure 3K:
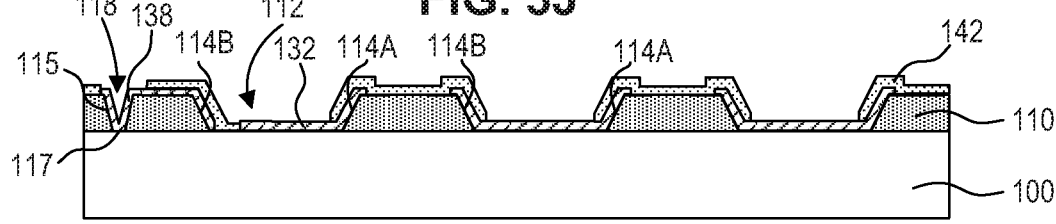
FIG. 3K is a cross-sectional side view illustration of a reflective bank layer spanning one laterally opposite sidewall of a bank opening and a reflective via layer spanning the other laterally opposite sidewall of the bank opening in accordance with an embodiment of the invention.
Figure 3L:
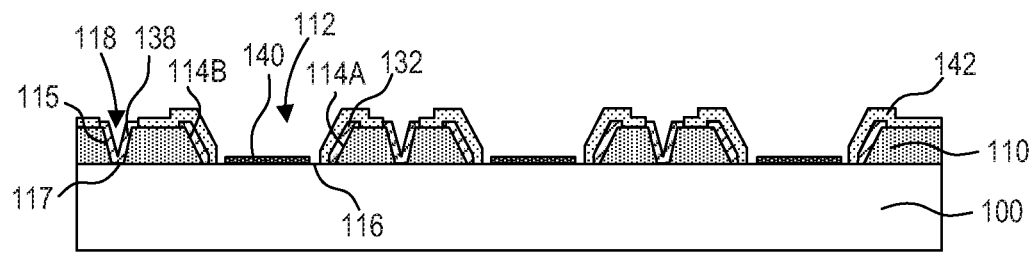
FIG. 3L is a cross-sectional side view illustration of an array of reflective bank layers spanning laterally opposite sidewalls of an array of bank openings, a corresponding array of reflective via layers, and a corresponding array of bonding layers on a bottom surface of the array of bank openings in accordance with an embodiment of the invention.
Figure 3M:
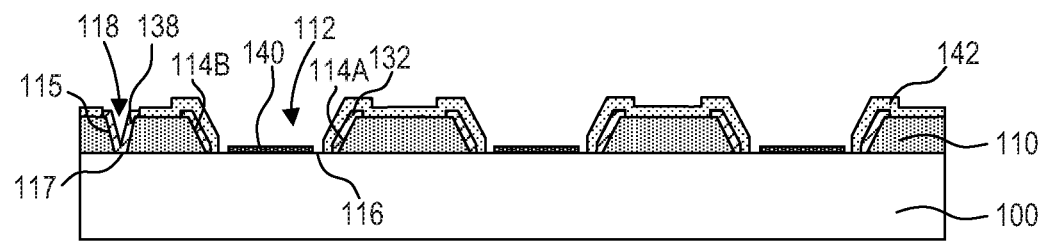
FIG. 3M is a cross-sectional side view illustration of an array of reflective bank layers spanning laterally opposite sidewalls of an array of bank openings, a reflective via layer, and an array of bonding layers on a bottom surface of the array of bank opening in accordance with an embodiment of the invention.
Figure 3N:
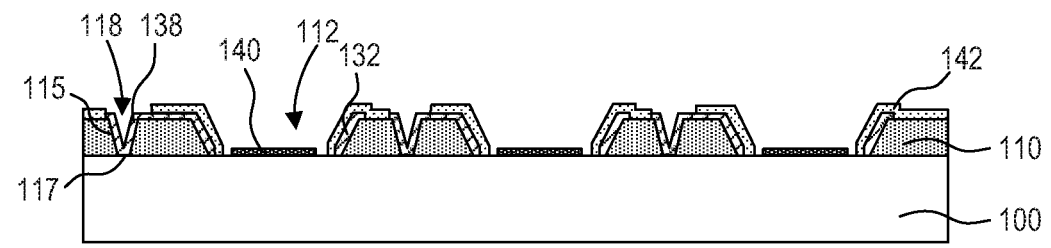
FIG. 3N is a cross-sectional side view illustration of an array of reflective bank layers spanning one laterally opposite sidewall of an array of bank openings, a corresponding array of reflective via layers spanning the other laterally opposite sidewall of the array of bank openings, and a corresponding array of bonding layers on a bottom surface of the array of bank openings in accordance with an embodiment of the invention.
Figure 3O:
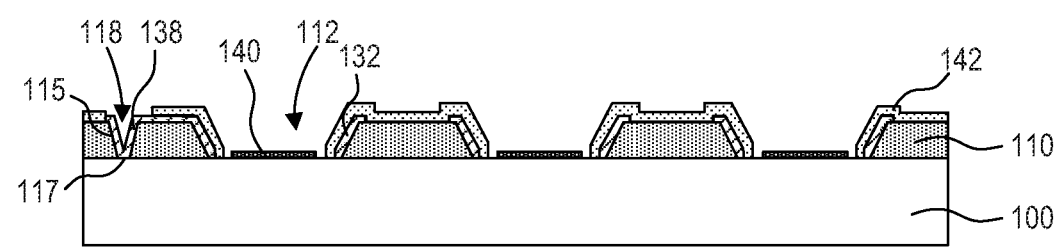
FIG. 3O is a cross-sectional side view illustration of a reflective bank layer spanning one laterally opposite sidewall of a bank opening, a reflective via layer spanning the other laterally opposite sidewall of the bank opening, and a bonding layer on a bottom surface of the bank opening in accordance with an embodiment of the invention.
Figure 3P:
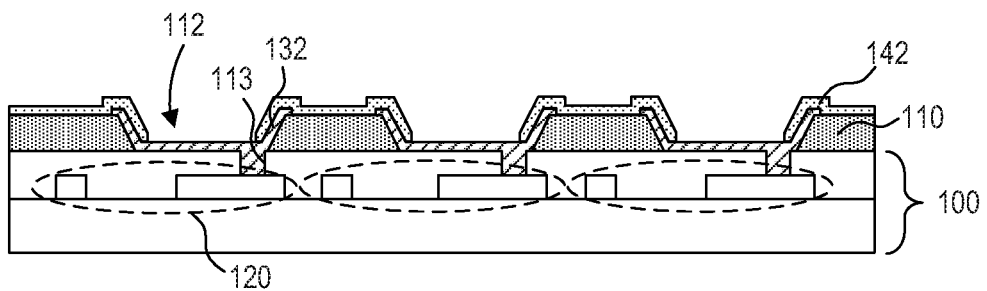
FIG. 3P is a cross-sectional side view illustration of an array of reflective bank layers formed over a substrate including circuitry in accordance with an embodiment of the invention.
Figure 3Q:
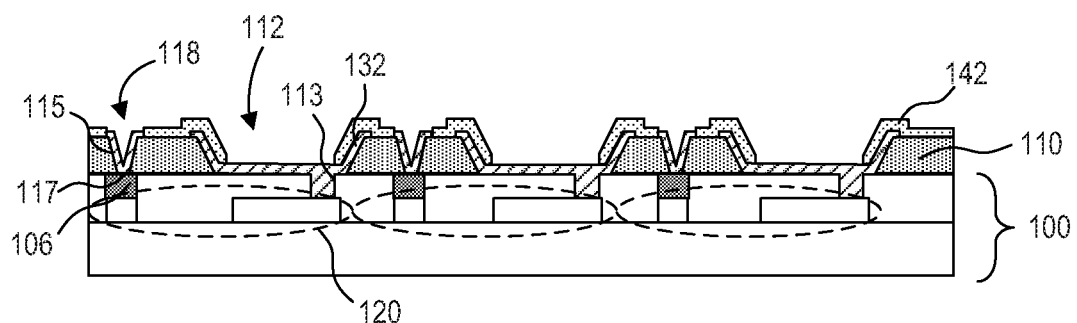
FIG. 3Q is a cross-sectional side view illustration of an array of reflective bank layers and a corresponding array of reflective via layers formed over a substrate including circuitry in accordance with an embodiment of the invention.
Figure 3R:
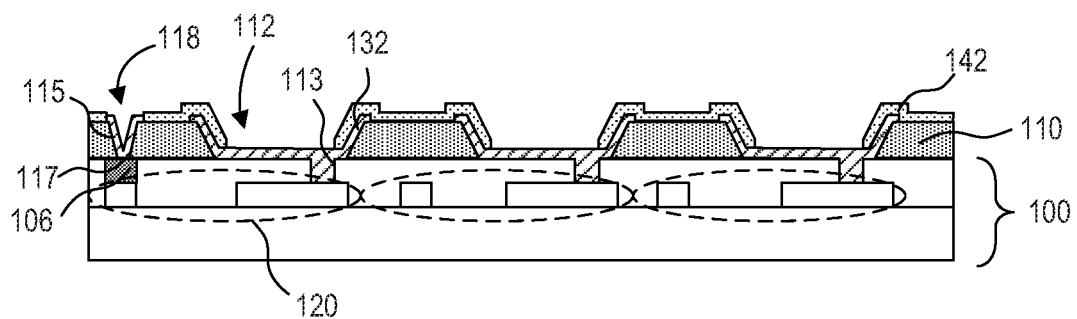
FIG. 3R is a cross-sectional side view illustration of an array of reflective bank layers and a reflective via layer formed over a substrate including circuitry in accordance with an embodiment of the invention.
Figure 3S:
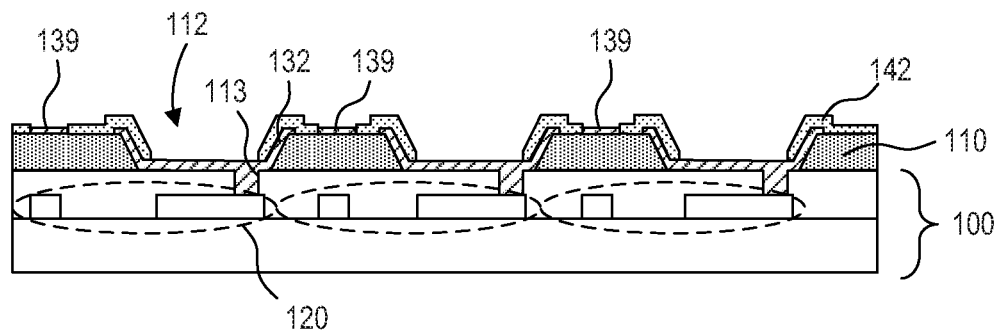
FIG. 3S is a cross-sectional side view illustration of an array of reflective bank layers and a corresponding array of reflective lines out formed over a substrate including circuitry in accordance with an embodiment of the invention.
Figure 3T:
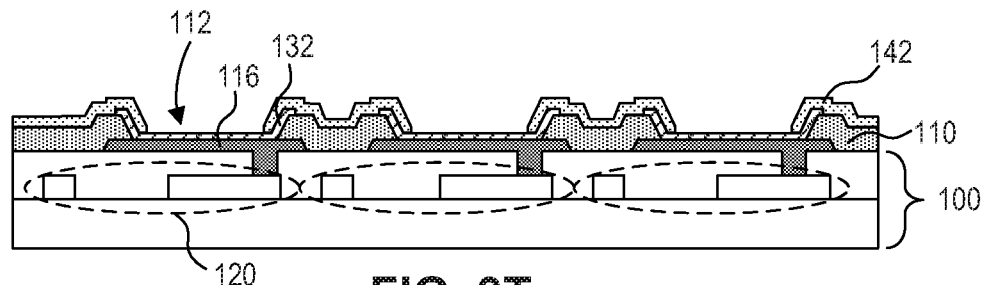
FIG. 3T is a cross-sectional side view illustration of an array of reflective bank layers formed over a substrate including circuitry in accordance with an embodiment of the invention.
Figure 3U:
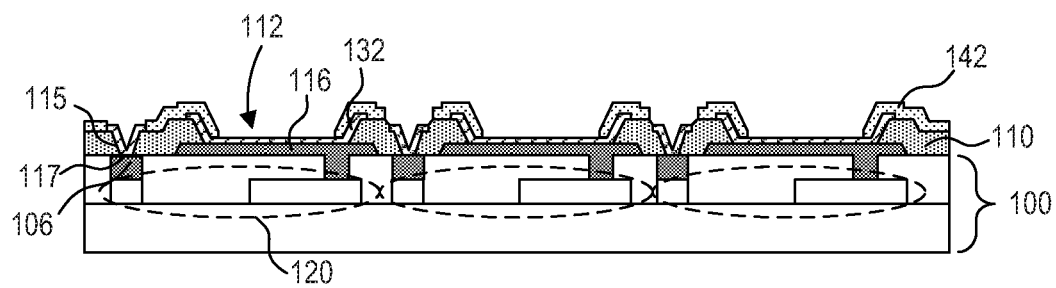
FIG. 3U is a cross-sectional side view illustration of an array of reflective bank layers and a corresponding array of reflective via layers formed over a substrate including circuitry in accordance with an embodiment of the invention.
Figure 3V:
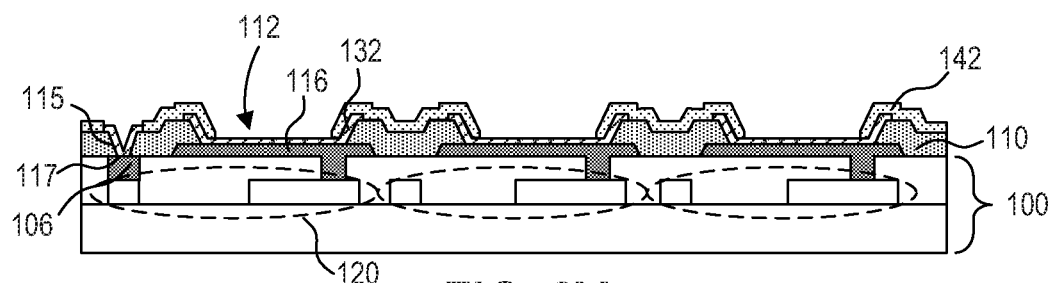
FIG. 3V is a cross-sectional side view illustration of an array of reflective bank layers and a reflective via layer formed over a substrate including circuitry in accordance with an embodiment of the invention.
Figure 3W:
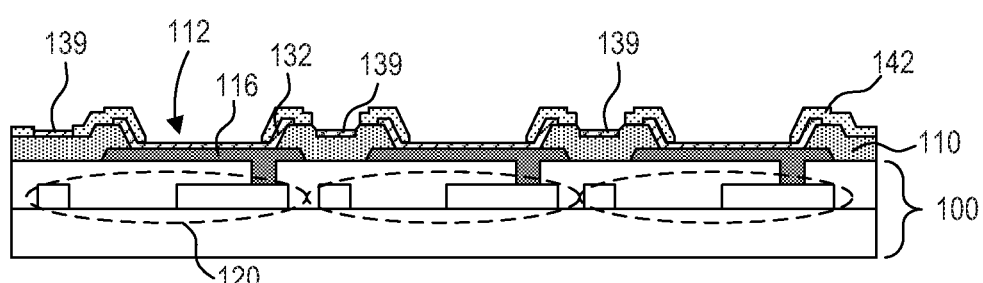
FIG. 3W is a cross-sectional side view illustration of an array of reflective bank layers and a corresponding array of reflective lines out formed over a substrate including circuitry in accordance with an embodiment of the invention.

FIGS. 3A-3W are cross-sectional side view illustrations of a number of possible reflective layer configurations on the substrate and patterned insulating layer configurations previously described with regard to FIGS. 2A-2J in accordance with embodiments of the invention. It is to be appreciated that the particular embodiments illustrated in FIGS. 3A-3W are intended to be exemplary and not limiting. Furthermore, the embodiments illustrated are not necessarily exclusive of one another, and some embodiments illustrated may be combined.

Referring to FIG. 3A, in an embodiment, a continuous reflective layer 130 is formed over the patterned insulating layer 110 and on the substrate 100 within the array of bank openings 112 in the insulating layer, and spanning the sidewalls 114A, 114B and the bottom surface 116 of each of the bank openings 112 in the insulating layer. The reflective layer 130 may be electrically conducting. In an embodiment, the reflective layer 130 functions as an anode or cathode line out.

The reflective layer 130 may be formed of a number of conductive and reflective materials, and may include more than one layer. In an embodiment, a reflective conductive layer 130 comprises a metallic film such as aluminum, molybdenum, titanium, titanium-tungsten, silver, or gold, or alloys thereof. The reflective layer 130 may also include a conductive material which is not necessarily reflective, such as amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment, the reflective layer includes a stack of a conductive material and a reflective conductive material. In an embodiment, the reflective layer includes a 3-layer stack including top and bottom layers and a reflective middle layer wherein one or both of the top and bottom layers are transparent. In an embodiment, the reflective layer includes a conductive oxide-reflective metal-conductive oxide 3-layer stack. The conductive oxide layers may be transparent. For example, the reflective layer 130 may include an ITO-silver-ITO layer stack. In such a configuration, the top and bottom ITO layers may prevent diffusion and/or oxidation of the reflective metal (silver) layer. In an embodiment, the reflective layer includes a Ti—Al—Ti stack. In an embodiment, the reflective layer includes an ITO-Ti-ITO stack. In an embodiment, the reflective layer includes a ITO-Ti—Al—Ti-ITO stack. In an embodiment, the reflective layer is 1 µm or less in thickness. The reflective layer may be deposited using a suitable technique such as, but not limited to, PVD.

Still referring to FIG. 3A, a patterned transparent insulator layer 142 is optionally formed over the reflective layer 130. The patterned transparent insulator layer may at least partially cover the insulating layer 110 and the reflective layer 130 on the sidewalls 114A, 114B of the bank openings 112. The patterned transparent insulator layer 142 may include an array of openings 144 directly over the bottom surface 116 of the array of bank openings 112. In an embodiment, the patterned transparent insulator layer 142 is formed by blanket deposition using a suitable technique such as lamination, spin coating, CVD, and PVD, and then patterned using a suitable technique such as lithography. Transparent insulator 142 may be formed of a variety of materials such as, but not limited to, $SiO_2$, $SiN_x$, PMMA, BCB, polyimide, acrylate, epoxy, and polyester. For example, the patterned insulating layer 142 may be 0.5 µm thick. The patterned transparent insulator layer 142 may be transparent or semi-transparent where formed over the reflective layer 130 on sidewalls 114A, 114B so as to not significantly degrade light emission extraction of the completed system. Thickness of the patterned transparent insulator layer 142 may also be controlled to increase light extraction efficiency, and also to not interfere with the array of transfer heads during transfer of the array of light emitting devices to the reflective bank structure. In the following discussion of FIGS. 3A-3W, each of the illustrated embodiments includes an optional patterned transparent insulator layer 142, which may be useful when forming a top conductive contact described with regard to the systems illustrated in FIGS. 7A-15D so as to prevent shorting between conductive layers. As will become more apparent in the following description, the patterned transparent insulator layer 142 is optional, and represents one manner for electrically separating conductive layers.

Referring now to FIG. 3B, in an embodiment the reflective layer 130 is patterned into an array of reflective bank layers 132 corresponding to the array of bank openings 112, for example, using lithography or a photoresist lift-off technique. A patterned transparent insulator layer 142 may then be formed over the array of reflective bank layers 132 and patterned insulating layer 110. In the embodiment illustrated in FIG. 3C, a bonding layer 140 may be deposited on the reflective layer 130 covering the bottom surface 116 of the bank opening 112 to aid in securing the micro light emitting devices, such as a vertical micro LED. For example, bonding layer 140 may include a material such as indium, gold, silver, molybdenum, tin, aluminum, silicon, or an alloy thereof, or transparent conducting polymer, and is approximately 0.1 µm to 1 µm thick. In an embodiment, the thickness of the bonding layer is controlled to render the bonding layer transparent to the visible wavelength. While FIG. 3C is the only illustration in FIGS. 3A-3W of a bonding layer 140 formed on the reflective layer 130, it is to be appreciated that in other embodiments a bonding layer 140 may be formed on any of the other reflective layers 130, whether patterned or not, to aid in securing a light emitting device within a bank opening 112. In the embodiments illustrated in FIGS. 3A-3C, the reflective layer 130 or array of reflective bank layers 132 are each illustrated as completely covering the sidewalls 114A, 114B and bottom surface 116 of each of the bank openings 112. For example, the reflective bank layer 132 configuration illustrated in FIGS. 3B-3C may be cone-shaped, with a flat bottom surface.

Referring now to FIGS. 3D-3E, in some embodiments the reflective bank layers 132 span the sidewalls 114A, 114B, and do not completely cover the bottom surface 116 of the bank openings 112. In an embodiment, the reflective bank layers 132 completely cover the sidewalls 114A, 114B, and do not completely cover the bottom surface 116 of the bank openings 112. In the embodiment illustrated in FIG. 3D, the reflective bank layers 132 include a sidewall layer 133 that spans the sidewalls 114A, 114B of the corresponding bank opening 112, and a separate pad layer 134 on the bottom surface 116 of the corresponding bank opening 112. In this manner the pad layer 134 is electrically isolated from the sidewall layer 133. In the embodiment illustrated in FIG. 3E, the reflective bank layers 132 span the sidewalls 114A, 114B of the corresponding bank openings 112 and do not cover a center of the bottom surface 116 of the corresponding bank openings 112. In the embodiment illustrated in FIG. 3E, a bonding layer 140 may be deposited on the bottom surface 116 of the bank opening 112 to aid in securing the micro LED as will be described in further detail below. For example, bonding layer 140 may include a material such as indium, gold, silver, molybdenum, tin, aluminum, silicon, or an alloy, or a transparent conducting polymer thereof and is approximately 50 nm to 1 µm thick. In an embodiment, the thickness of the bonding layer is controlled to render the bonding layer transparent to the visible wavelength. In the embodiment illustrated in FIG. 3E, the bonding layer is electrically isolated from the reflective bank layer 132 spanning the sidewalls 114A, 114B of the bank openings 112.

Referring now to FIGS. 3F-3O, 3Q-3R, 3U-3V, in some embodiments the reflective layer can be patterned and formed over a patterned insulating layer including an array of bank openings 112 and one or more via openings 118. Following the formation of the reflective layer, a transparent insulator layer 142 may optionally be formed over the patterned reflective layer and patterned insulating layer. As described above, the patterned transparent insulator layer 142 may be formed by, for example, blanket deposition and patterning using a suitable technique such as lithography. In the particular embodiments illustrated, the patterned transparent insulator 142 is illustrated as being formed over and between layers 132, 138. However, the patterned transparent insulator 142 may assume other patterns. For example, in some embodiments the patterned transparent insulator is not formed between a reflective via layer 138 and a corresponding reflective bank layer 132. In the embodiments illustrated in FIGS. 3F, 3H, 3J, 3L, 3N, 3Q, 3U the reflective layer is patterned to form an array of reflective bank layers 132 within the array of bank openings 112 and a corresponding separate array of reflective via layers 138 within the array of via openings 118. In the embodiments illustrated the array of reflective via layers 138 span sidewalls 115 and a bottom surface 117 of via openings 118. In accordance with embodiments of the invention, reflective via layer 138, may function as an electrical line out or be connected with an electrical line out. In other embodiments, the reflective layer is formed over a patterned insulating layer including array of bank openings to form electrical line out 139 and reflective bank layer 132, as illustrated in FIGS. 3S, 3W.

In the embodiments illustrated in FIGS. 3G, 3I, 3K, 3M, 3O, 3R, 3V the reflective layer is patterned to form an array of reflective bank layers 132 within the array of bank openings 112 and a reflective via layer 138 within a via opening 118. In the embodiments illustrated, the single reflective via layer 138 spans sidewalls 115 and a bottom surface 117 of via opening 118, and the single reflective layer 138 corresponds to a plurality of reflective bank layers 132. In accordance with embodiments of the invention, reflective via layer 138, may function as an electrical line out or be connected with an electrical line out. In other embodiments, the reflective layer is formed over a patterned insulating layer including array of bank openings to form electrical line out 139 and reflective bank layer 132.

The embodiments illustrated in FIGS. 3F-3O, 3Q-3R, 3U-3V all include a reflective via layer 138 spanning the sidewalls 115 and bottom surface 117 of via openings 118. Embodiments of the invention do not require a reflective via layer 138 to be formed with the via openings 118. In other embodiments, the via openings 118 can be filled with another conductive material, including the conductive material used to make top contact with the array of light emitting devices, as described in further detail below. In other embodiments, such as those illustrated in FIGS. 3S, 3W an electrical line out 139 may be formed from the same material as the reflective bank layer 132. In some embodiments, the reflective via layer 138 functions as the electrical line out.

Referring again to the embodiments illustrated in FIGS. 3F-3G, the array of reflective bank layers 132 completely cover the sidewalls 114A, 114B and bottom surface 116 of each of the bank openings 112. In the embodiments illustrated in FIGS. 3H-3I, the array of reflective bank layers 132 span a first sidewall 114A, but do not span a laterally opposite sidewall 114B. In the embodiments illustrated in FIGS. 3J-3K and 3N-3O, the reflective via layers 138 span sidewalls 115 and a bottom surface 117 of via openings 118, and across a top surface of the patterned insulating layer 110, and along a sidewall 114B of an adjacent bank opening 112.

In the embodiments illustrated in FIGS. 3L-3M, the array of reflective bank layers 132 cover the sidewalls 114A, 114B but do not cover a center of the bottom surface 116 of each of the bank openings 112. In the particular embodiments illustrated in FIGS. 3L-3O, an array of bonding layers 140 are deposited on the bottom surface 116 of the bank openings 112 to aid in securing an array of light emitting devices.

Referring now to FIGS. 3P-3W, an array of reflective bank layers 132 may be formed over the substrates of FIGS. 2E-2J. In the embodiments illustrated in FIG. 3P-3S, the reflective bank layer 132 is also formed within the via openings 113 in the bottom surface 116 of each bank opening 112 to connect with an integrated circuit (IC) 120 in substrate 100. In the embodiments illustrated in FIG. 3T-3W, the reflective bank layer 132 is formed on a conductive contact pad 122 interconnected with an IC 120.

Figure 4A:
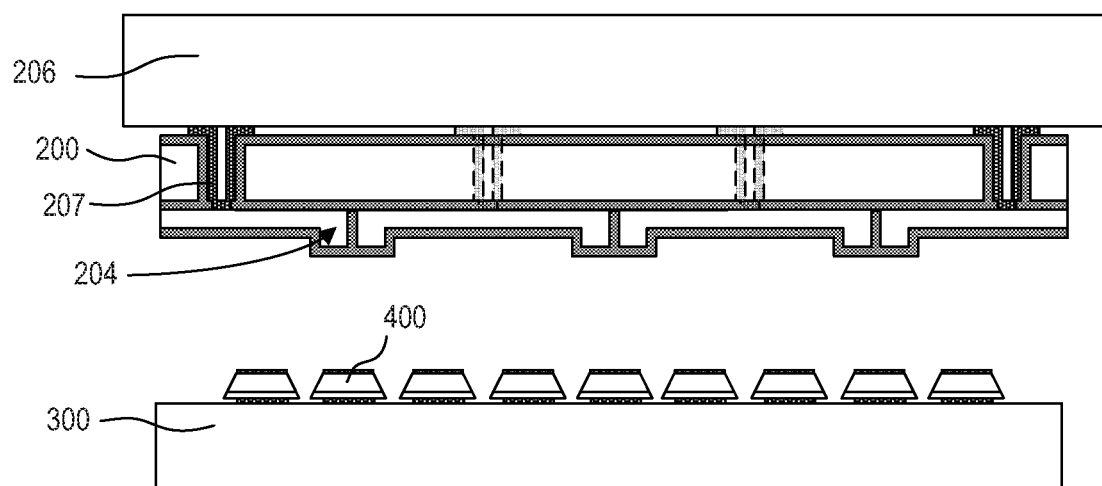
FIGS. 4A-4F are cross-sectional side view illustrations of a method of transferring an array of light emitting devices onto an array of reflective bank structures in accordance with an embodiment of the invention.
Figure 4B:
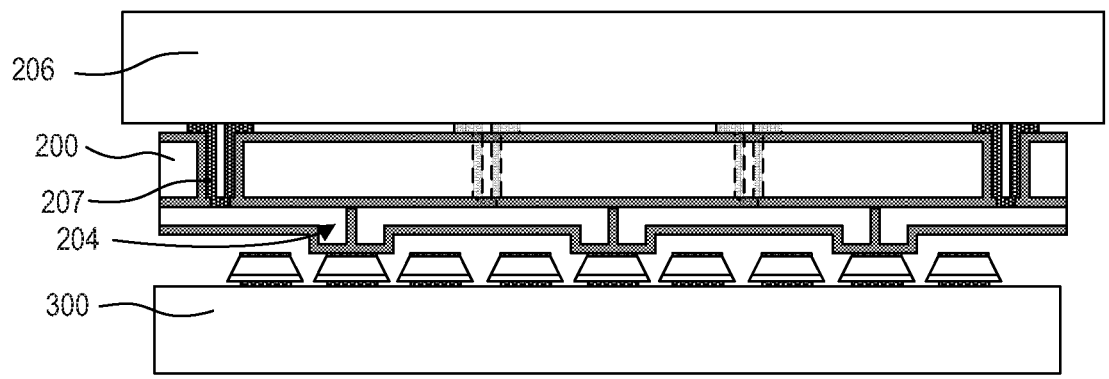
Figure 4C:
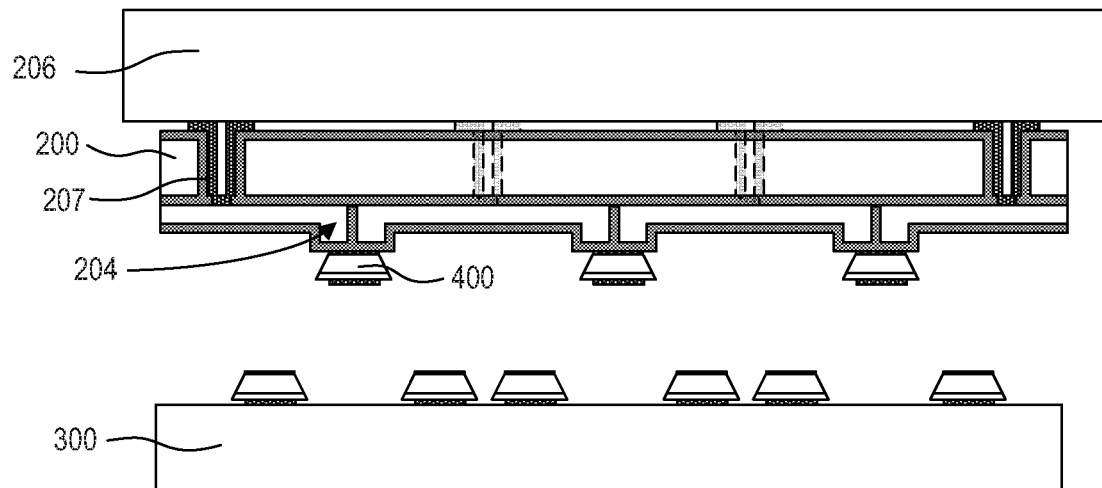
Figure 4D:
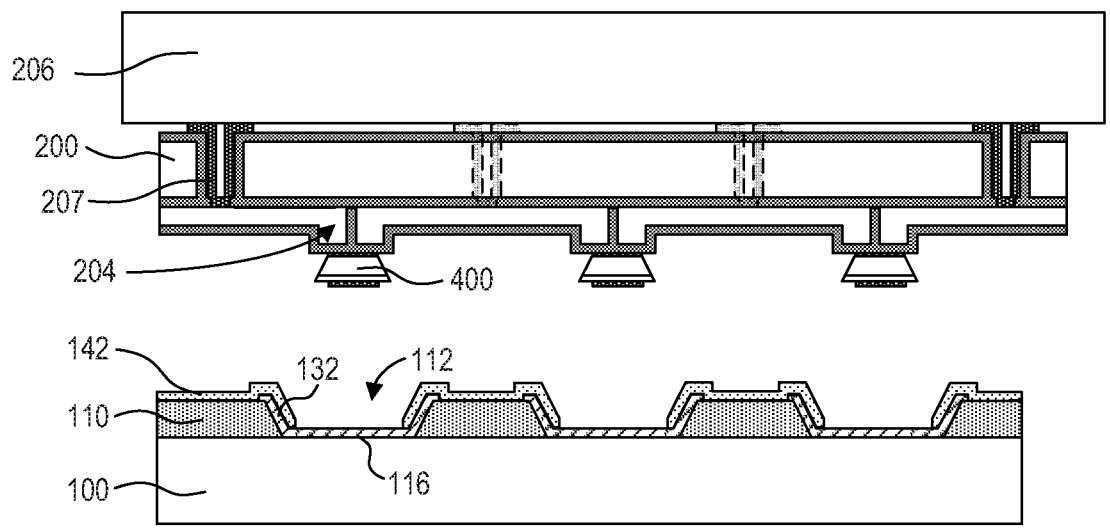

FIGS. 4A-4F are cross-sectional side view illustrations of a method of picking up and transferring an array of light emitting devices from a carrier substrate to a receiving substrate in accordance with an embodiment of the invention. FIG. 4A is a cross-sectional side view illustration of an array of light emitting device transfer heads 204 supported by substrate 200 and positioned over an array of light emitting devices 400 stabilized on carrier substrate 300 in accordance with an embodiment of the invention. The array of light emitting devices 400 are then contacted with the array of transfer heads 204 as illustrated in FIG. 4B. As illustrated, the pitch of the array of light emitting devices 400 may be an integer multiple of the pitch of the array of transfer heads 204. In the embodiment illustrated the integer multiple is 3 though may be other integer multiples. In an embodiment, the integer multiple may also be 1 so that the pitch of the array of light emitting devices 400 matches the pitch of the array of transfer heads 204. In another embodiment not illustrated, the pitch of the array of transfer heads 204 is an integer multiple of the pitch of the array of light emitting devices 400. A voltage is applied to the array of transfer heads 204 to create a grip pressure on the array of light emitting devices. The voltage may be applied from the working circuitry within a transfer head assembly 206 in electrical connection with the array of transfer heads through vias 207. The array of light emitting devices 400 is then picked up with the array of transfer heads 204 as illustrated in FIG. 4C, and positioned over a receiving substrate 100 including a reflective bank structure as illustrated in FIG. 4D.

Figure 4E:
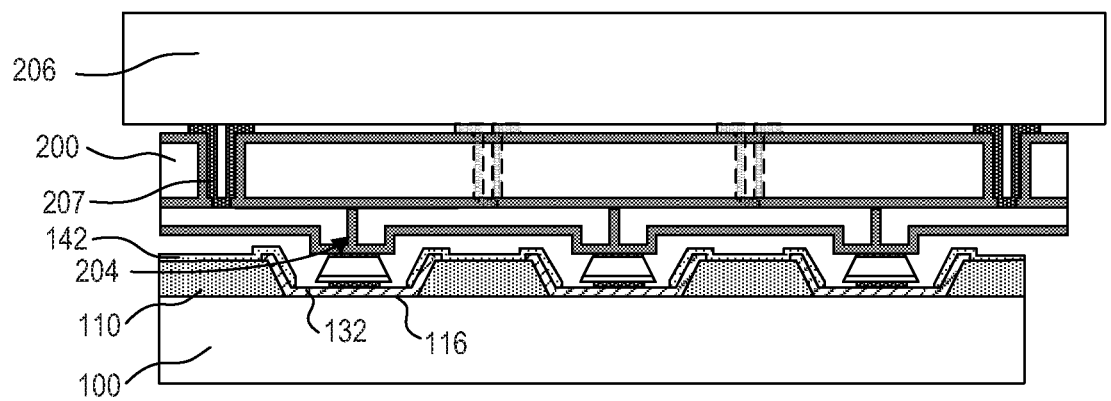
Figure 4F:
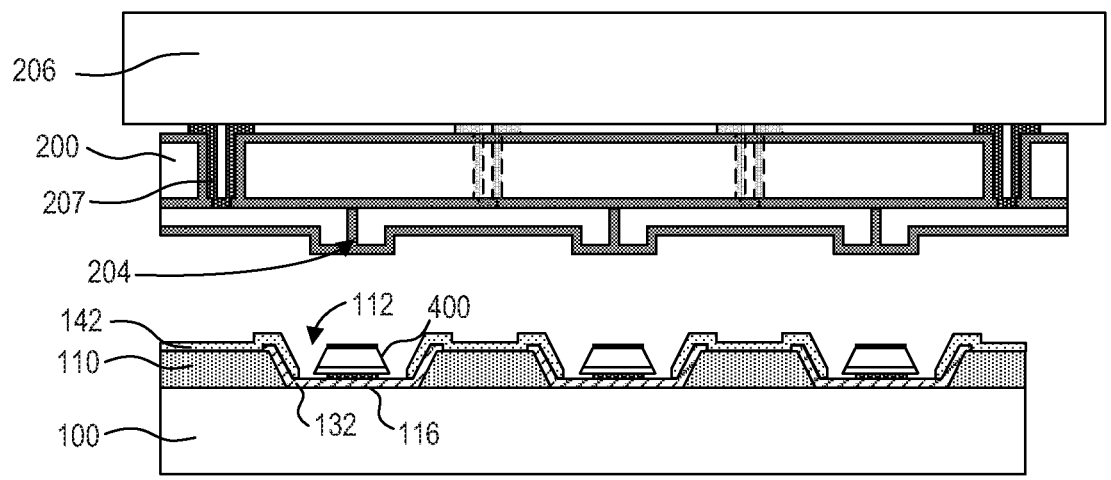

The array of light emitting devices 400 is then brought into contact with the receiving substrate 100 as illustrated in FIG. 4E. In the particular embodiment illustrated in FIG. 4E, the array of light emitting devices 400 are brought into contact with the reflective bank layer 132 on the bottom surface 116 of the bank openings 112. The array of light emitting devices 400 is then released within the array of bank openings 112 on receiving substrate 100 as illustrated in FIG. 4F.

In one embodiment, an operation is performed to create a phase change in a bonding layer connecting the array of light emitting devices 400 to the carrier substrate 300 prior to or while picking up the array of light emitting devices. For example, the bonding layer may have a liquidus temperature less than 350° C., or more specifically less than 200° C. In an embodiment, the bonding layer is a material such as indium or an indium alloy. If a portion of the bonding layer is picked up with the light emitting device, additional operations can be performed to control the phase of the portion of the bonding layer during subsequent processing. For example, heat can be applied to the bonding layer from a heat source located within the transfer head assembly 206, carrier substrate 300, and/or receiving substrate 100.

The operation of applying the voltage to create a grip pressure on the array of light emitting devices can be performed in various orders. For example, the voltage can be applied prior to contacting the array of light emitting devices with the array of transfer heads, while contacting the light emitting devices with the array of transfer heads, or after contacting the light emitting devices with the array of transfer heads. The voltage may also be applied prior to, while, or after creating a phase change in the bonding layer.

Where the transfer heads 204 include bipolar electrodes, an alternating voltage may be applied across a the pair of electrodes in each transfer head 204 so that at a particular point in time when a negative voltage is applied to one electrode, a positive voltage is applied to the other electrode in the pair, and vice versa to create the pickup pressure. Releasing the array of light emitting devices from the transfer heads 204 may be accomplished with a variety of methods including turning off the voltage sources, lower the voltage across the pair of silicon electrodes, changing a waveform of the AC voltage, and grounding the voltage sources. In an embodiment releasing the array of light emitting devices is accomplished by altering a waveform of the operating voltage creating the grip pressure and discharging charge stored in the array of light emitting devices through the bonding layer 140 or reflective layer 130 in the bank structure.

Referring back to FIG. 4E, in some embodiments, the height of the vertical micro LEDs 400 mounted within the array of bank openings 118 is greater than the thickness of the insulating layer 110. Having the top surface of the array of vertical micro LEDs higher than the top surface of the insulating layer 110 and any intervening layers may prevent any idle transfer heads from being damaged by or damaging the insulating layer (or any intervening layer) on the receiving substrate during placement of the vertical micro LEDs within the bank openings. For example, where insulating layer 110 is 2 μm thick, each vertical micro LED 400 is 2 μm thick or thicker. For example, where insulating layer is 30 μm thick, each vertical micro LED 400 is 30 μm thick or thicker. In an embodiment, the height of each transfer head 204 may be between 2-20 μm. Accordingly, some amount of clearance may be provided by virtue of the height of the transfer heads 204, and it may not be required in all embodiments for the top surface of the array of vertical micro LEDs to raise above the top surface of the insulating layer 110 and any intervening layers.

In the following description with regard to FIGS. 5A-15G various cross-sectional side view and top view illustrations are provided for integrating an array of light emitting devices with a number of possible configurations of the substrate and patterned insulating layer configurations of FIGS. 2A-2J with the reflective layer configurations of FIGS. 3A-3W in accordance with embodiments of the invention. It is to be appreciated that the particular embodiments illustrated in FIGS. 5A-15G are intended to be exemplary and not limiting. Furthermore, the embodiments illustrated are not necessarily exclusive of one another, and some embodiments illustrated may be combined.

Figure 5A:
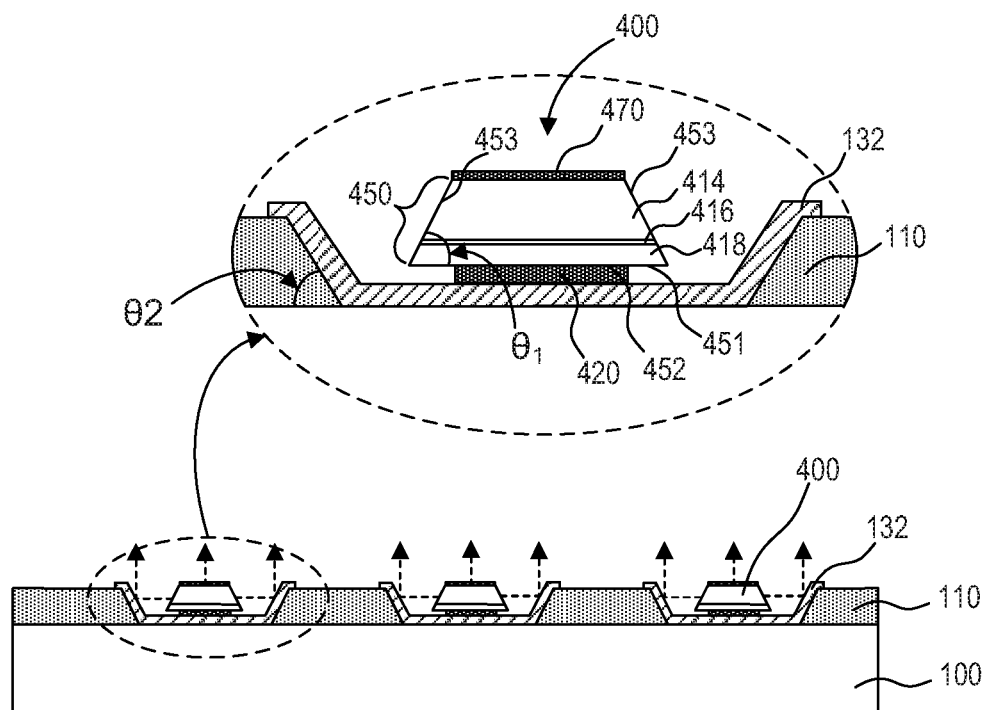
FIG. 5A is a cross-sectional side view illustration of an array of vertical micro LEDs mounted within a reflective bank structure for a top emitting system in accordance with an embodiment of the invention.
Figure 5B:
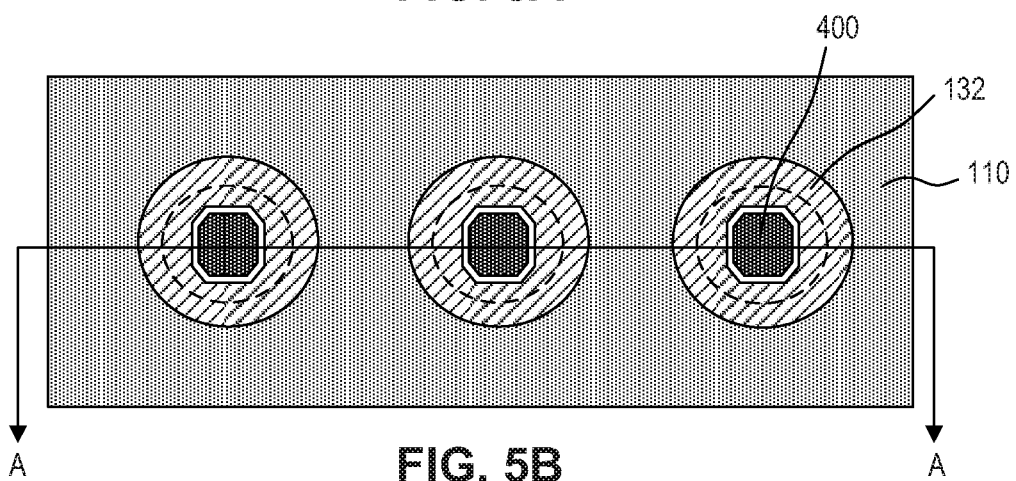
FIG. 5B is a top view illustration of FIG. 5A in accordance with an embodiment of the invention.

Referring now to FIG. 5A, in an embodiment, an array of light emitting devices are mounted within the reflective bank structure for a top emitting system, as indicated by the direction of the dotted arrow lines. The specific embodiment illustrated in FIG. 5A corresponds to the reflective bank structure previously described with regard to FIG. 3B without the optional transparent insulator layer, though it is understood that a number of other reflective bank structures will also be useful in a top emitting system. FIG. 5B is a top view illustration of FIG. 5A, with the side view illustration of FIG. 5A taken along line A-A in FIG. 5B. As illustrated, the array of reflective bank structures 132 may be formed in a cone-like shape with a flat bottom surface and sidewalls laterally surrounding the light emitting devices 400. Though embodiments of the invention are not limited to such, and may assume a variety of configurations such as polygon, square, rectangle, oval, etc. Referring again to FIG. 5A, a close up illustration is provided of a vertical micro LED device 400 in accordance with an embodiment. It is to be appreciated, that the specific vertical micro LED device 400 illustrated is exemplary and that embodiments of the invention are not limited. For example, embodiments of the invention may also be applicable to other devices such as, but not limited to, the micro LED devices in U.S. patent application Ser. No. 13/372,222, U.S. patent application Ser. No. 13/436,260, U.S. patent application Ser. No. 13/458,932, and U.S. patent application Ser. No. 13/625,825 all of which are incorporated herein by reference. Embodiments of the invention may also be applicable to other devices which are designed in such a way so as to perform a photonic function (LED, SLD, laser).

In the particular embodiment illustrated, the vertical micro LED device 400 includes a micro p-n diode 450 and a bottom electrode 420. A bonding layer (not illustrated) may optionally be formed below the bottom electrode 420, with the bottom electrode 420 between the micro p-n diode 450 and the bonding layer. In an embodiment, the vertical micro LED device 400 further includes a top electrode 470. In an embodiment, the vertical micro LED device 400 is several microns thick, such as 30 μm or less, or even 5 μm or less, and the top and bottom electrodes 470, 420 are each 0.1 μm-2 μm thick. In an embodiment, a maximum width of each vertical micro LED device 400 is 1-100 μm, for example 30 μm, 10 μm, or 5 μm.

The top electrode 470 and/or bottom electrode 420 may include one or more layers and can be formed of a variety of electrically conducting materials including metals, conductive oxides, and conductive polymers. The top and bottom electrodes 470, 420 may be transparent or semi-transparent to the visible wavelength range (e.g. 380 nm-750 nm) or opaque. The top and bottom electrodes 470, 420 may optionally include a reflective layer, such as a silver layer.

In an embodiment, the micro p-n diode 450 includes a top n-doped layer 414, one or more quantum well layers 416, and a lower p-doped layer 418. In an alternative embodiment, the top doped layer 414 is p-doped, and the lower doped layer 418 is n-doped. The micro p-n diodes can be fabricated with straight sidewalls or tapered sidewalls. In certain embodiments, the micro p-n diodes 450 possess outwardly tapered sidewalls 453 (from top to bottom). In certain embodiments, the micro p-n diodes 450 possess inwardly tapered sidewall (from top to bottom).

The micro p-n diode and bottom electrode may each have a top surface, a bottom surface and sidewalls. In an embodiment, the bottom surface 451 of the micro p-n diode 450 is wider than the top surface 452 of the micro p-n diode, and the sidewalls 453 are tapered outwardly from top to bottom. The top surface of the micro p-n diode 450 may be wider than the bottom surface of the p-n diode, or approximately the same width. In an embodiment, the bottom surface 451 of the micro p-n diode 450 is wider than the top surface of the bottom electrode 420. The bottom surface of the micro p-n diode may also be approximately the same width as the top surface of the bottom electrode 420. In an embodiment the top surface of the micro p-n diode is approximately the same width as the top electrode 470.

Still referring to FIG. 5A, in an embodiment the sidewalls 453 form an angle $\theta_1$ with the bottom surface 451 of the micro p-n diode 450, and the sidewalls 114 form an angle $\theta_2$ with top surface of the substrate 100. As illustrated angles $\theta_1$ and $\theta_2$ are both formed along a plane parallel to the top surface of the substrate. In an embodiment, $\theta_2$ is smaller than $\theta_1$ and is in the opposite direction. For example, in an embodiment, angle $\theta_1$ is between +90 and +85 degrees, and $\theta_2$ is between −85 and −30 degrees, or more specifically between −40 and −60 degrees with respect to the top surface of the substrate 100. It is to be appreciated that the angular relationships illustrated are exemplary, and in other embodiments, for example, $\theta_1$ may have a negative value rather than positive value (i.e. inwardly tapered sidewalls).

Figure 6A:
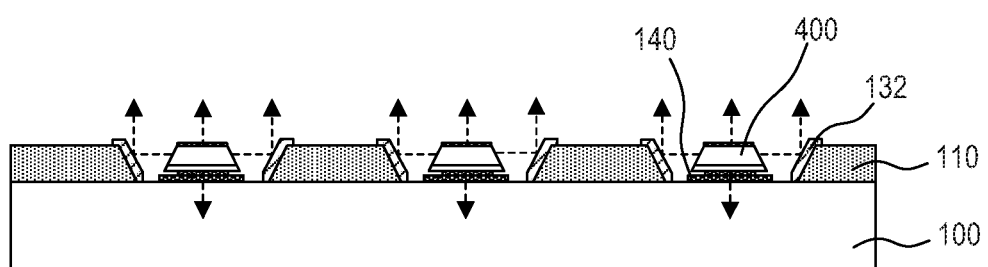
FIG. 6A is a cross-sectional side view illustration of an array of vertical micro LEDs mounted within a reflective bank structure for a top and bottom emitting system in accordance with an embodiment of the invention.
Figure 6B:
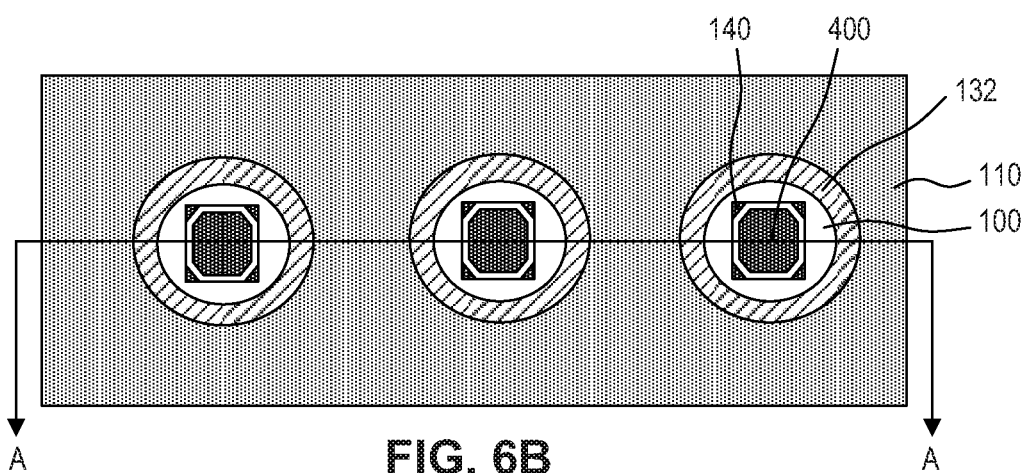
FIG. 6B is a top view illustration of FIG. 6A in accordance with an embodiment of the invention.

Referring now to FIG. 6A, in an embodiment, an array of light devices are mounted within the reflective bank structure for a top and bottom emitting system, as indicated by the direction of the dotted arrow lines. The specific embodiment illustrated in FIG. 6A corresponds to the reflective bank structure previously described with regard to FIG. 3E without the optional transparent insulator layer, though it is understood that a number of other reflective bank structures will also be useful in a top and bottom emitting system. FIG. 6B is a top view illustration of FIG. 5A, with the side view illustration of FIG. 6A taken along line A-A in FIG. 6B. In the embodiment illustrated the reflective bank layers 132 on sidewalls 114A, 114B form rings around the light emitting devices 400. Though embodiments of the invention are not limited to such, and may assume a variety of configurations such as polygon, square, rectangle, oval, etc. A number of modifications can be performed to increase top or bottom emission, such as including a reflective layer in either of the top electrode 470 or bottom electrode 420, or including a reflective layer (such as a reflective conductive contact layer) over or under the light emitting device 400.

Figure 7A:
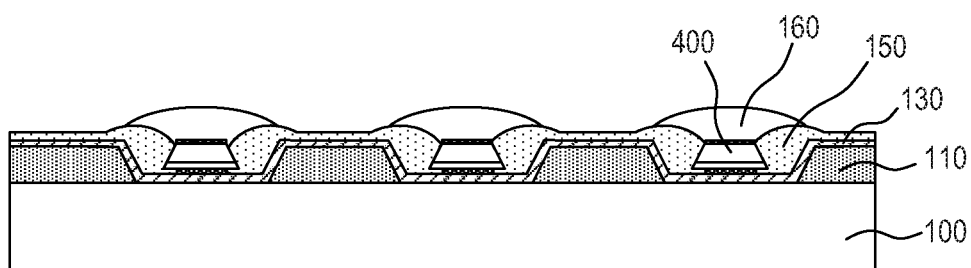
FIGS. 7A-7B are cross-sectional side view illustrations of an array of light emitting devices mounted within the reflective bank structure described with regard to FIG. 3A in accordance with embodiments of the invention.
Figure 7B:
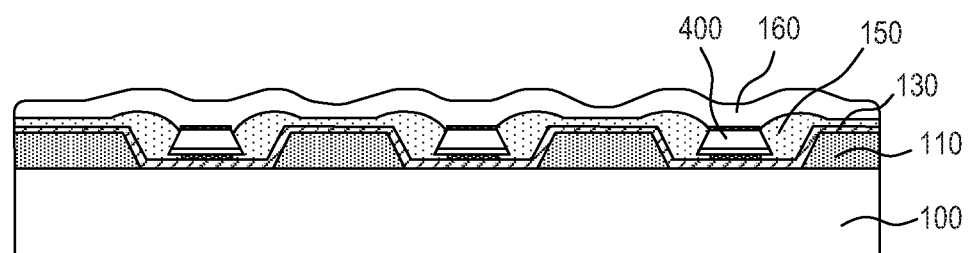

Referring now to FIGS. 7A-7B, in some embodiments, an array of light emitting devices are mounted within the reflective bank structure described with regard to FIG. 3A. In the particular embodiments illustrated, the optional transparent insulator layer 142 is not present, though it may be present in other embodiments. As illustrated, after the transfer of the array of light emitting devices 400, a sidewall passivation layer 150 may be formed around the sidewalls of the light emitting devices 400 within the array of bank openings 112. In an embodiment, where the light emitting devices are vertical LED devices, the sidewall passivation layer 150 covers and spans the quantum well structure 416. The sidewall passivation layer 150 may also be formed over the continuous reflective layer 130 on top of the patterned insulating layer 110 in order to electrically insulate the reflective layer 130 from the top conductive contact layer 160. In the embodiment illustrated in FIG. 7A, a patterned top conductive contact layer 160 is formed over each light emitting device 400 in electrical contact with the top electrode 470, if present. In the embodiment illustrated in FIG. 7B, a continuous top conductive contact layer 160 is formed over each light emitting device 400 and in electrical contact with the top electrodes 470, if present.

In accordance with embodiments of the invention, the sidewall passivation layer 150 may be transparent or semi-transparent to the visible wavelength so as to not significantly degrade light extraction efficiency of the completed system. Sidewall passivation layer may be formed of a variety of materials such as, but not limited to epoxy, poly(methyl methacrylate) (PMMA), benzocyclobutene (BCB), polyimide, and polyester. In an embodiment, sidewall passivation layer 150 is formed by ink jetting around the light emitting devices 400.

Depending upon the particular application in the following description, top conductive contact layer 160 may be opaque, reflective, transparent, or semi-transparent to the visible wavelength. For example, in top emission systems the top conductive contact may be transparent, and for bottom emission systems the top conductive contact may be reflective. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment top conductive contact layer 160 is approximately 50 nm-1 µm thick ITO-silver-ITO stack. In an embodiment, the top conductive contact layer 160 includes nanoparticles such as silver, gold, aluminum, molybdenum, titanium, tungsten, ITO, and IZO. In a particular embodiment, the top conductive contact 160 is formed by ink jetting. Other methods of formation may include chemical vapor deposition (CVD), physical vapor deposition (PVD), spin coating. The top conductive contact layer 160 may also be reflective to the visible wavelength. In an embodiment, a top conductive contact layer 160 comprises a reflective metallic film such as aluminum, molybdenum, titanium, titanium-tungsten, silver, or gold, or alloys thereof.

Figure 7C:
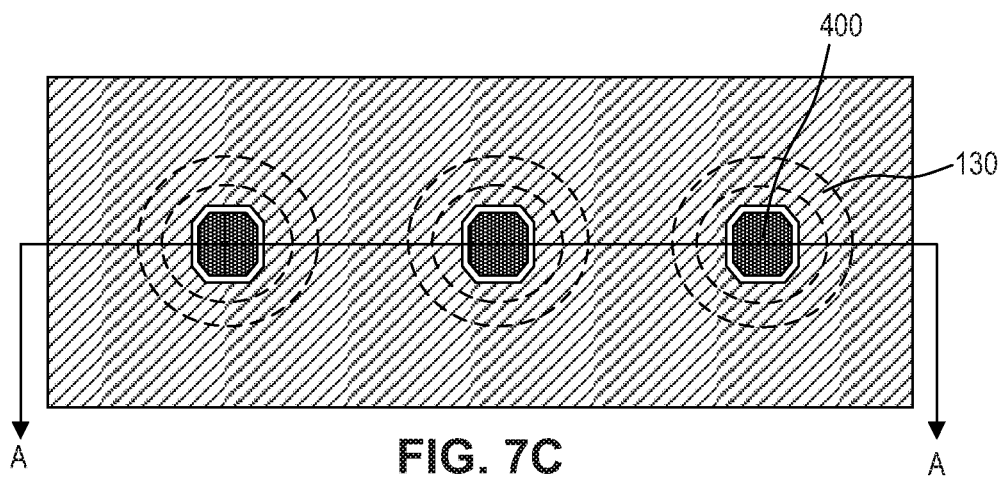
FIG. 7C is a top view illustration of FIG. 7A prior to formation of the sidewall passivation layer and top conductive contact in accordance with an embodiment of the invention.
Figure 7D:
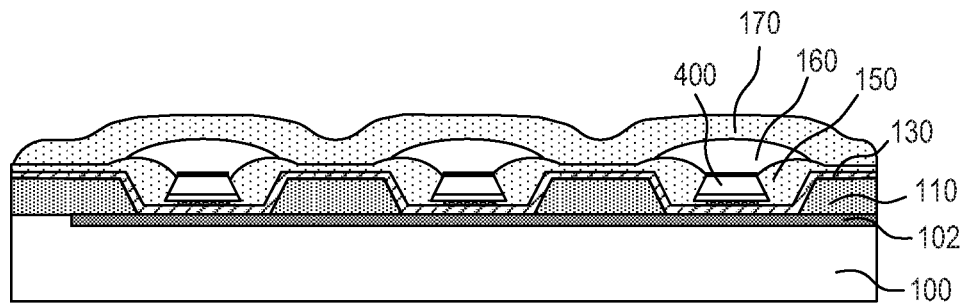
FIGS. 7D-7E are cross-sectional side view illustrations of the array of light emitting devices of FIG. 7A in electrical contact with an electrical line out of FIG. 2A in accordance with embodiments of the invention.
Figure 7E:
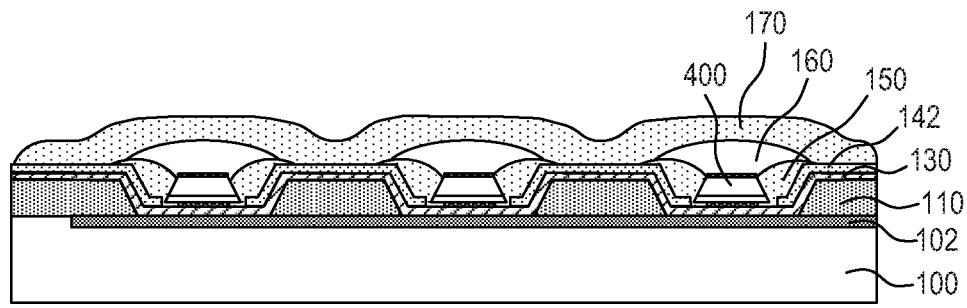

FIG. 7C is a top view illustration of FIG. 7A prior to formation of the sidewall passivation layer 150 and top conductive contact layer 160 in accordance with an embodiment of the invention. FIGS. 7D-7E are cross-sectional side view illustrations of the array of light emitting devices of FIG. 7A in electrical contact with an electrical line out of FIG. 2A in accordance with embodiments of the invention. As shown a top passivation layer 170 is formed over the array of light emitting devices of FIG. 7A. In embodiments where top conductive layer 160 is transparent, the top passivation layer 170 may also be transparent or semi-transparent so as to not degrade light extraction efficiency of the system. Top passivation layer 170 may be formed of a variety of materials such as, but not limited to, silicon oxide ($SiO_2$), silicon nitride ($SiN_x$), poly(methyl methacrylate) (PMMA), benzocyclobutene (BCB), polyimide, and polyester, and may be formed by a variety of methods including chemical vapor deposition (CVD), physical vapor deposition (PVD), spin coating. The embodiments illustrated in FIGS. 7D-7E differ in that the embodiment of FIG. 7E includes a transparent insulator layer 142, while the embodiment of FIG. 7D does not. As shown, the inclusion of the transparent insulator layer 142 may assist in electrically isolating the reflective layer 130 from the top conductive contact 160.

Figure 7F:
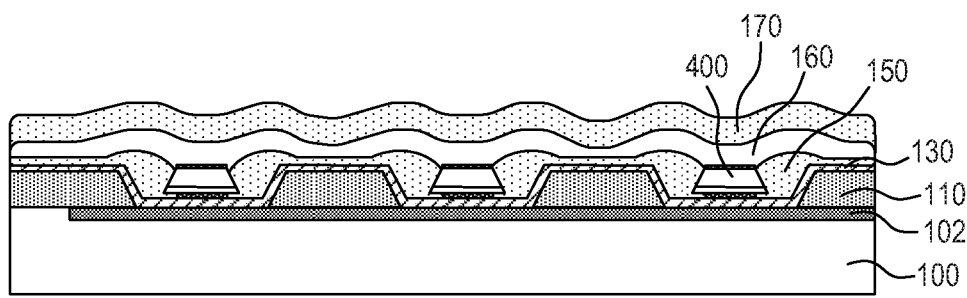
FIGS. 7F-7G are cross-sectional side view illustrations of the array of light emitting devices of FIG. 7B in electrical contact with an electrical line out of FIG. 2A in accordance with embodiments of the invention.
Figure 7G:
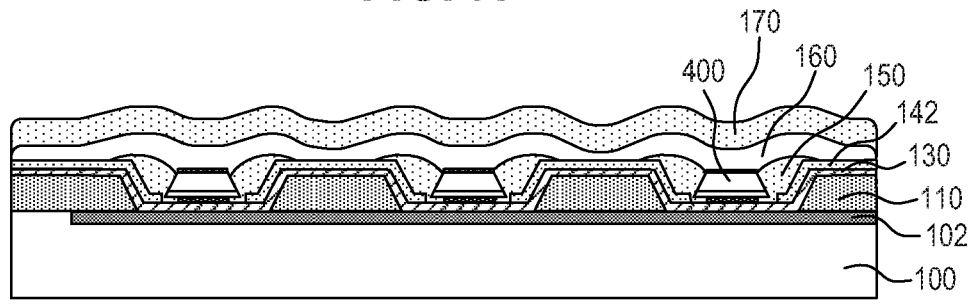

FIGS. 7F-7G are cross-sectional side view illustrations of the array of light emitting devices of FIG. 7B in electrical contact with an electrical line out of FIG. 2A in accordance with embodiments of the invention. FIGS. 7F-7G differ in that the embodiment of FIG. 7G includes a transparent insulator layer 142, while the embodiment of FIG. 7F does not. As shown, the inclusion of the transparent insulator layer 142 may assist in electrically isolating the reflective layer 130 from the top conductive contact 160.

Figure 8A:
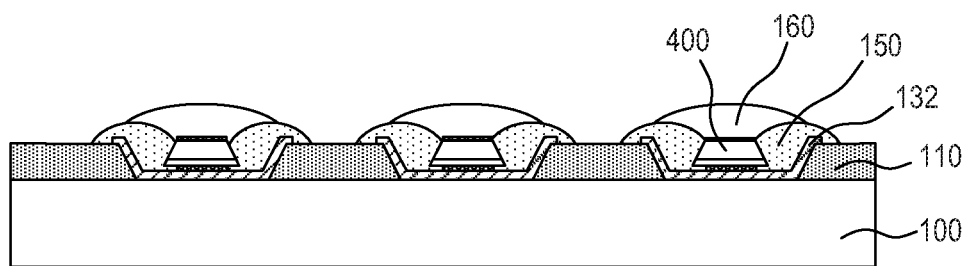
FIGS. 8A-8B are cross-sectional side view illustrations of an array of light emitting devices mounted within the reflective bank structure described with regard to FIG. 3B in accordance with embodiments of the invention.
Figure 8B:
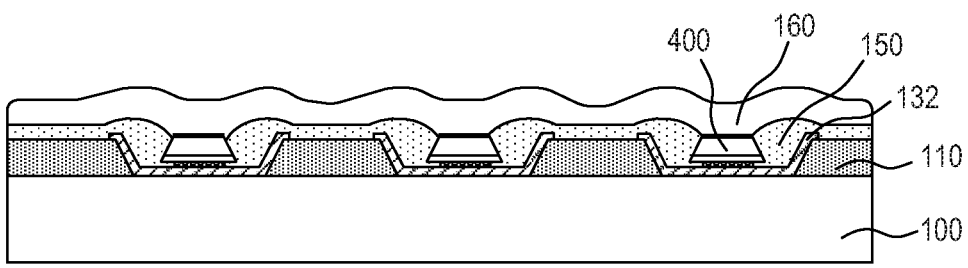

Referring now to FIGS. 8A-8B, in some embodiments an array of light emitting devices are mounted within the reflective bank structure described with regard to FIG. 3B with or without the optional transparent insulator layer 142. As illustrated, after the transfer of the array of light emitting devices 400, a sidewall passivation layer 150 may be formed around the sidewalls of the light emitting devices 400 within the array of bank openings 112 similarly as described with regard to FIGS. 7A-7B. In the embodiment illustrated in FIG. 8A, a patterned top conductive contact layer 160 is formed over each light emitting device 400 in electrical contact with the top electrode 470, if present. In the embodiment illustrated in FIG. 8B, a continuous top conductive contact layer 160 is formed over each light emitting device 400 and in electrical contact with the top electrodes 470, if present.

Figure 8C:
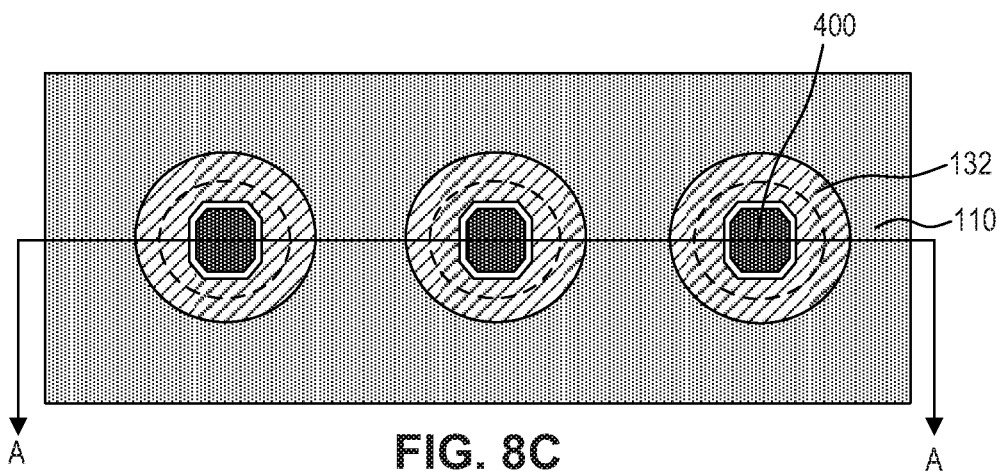
FIG. 8C is a top view illustration of FIG. 8A prior to formation of the sidewall passivation layer and top conductive contact in accordance with an embodiment of the invention.
Figure 8D:
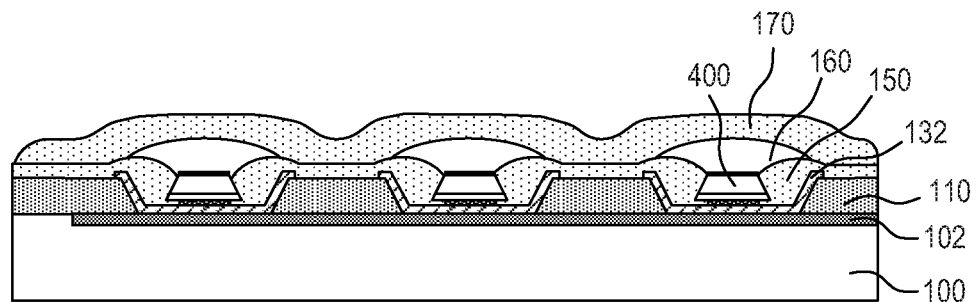
FIGS. 8D-8E are cross-sectional side view illustrations of the array of light emitting devices of FIG. 8A in electrical contact with an electrical line out of FIG. 2A in accordance with embodiments of the invention.
Figure 8E:
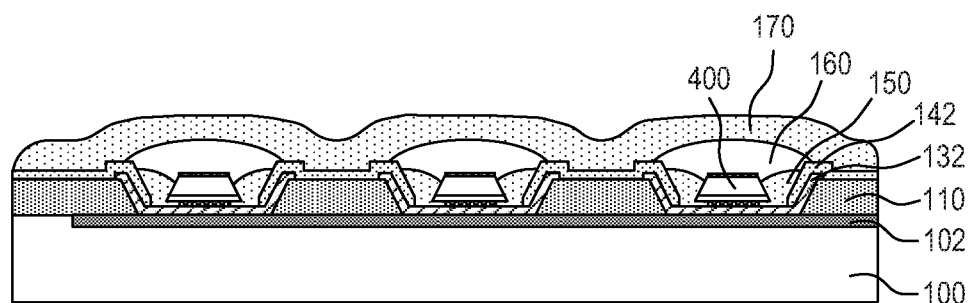

FIG. 8C is a top view illustration of FIG. 8A prior to formation of the sidewall passivation layer 150 and top conductive contact layer 160 in accordance with an embodiment of the invention. FIGS. 8D-8E are cross-sectional side view illustrations of the array of light emitting devices of FIG. 8A in electrical contact with an electrical line out of FIG. 2A in accordance with embodiments of the invention. In another embodiment, the electrical line out of FIG. 2B may be incorporated. As shown a top passivation layer 170 is formed over the array of light emitting devices of FIG. 8A. The embodiments illustrated in FIGS. 8D-8E differ in that the embodiment of FIG. 8E includes a transparent insulator layer 142, while the embodiment of FIG. 8D does not. As shown, the inclusion of the transparent insulator layer 142 may assist in electrically isolating the reflective bank layers 132 from the top conductive contact 160.

Figure 8F:
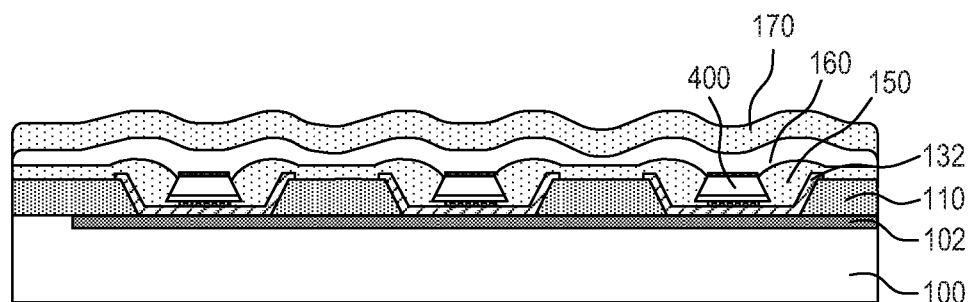
FIGS. 8F-8G are cross-sectional side view illustrations of the array of light emitting devices of FIG. 8B in electrical contact with an electrical line out of FIG. 2A in accordance with embodiments of the invention.
Figure 8G:
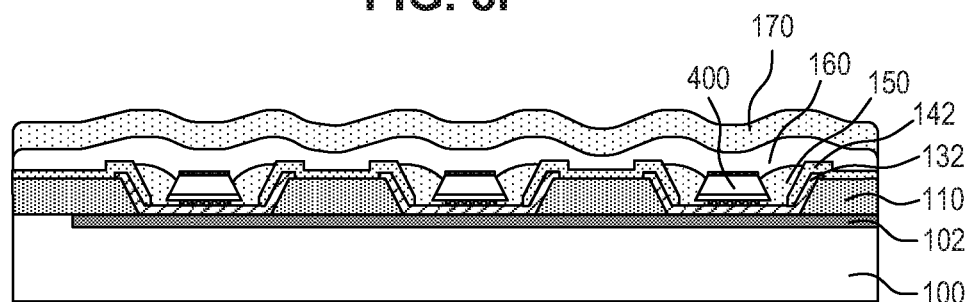

FIGS. 8F-8G are cross-sectional side view illustrations of the array of light emitting devices of FIG. 8B in electrical contact with an electrical line out of FIG. 2A in accordance with embodiments of the invention. In another embodiment, the electrical line out of FIG. 2B may be incorporated. FIGS. 8F-8G differ in that the embodiment of FIG. 8G includes a transparent insulator layer 142, while the embodiment of FIG. 8F does not. As shown, the inclusion of the transparent insulator layer 142 may assist in electrically isolating the reflective bank layers 132 from the top conductive contact 160.

Figure 9A:
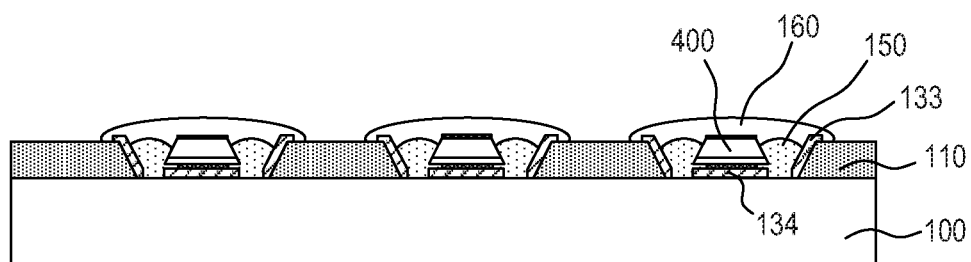
FIGS. 9A-9B are cross-sectional side view illustrations of an array of light emitting devices mounted within the reflective bank structure described with regard to FIG. 3D in accordance with embodiments of the invention.
Figure 9B:
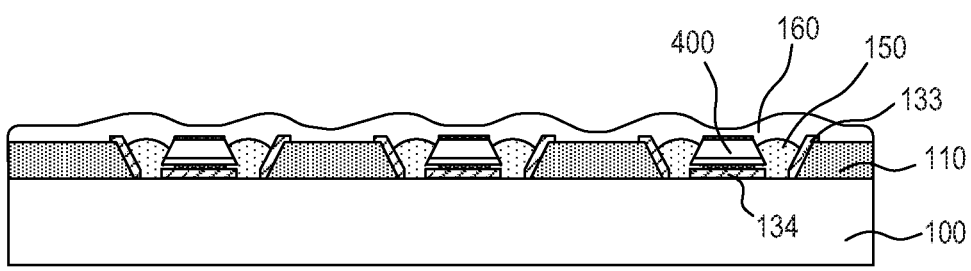

Referring now to FIGS. 9A-9B, in some embodiments an array of light emitting devices are mounted within the reflective bank structure described with regard to FIG. 3D. As illustrated, after the transfer of the array of light emitting devices 400, a sidewall passivation layer 150 may be formed around the sidewalls of the light emitting devices 400 within the array of bank openings 112 similarly as described with regard to FIGS. 7A-7B. As shown the pad layer 134 is electrically isolated from the sidewall layer 133. In the embodiment illustrated in FIG. 9A, a patterned top conductive contact layer 160 is formed over each light emitting device 400 in electrical contact with the top electrode 470, if present, and reflective sidewall layer 133. In the embodiment illustrated in FIG. 9B, a continuous top conductive contact layer 160 is formed over each light emitting device 400 and in electrical contact with the top electrodes 470, if present, and reflective sidewall layer 133.

Figure 9C:
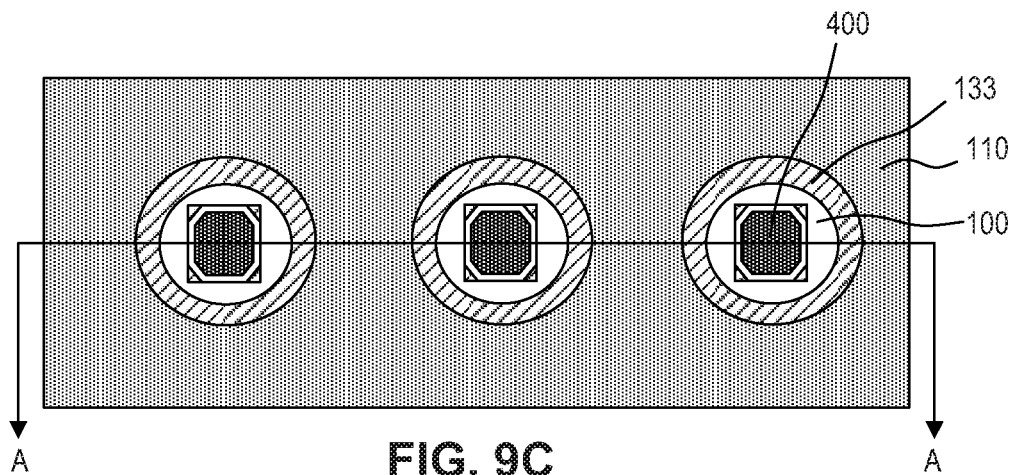
FIG. 9C is a top view illustration of FIG. 9A prior to formation of the sidewall passivation layer and top conductive contact in accordance with an embodiment of the invention.
Figure 9D:
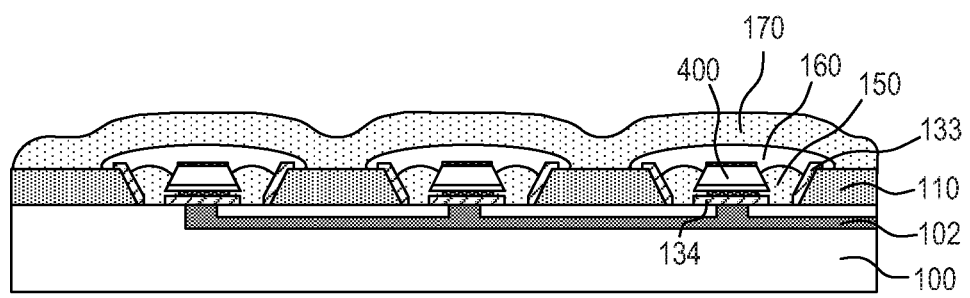
FIG. 9D is a cross-sectional side view illustration of the array of light emitting devices of FIG. 9A in electrical contact with an electrical line out of FIG. 2B in accordance with an embodiment of the invention.
Figure 9E:
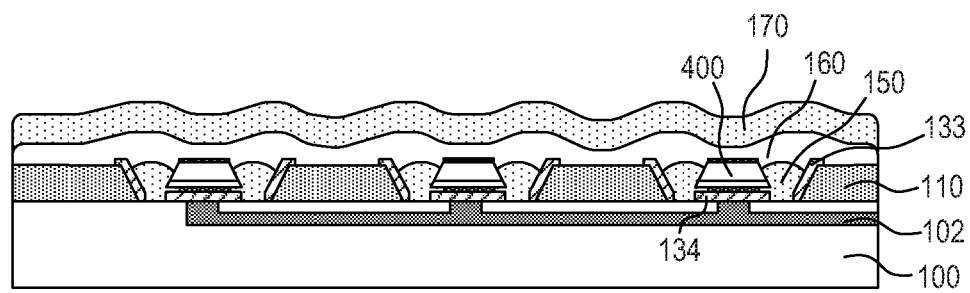
FIG. 9E is a cross-sectional side view illustration of the array of light emitting devices of FIG. 9B in electrical contact with an electrical line out of FIG. 2B in accordance with an embodiment of the invention.

FIG. 9C is a top view illustration of FIG. 9A prior to formation of the sidewall passivation layer 150 and top conductive contact layer 160 in accordance with an embodiment of the invention. FIGS. 9D-9E are cross-sectional side view illustrations of the array of light emitting devices of FIG. 9A in electrical contact with an electrical line out of FIG. 2B in accordance with embodiments of the invention. As shown a top passivation layer 170 is formed over the array of light emitting devices of FIG. 9A. The embodiments illustrated in FIGS. 9D-9E differ in that the embodiment of FIG. 9E includes a transparent insulator layer 142, while the embodiment of FIG. 9D does not. As shown, the inclusion of the transparent insulator layer 142 may assist in electrically isolating the reflective bank layers 132 from the top conductive contact 160.

In the following embodiments described with regard to any of FIGS. 10A-15G, one or more reflective via layers 138 may be described and illustrated. In accordance with embodiments of the invention, the reflective via layers 138 may function as an electrical line out or connect with an electrical line out. Reflective via layers 138 may also be replaced with other electrically conducting materials. In other embodiments, vias are not formed in the insulating layer 110, and the reflective via layers 138 are replaced by electrical lines out 139, as illustrated in FIGS. 14F-14G, 15F-15G. Accordingly, in any of the following embodiments the reflective via layers 138 may function as an electrical line out, connect with an electrical line out, be replaced with other electrically conducting materials, or be replaced by electrical lines out 139.

Figure 10A:
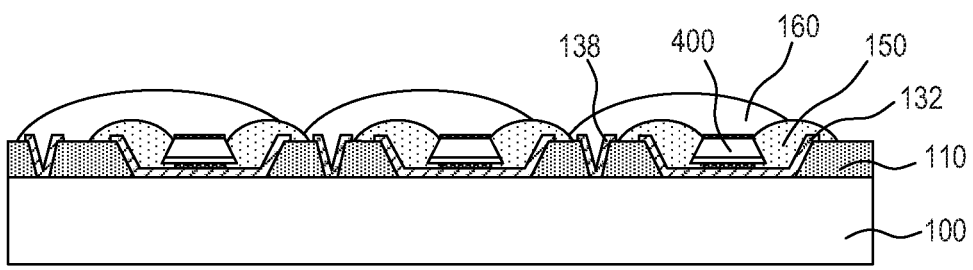
FIGS. 10A-10B are cross-sectional side view illustrations of an array of light emitting devices mounted within the reflective bank structure described with regard to FIG. 3F in accordance with embodiments of the invention.
Figure 10B:
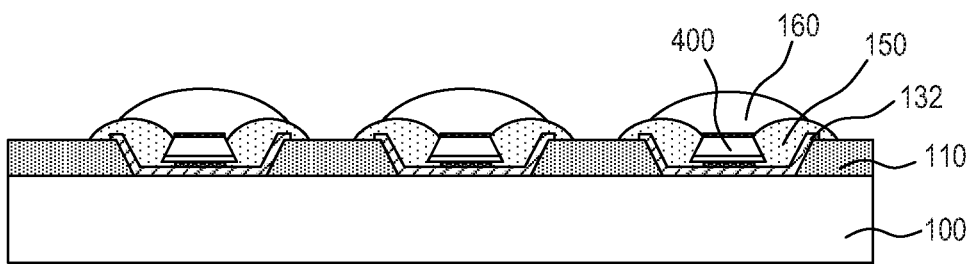
Figure 10C:
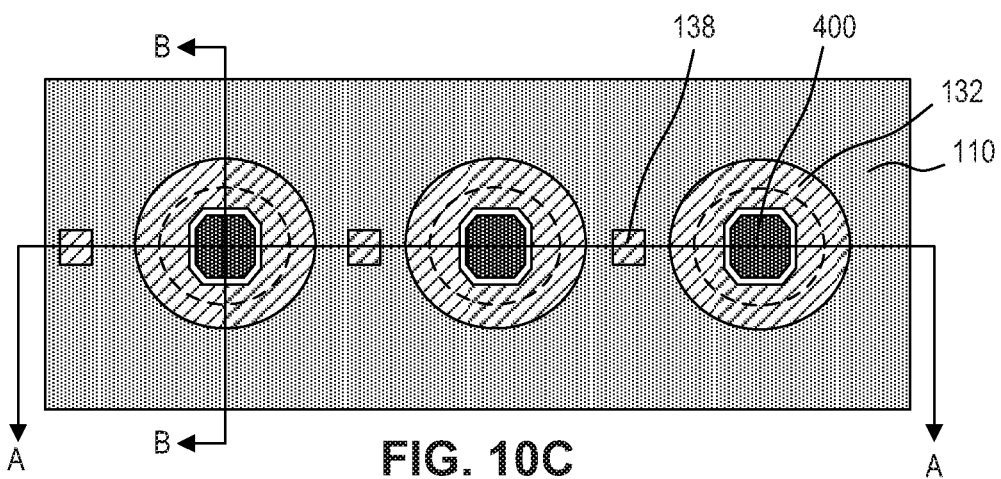
FIG. 10C is a top view illustration of FIG. 10A prior to formation of the sidewall passivation layer and top conductive contact in accordance with an embodiment of the invention.
Figure 10D:
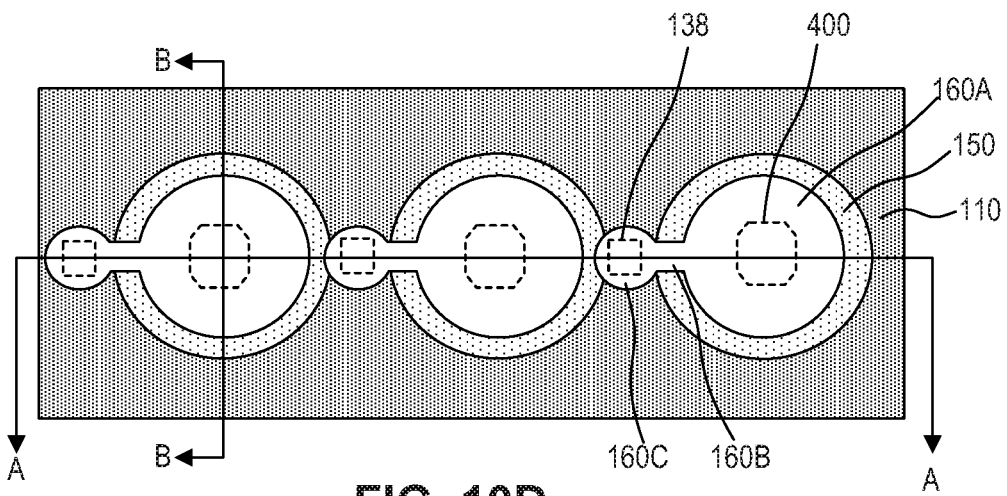
FIG. 10D is a top view illustration of FIG. 10A after formation of the sidewall passivation layer and top conductive contact in accordance with an embodiment of the invention.

Referring now to FIGS. 10A-10B, in some embodiments an array of light emitting devices are mounted within the reflective bank structure described with regard to FIG. 3F. As illustrated, after the transfer of the array of light emitting devices 400, a sidewall passivation layer 150 may be formed around the sidewalls of the light emitting devices 400 within the array of bank openings 112 similarly as described with regard to FIGS. 7A-7B. In the embodiment illustrated in FIGS. 10A-10B, a patterned top conductive contact layer 160 is formed over each light emitting device 400 in electrical contact with the top electrode 470, if present, and within via openings 118 and in contact with reflective via layers 138, if present. FIG. 10C is a top view illustration of FIGS. 10A-10B prior to formation of the sidewall passivation layer 150 and top conductive contact layer 160 in accordance with an embodiment of the invention. FIG. 10D is a top view illustration of FIGS. 10A-10B after formation of the sidewall passivation layer 150 and top conductive contact layer 160 in accordance with an embodiment of the invention. As shown, FIG. 10A is a side view illustration taken along lines A-A in FIG. 10C-10D, and FIG. 10B is a side view illustration taken along lines B-B in FIG. 10C-10D.

Figure 10E:
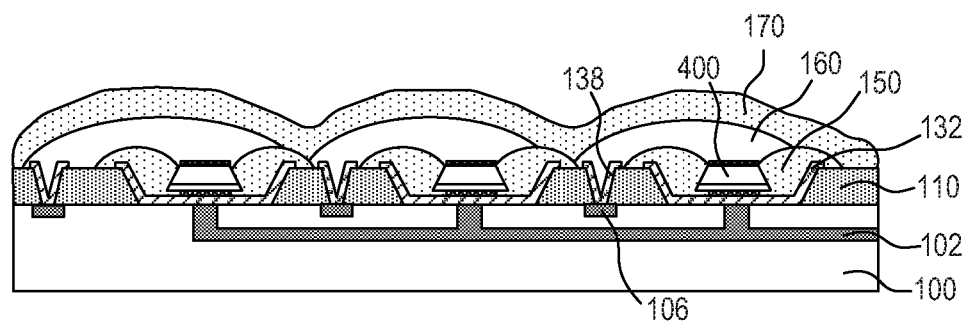
FIGS. 10E-10F are cross-sectional side view illustrations of the array of light emitting devices of FIG. 10A in electrical contact with an electrical line out of FIG. 2C in accordance with embodiments of the invention.
Figure 10F:
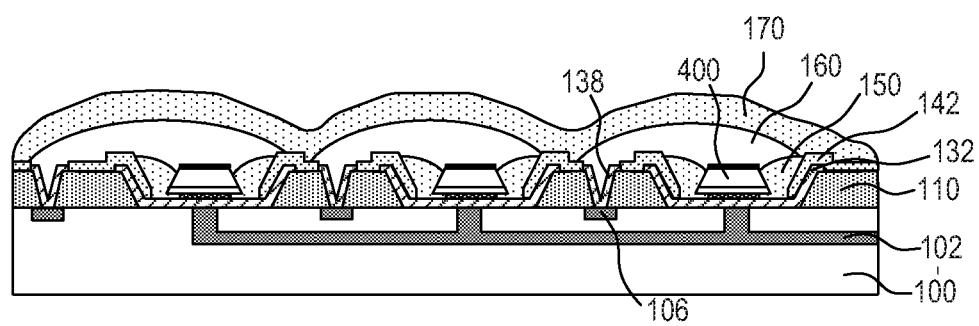

Referring again to FIG. 10D, top conductive contact layer 160 may include portions 160A formed over the light emitting device 400 and reflective bank layer 132, portions 160C formed over the via openings 118 and in contact with the reflective via layer 138, if present, and a trace portion 160B extending between portions 160A and 160C. Referring now to FIGS. 10E-10F, in an embodiment, the top electrodes of the array of light emitting devices 400 are in electrical contact with electrical lines out 106 of FIG. 2C with the top conductive contact layer 160. The embodiments illustrated in FIGS. 10D-10F differ in that the embodiment of FIG. 10F includes a transparent insulator layer 142, while the embodiment of FIG. 10E does not. In the embodiments illustrated, each top conductive contact layer 160 is electrically separated from an adjacent top conductive contact layer, so that an array of top conductive contact layers 160 correspond to an array of light emitting devices 400. In this manner, the resistance of the top conductive contact layer 160 can be reduced by minimizing length and area, and the electrical lines out 102, 106 can be formed of a material with lower resistivity than the top conductive contact layer 160. For example, top conductive layer 160 may be formed of ink jet PEDOT, with the electrical lines out 102, 106 being formed of lower resistivity copper. In this manner, the top conductive contact layer 160 may span a comparatively shorter distance than electrical line out 106, resulting in a total signal line with lower resistance. In the particular embodiments illustrated, the patterned transparent insulator 142 is illustrated as being formed over and between layers 132, 138. However, the patterned transparent insulator layer 142 may assume other patterns. For example, in some embodiments the patterned transparent insulator layer 142 is not formed between a reflective via layer 138 and a corresponding reflective bank layer 132 since the top conductive contact layer 160 makes electrical contact to reflective via layer 138. Such a configuration may be employed in any of the following embodiments (e.g. 10H, 10J, 11F, 11H, 11I, 11J, 12F, 12H, 12J, 13G, 13I, 13K, 13M, 14C-14G, 15C-15G) illustrating an optional patterned transparent insulator layer 142.

Many of the embodiments that follow are illustrated and described with a top conductive contact layer 160 being in contact with a reflective via layer 138. It is to be appreciated however, that the reflective via layer 138 is optional. The reflective via layer 138 may be replaced with a non-reflective conductive material. Alternatively, the top conductive contact layer 160 may be formed within the via openings 118 and make contact with an electrical line out 106.

Figure 10G:
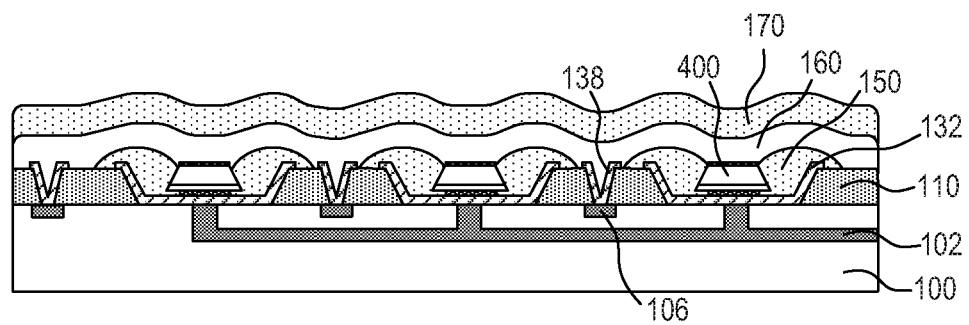
FIGS. 10G-10H are cross-sectional side view illustrations of an array of light emitting devices mounted within the reflective bank structure described with regard to FIG. 3F in electrical contact with an electrical line out of FIG. 2C in accordance with embodiments of the invention.
Figure 10H:
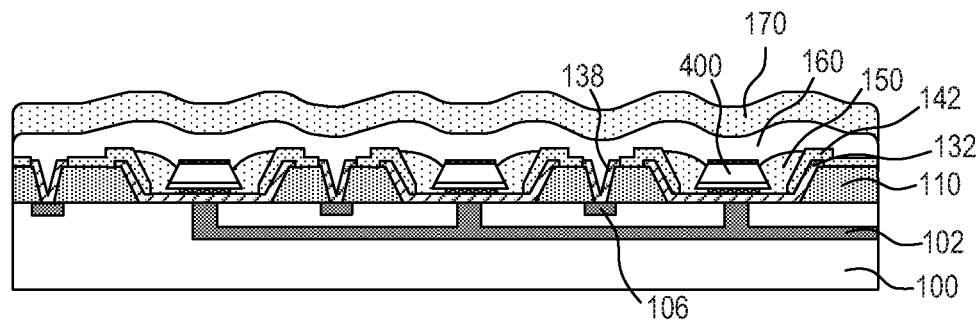

Referring now to FIGS. 10G-10H, in an embodiment, a continuous top conductive contact layer 160 is formed over each light emitting device 400 and in electrical contact with the top electrodes 470, if present, and an electrical line out 106 of FIG. 2C. As illustrated, the continuous top conductive contact layer 160 is in electrical communication with an array of light emitting devices 400 and a single electrical line out 106. The embodiments illustrated in FIGS. 10G-10H differ in that the embodiment of FIG. 10H includes a transparent insulator layer 142, while the embodiment of FIG. 10G does not. As shown, the inclusion of the transparent insulator layer 142 may assist in electrically isolating the reflective bank layers 132 from the top conductive contact 160.

Figure 10I:
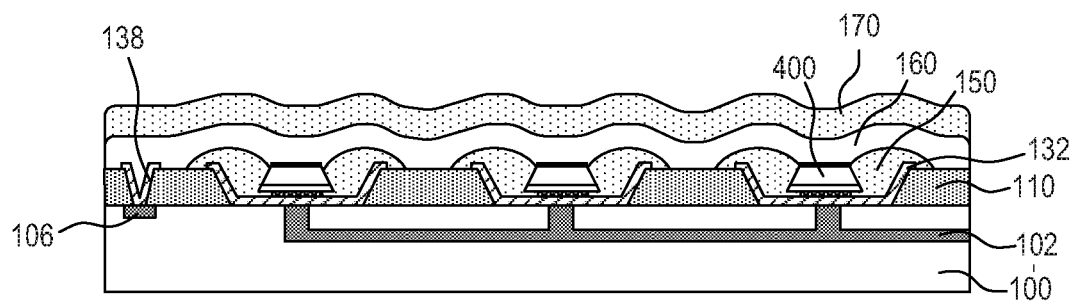
FIGS. 10I-10J are cross-sectional side view illustrations of an array of light emitting devices mounted within the reflective bank structure described with regard to FIG. 3G in electrical contact with an electrical line out of FIG. 2D in accordance with embodiments of the invention.
Figure 10J:
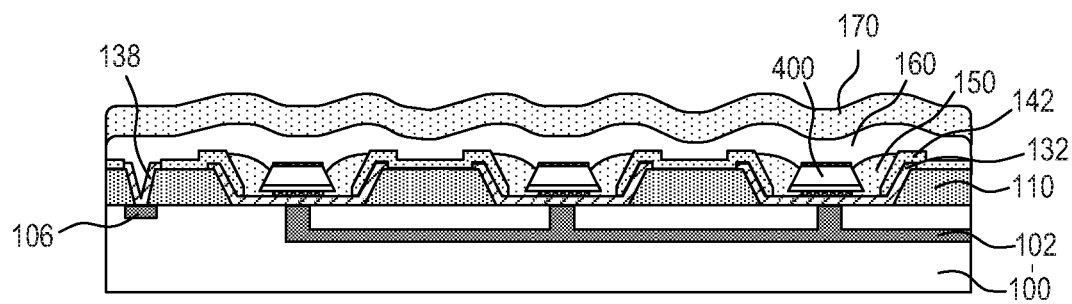

Referring now to FIGS. 10I-10J, in an embodiment, a continuous top conductive contact layer 160 is formed over each light emitting device 400 and in electrical contact with the top electrodes 470, if present, and an electrical line out 106 of FIG. 2D. As illustrated, the continuous top conductive contact layer 160 is in electrical communication with an array of light emitting devices 400 and a single electrical line out 106. The embodiments illustrated in FIGS. 10I-10J differ in that the embodiment of FIG. 10J includes a transparent insulator layer 142, while the embodiment of FIG. 10I does not. As shown, the inclusion of the transparent insulator layer 142 may assist in electrically isolating the reflective bank layers 132 from the top conductive contact 160.

Figure 11A:
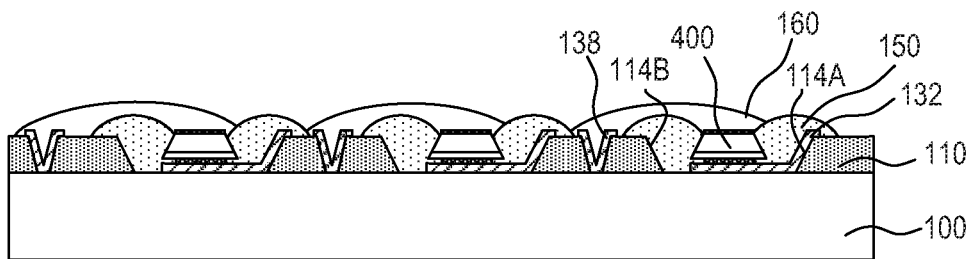
FIGS. 11A-11B are cross-sectional side view illustrations of an array of light emitting devices mounted within the reflective bank structure described with regard to FIG. 3H in accordance with embodiments of the invention.
Figure 11B:
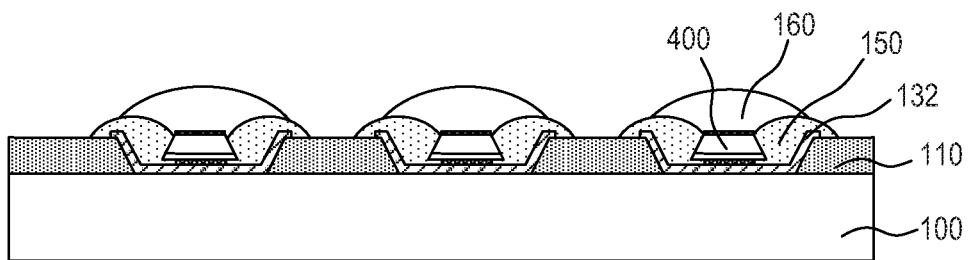
Figure 11C:
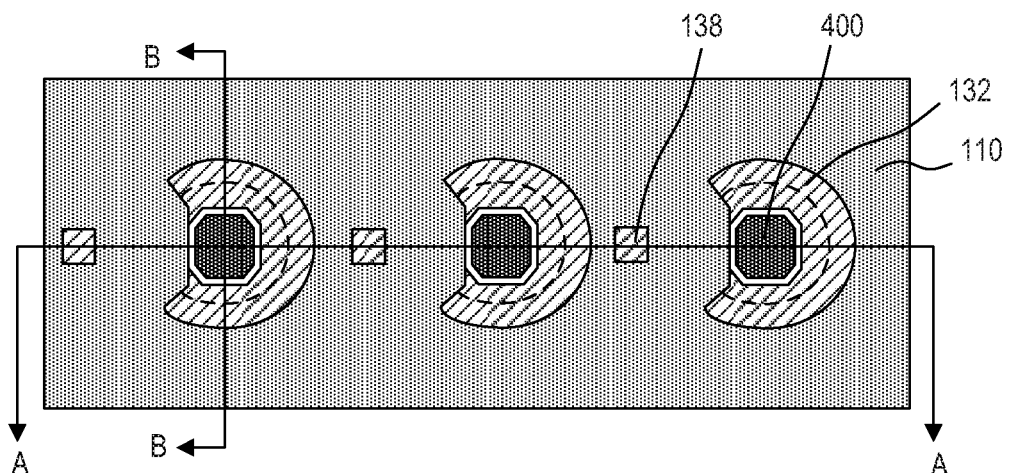
FIG. 11C is a top view illustration of FIG. 11A prior to formation of the sidewall passivation layer and top conductive contact in accordance with an embodiment of the invention.
Figure 11D:
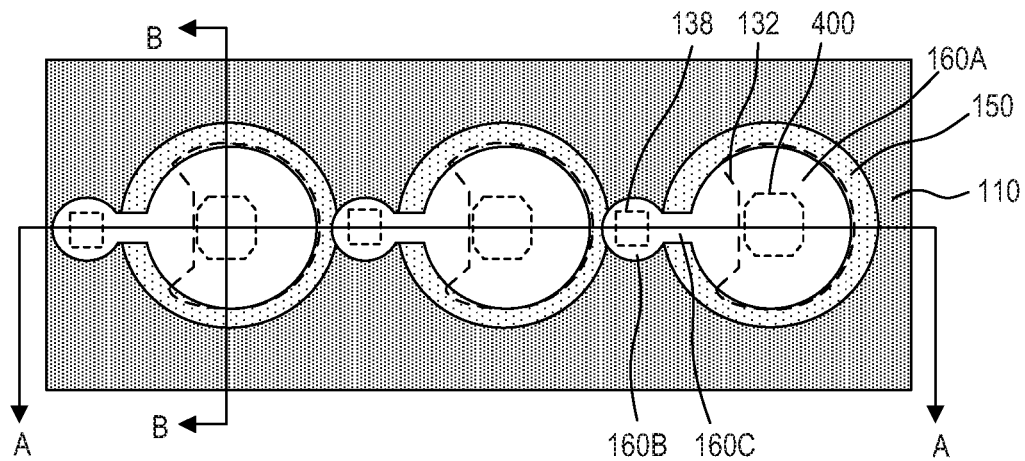
FIG. 11D is a top view illustration of FIG. 11A after formation of the sidewall passivation layer and top conductive contact in accordance with an embodiment of the invention.

Referring now to FIGS. 11A-11B, in some embodiments, an array of light emitting devices are mounted within the reflective bank structure described with regard to FIG. 3H. The embodiments illustrated in FIGS. 11A-11B are similar to those of FIGS. 10A-10B, with the exception of the reflective bank layer 132 does not completely cover the sidewalls of the bank opening 112. As shown in FIG. 11A, the reflective bank layer 132 is formed on sidewall 144A, and is not formed along sidewall 114B nearest a corresponding via opening 118. FIG. 11C is a top view illustration of FIG. 11A prior to formation of the sidewall passivation layer and top conductive contact in accordance with an embodiment of the invention. FIG. 11D is a top view illustration of FIG. 11A after formation of the sidewall passivation layer and top conductive contact in accordance with an embodiment of the invention. As shown, FIG. 11A is a side view illustration taken along lines A-A in FIG. 11C-11D, and FIG. 11B is a side view illustration taken along lines B-B in FIG. 11C-11D.

Referring now to FIGS. 11C-11D, in an embodiment, the reflective bank layer 132 does not completely cover the sidewalls of the bank opening. Top conductive contact layer 160 may include portions 160A formed over the light emitting device 400 and reflective bank layer 132, portions 160C formed over the via openings 118 and in contact with the reflective via layer 138, if present, and a trace portion 160B extending between portions 160A and 160C. In the embodiment illustrated, the reflective bank layer 132 is not formed on the sidewall of the bank opening 112 nearest the via opening 118. In such an embodiment, this may relieve patterning tolerances to avoid potential shorting between the reflective bank layer 132 and top conductive contact layer 160 spanning between the via opening 118 and bank opening 112.

Figure 11E:
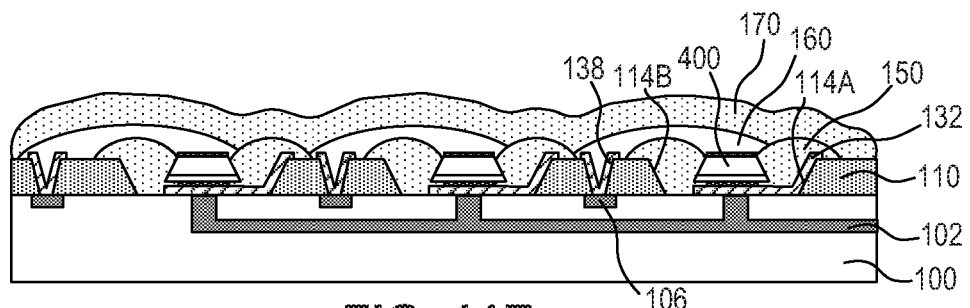
FIGS. 11E-11F are cross-sectional side view illustrations of the array of light emitting devices of FIG. 11A in electrical contact with an electrical line out of FIG. 2C in accordance with embodiments of the invention.
Figure 11F:
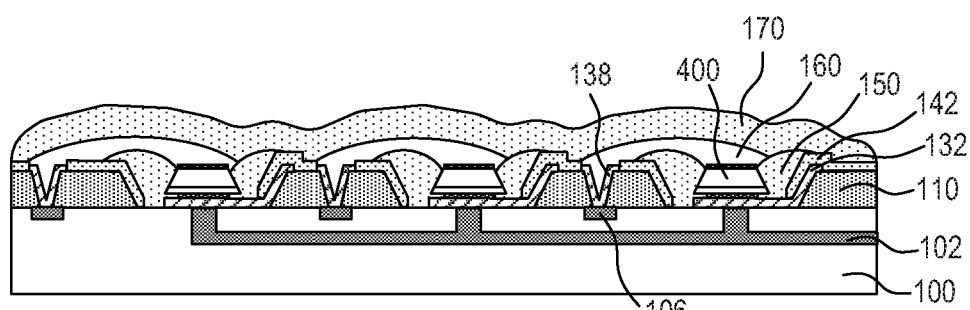

FIGS. 11E-11F are cross-sectional side view illustrations of the array of light emitting devices of FIG. 11A in electrical contact with an electrical line out of FIG. 2C in accordance with embodiments of the invention. The embodiments illustrated in FIGS. 11E-11F differ in that the embodiment of FIG. 11F includes a transparent insulator layer 142, while the embodiment of FIG. 11E does not. In the embodiments illustrated, each top conductive contact layer 160 is electrically separated from an adjacent top conductive contact layer, so that an array of top conductive contact layers 160 correspond to an array of light emitting devices 400. In this manner, the resistance of the top conductive contact layer 160 can be reduced by minimizing length and area, and the electrical lines out 102, 106 can be formed of a material with lower resistivity than the top conductive contact layer 160.

Figure 11G:
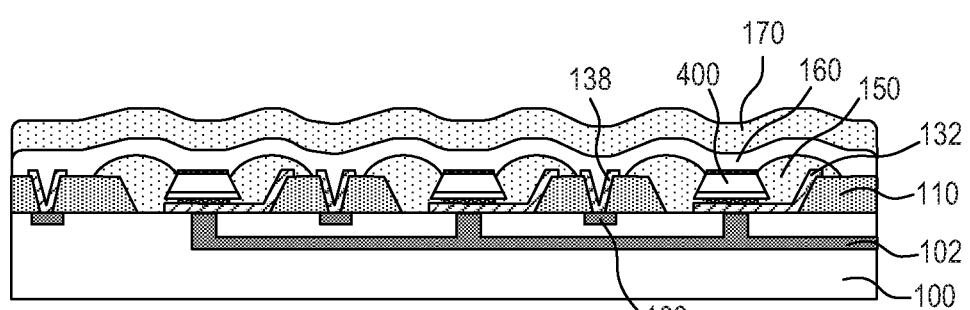
FIGS. 11G-11H are cross-sectional side view illustrations of an array of light emitting devices mounted within the reflective bank structure described with regard to FIG. 3H in electrical contact with an electrical line out of FIG. 2C in accordance with embodiments of the invention.
Figure 11H:
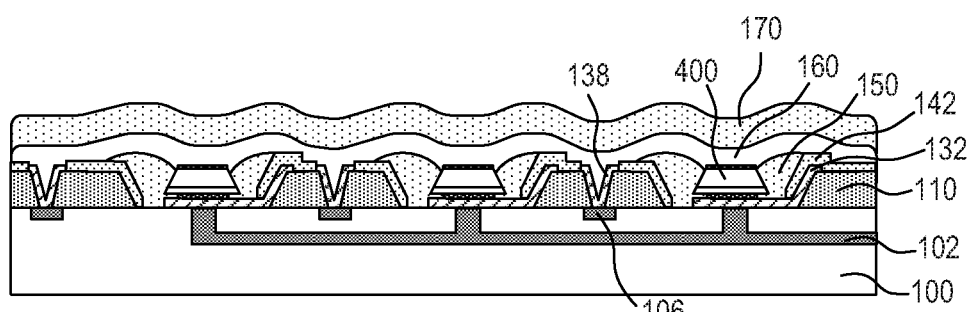

Referring now to FIGS. 11G-11H, in an embodiment, a continuous top conductive contact layer 160 is formed over each light emitting device 400 and in electrical contact with the top electrodes 470, if present, and an electrical line out 106 of FIG. 2C. As illustrated, the continuous top conductive contact layer 160 is in electrical communication with an array of light emitting devices 400 and a single electrical line out 106. The embodiments illustrated in FIGS. 11G-11H differ in that the embodiment of FIG. 11H includes a transparent insulator layer 142, while the embodiment of FIG. 11G does not. As shown, the inclusion of the transparent insulator layer 142 may assist in electrically isolating the reflective bank layers 132 from the top conductive contact 160.

Figure 11I:
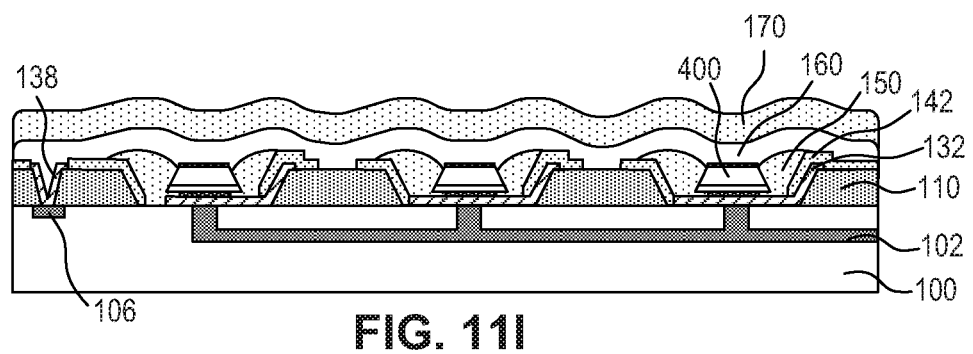
FIGS. 11I-11J are cross-sectional side view illustrations of an array of light emitting devices mounted within the reflective bank structure described with regard to FIG. 3I in electrical contact with an electrical line out of FIG. 2D in accordance with embodiments of the invention.
Figure 11J:
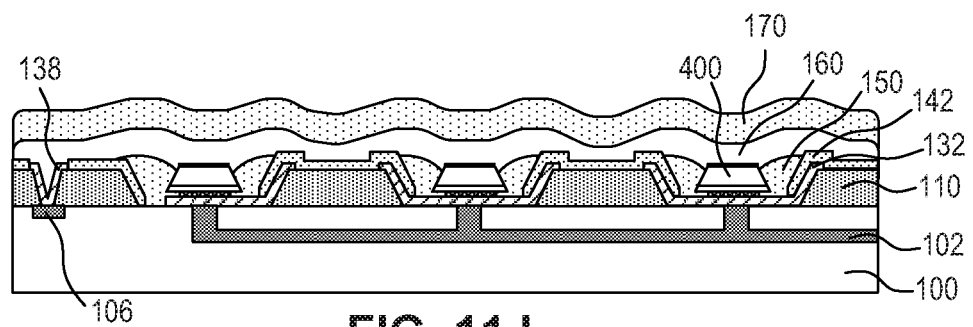

Referring now to FIGS. 11I-11J, in an embodiment, a continuous top conductive contact layer 160 is formed over each light emitting device 400 and in electrical contact with the top electrodes 470, if present, and an electrical line out 106 of FIG. 2D. As illustrated, the continuous top conductive contact layer 160 is in electrical communication with an array of light emitting devices 400 and a single electrical line out 106. The embodiments illustrated in FIGS. 11I-11J differ in that the embodiment of FIG. 11J includes a transparent insulator layer 142, while the embodiment of FIG. 11I does not. As shown, the inclusion of the transparent insulator layer 142 may assist in electrically isolating the reflective bank layers 132 from the top conductive contact 160.

Figure 12A:
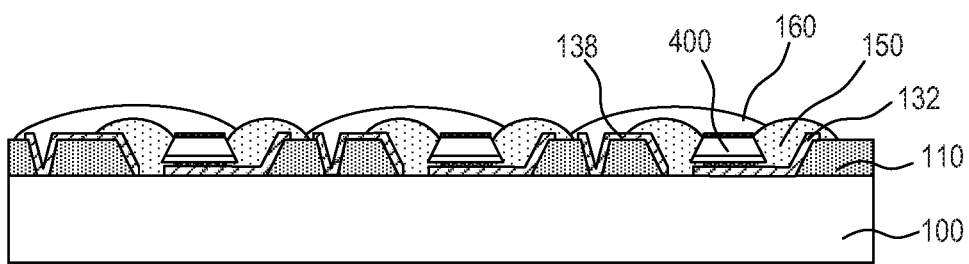
FIGS. 12A-12B are cross-sectional side view illustrations of an array of light emitting devices mounted within the reflective bank structure described with regard to FIG. 3J in accordance with embodiments of the invention.
Figure 12B:
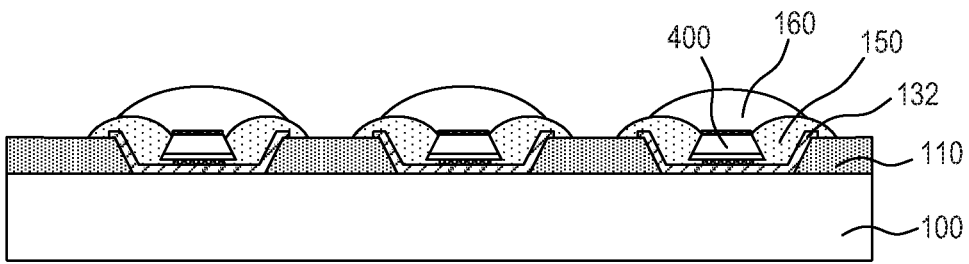
Figure 12C:
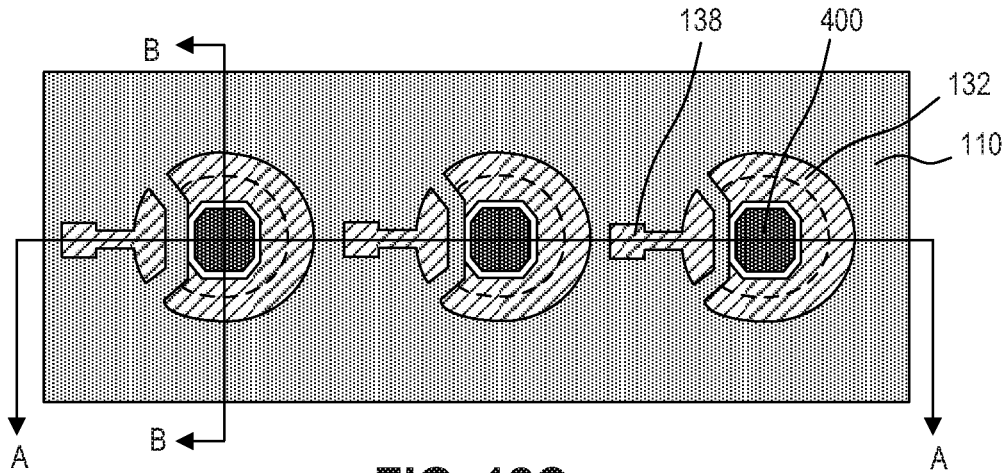
FIG. 12C is a top view illustration of FIG. 12A prior to formation of the sidewall passivation layer and top conductive contact in accordance with an embodiment of the invention.
Figure 12D:
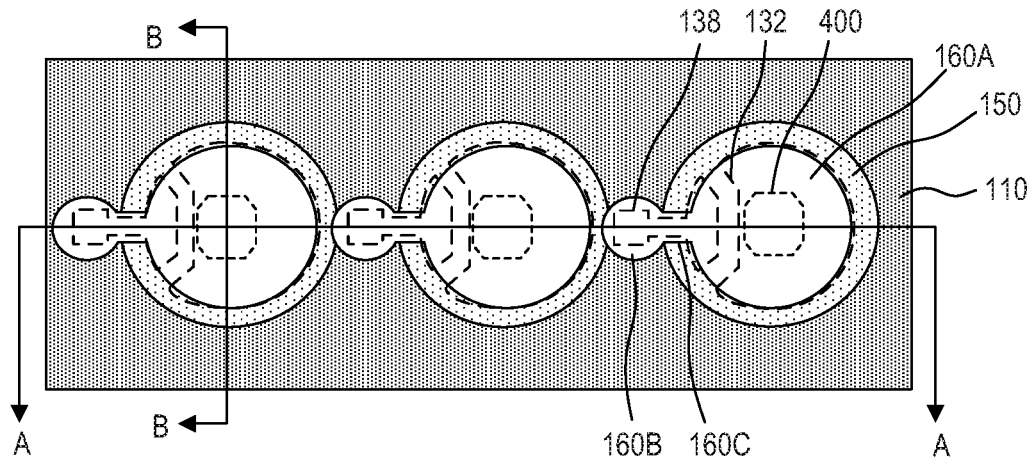
FIG. 12D is a top view illustration of FIG. 12A after formation of the sidewall passivation layer and top conductive contact in accordance with an embodiment of the invention.

Referring now to FIGS. 12A-12B, in some embodiments, an array of light emitting devices are mounted within the reflective bank structure described with regard to FIG. 3J. The embodiments illustrated in FIGS. 12A-12B are similar to those of FIGS. 10A-10B, with the exception of the reflective bank layer 132 does not completely cover the sidewalls of the bank opening 112, and the reflective via layer 138 covers a sidewall of the bank opening 112. As shown in FIG. 11A, the reflective bank layer 132 is formed on sidewall 144A, and reflective via layer 138 covers sidewall 114B nearest a corresponding via opening 118. FIG. 12C is a top view illustration of FIG. 12A prior to formation of the sidewall passivation layer and top conductive contact in accordance with an embodiment of the invention. FIG. 12D is a top view illustration of FIG. 12A after formation of the sidewall passivation layer and top conductive contact in accordance with an embodiment of the invention. As shown, FIG. 12A is a side view illustration taken along lines A-A in FIG. 12C-12D, and FIG. 12B is a side view illustration taken along lines B-B in FIG. 12C-12D.

Referring now to FIGS. 12C-12D, in an embodiment, the reflective bank layer 132 does not completely cover the sidewalls of the bank opening, and the reflective via layer 138 covers a sidewall of the bank opening 112. In the embodiment illustrated, the reflective bank layer 132 and reflective via layer 138 are electrically isolated from one another. Top conductive contact layer 160 may include portions 160A formed over the light emitting device 400, portions 160C formed over the via openings 118 and in contact with the reflective via layer 138 and a trace portion 160B extending between portions 160A and 160C. In the embodiment illustrated, the reflective via layer 138 is formed on the sidewall of the bank opening 112 nearest the via opening 118. In an embodiment, such configuration may allow for reduced length of the top conductive layer. While the top conductive layers 160 are illustrated as completely extending over the via openings 118, this may not be required. In another embodiment, the top conductive layer 160 may only contact the reflective via layer 138 on top of the patterned insulating layer 110.

Figure 12E:
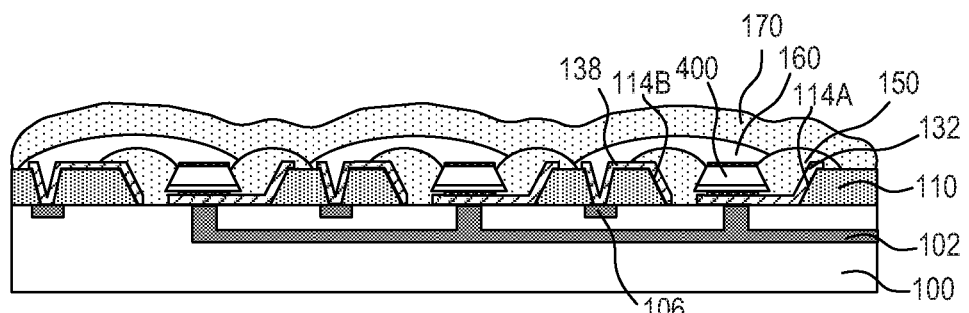
FIGS. 12E-12F are cross-sectional side view illustrations of the array of light emitting devices of FIG. 12A in electrical contact with an electrical line out of FIG. 2C in accordance with embodiments of the invention.
Figure 12F:
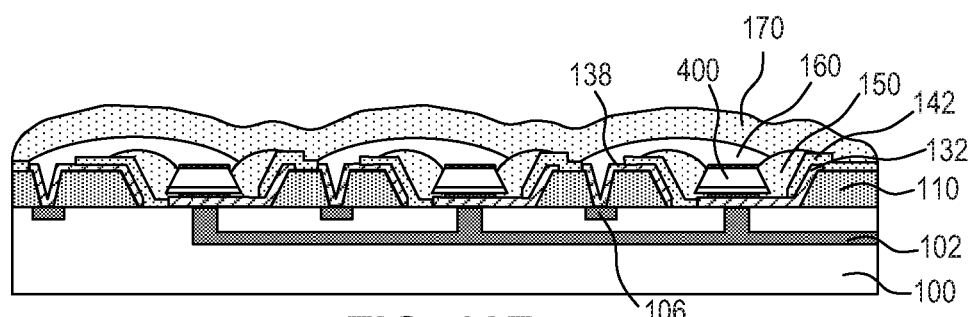

FIGS. 12E-12F are cross-sectional side view illustrations of the array of light emitting devices of FIG. 12A in electrical contact with an electrical line out of FIG. 2C in accordance with embodiments of the invention. The embodiments illustrated in FIGS. 12E-12F differ in that the embodiment of FIG. 12F includes a transparent insulator layer 142, while the embodiment of FIG. 12E does not. In the embodiments illustrated, each top conductive contact layer 160 is electrically separated from an adjacent top conductive contact layer, so that an array of top conductive contact layers 160 correspond to an array of light emitting devices 400. In this manner, the resistance of the top conductive contact layer 160 can be reduced by minimizing length and area, and the electrical lines out 102, 106 can be formed of a material with lower resistivity than the top conductive contact layer 160.

Figure 12G:
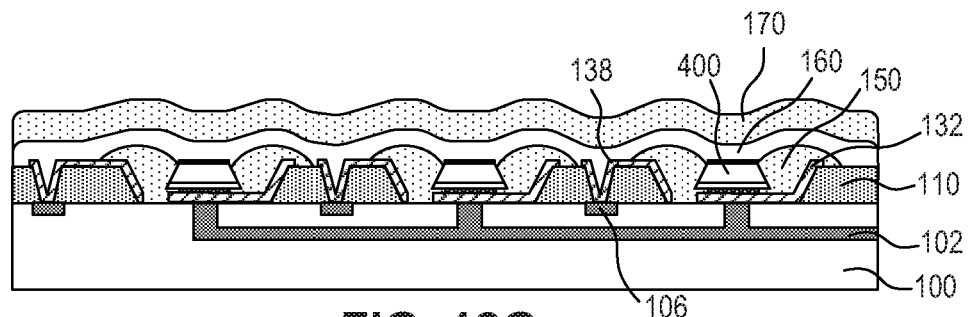
FIGS. 12G-12H are cross-sectional side view illustrations of an array of light emitting devices mounted within the reflective bank structure described with regard to FIG. 3J in electrical contact with an electrical line out of FIG. 2C in accordance with embodiments of the invention.
Figure 12H:
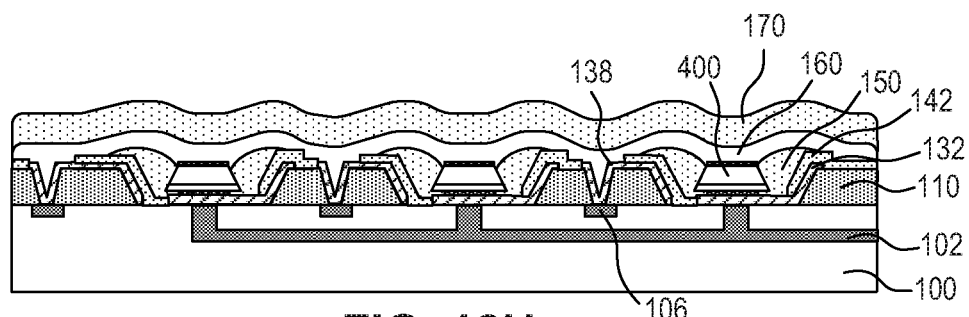

Referring now to FIGS. 12G-12H, in an embodiment, a continuous top conductive contact layer 160 is formed over each light emitting device 400 and in electrical contact with the top electrodes 470, if present, and an electrical line out 106 of FIG. 2C. As illustrated, the continuous top conductive contact layer 160 is in electrical communication with an array of light emitting devices 400 and a single electrical line out 106. The embodiments illustrated in FIGS. 12G-12H differ in that the embodiment of FIG. 12H includes a transparent insulator layer 142, while the embodiment of FIG. 12G does not. As shown, the inclusion of the transparent insulator layer 142 may assist in electrically isolating the reflective bank layers 132 and reflective via layers 138 from the top conductive contact 160.

Figure 12I:
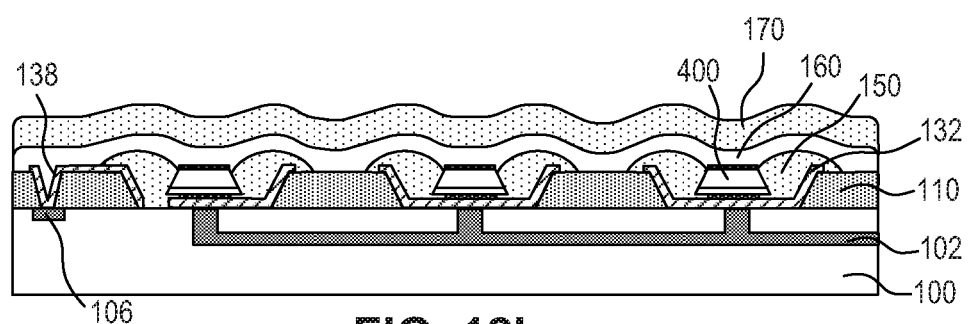
FIGS. 12I-12J are cross-sectional side view illustrations of an array of light emitting devices mounted within the reflective bank structure described with regard to FIG. 3K in electrical contact with an electrical line out of FIG. 2D in accordance with embodiments of the invention.
Figure 12J:
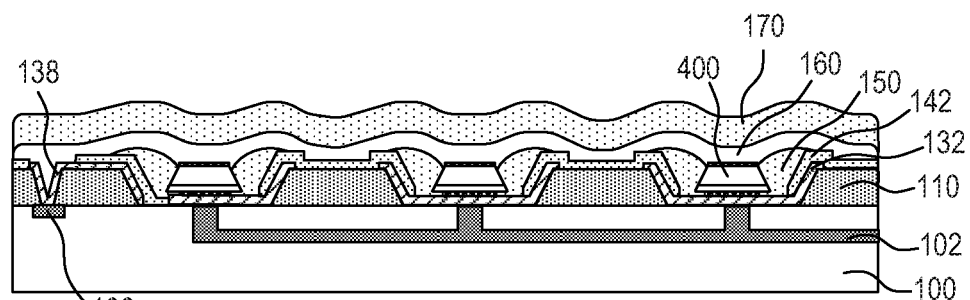

Referring now to FIGS. 12I-12J, in an embodiment, a continuous top conductive contact layer 160 is formed over each light emitting device 400 and in electrical contact with the top electrodes 470, if present, and an electrical line out 106 of FIG. 2D. As illustrated, the continuous top conductive contact layer 160 is in electrical communication with an array of light emitting devices 400 and a single electrical line out 106. The embodiments illustrated in FIGS. 12I-12J differ in that the embodiment of FIG. 12J includes a transparent insulator layer 142, while the embodiment of FIG. 12I does not. As shown, the inclusion of the transparent insulator layer 142 may assist in electrically isolating the reflective bank layers 132 and reflective via layer 138 from the top conductive contact 160.

Figure 13A:
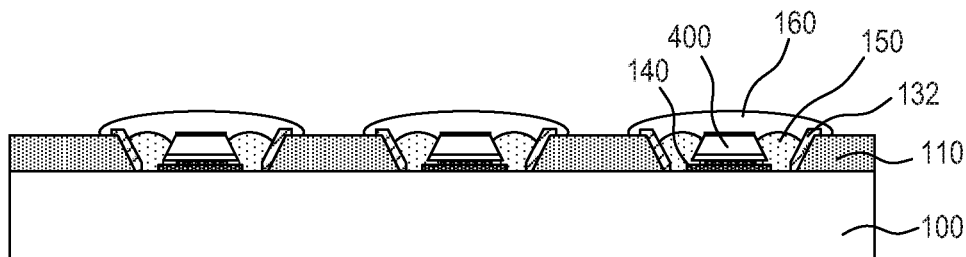
FIGS. 13A-13B are cross-sectional side view illustrations of an array of light emitting devices mounted within the reflective bank structure described with regard to FIG. 3E in accordance with embodiments of the invention.
Figure 13B:
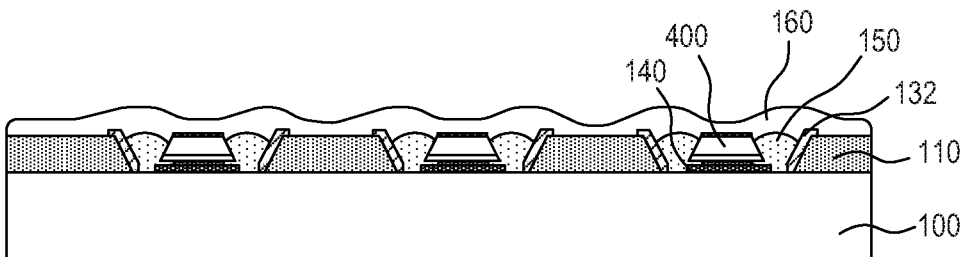

Referring now to FIGS. 13A-13B, in some embodiments an array of light emitting devices are mounted within the reflective bank structure described with regard to FIG. 3E. As illustrated, after the transfer of the array of light emitting devices 400, a sidewall passivation layer 150 may be formed around the sidewalls of the light emitting devices 400 within the array of bank openings 112 similarly as described with regard to FIGS. 9A-9B. As shown the bonding layer 140 is electrically isolated from the reflective bank layer 132. In the embodiment illustrated in FIG. 13A, a patterned top conductive contact layer 160 is formed over each light emitting device 400 in electrical contact with the top electrode 470, if present, and reflective bank layer 132. Contacting the reflective bank layer 132 may keep the reflective bank layer 132 from floating within the structure. In another embodiment, the top conductive contact layer 160 does not contact the reflective bank layer 132, and the reflective bank layer 132 is floating. In the embodiment illustrated in FIG. 13B, a continuous top conductive contact layer 160 is formed over each light emitting device 400 and in electrical contact with the top electrodes 470, if present, and reflective bank layer 132. Alternatively, the reflective bank layers 132 may be allowed to float.

Figure 13C:
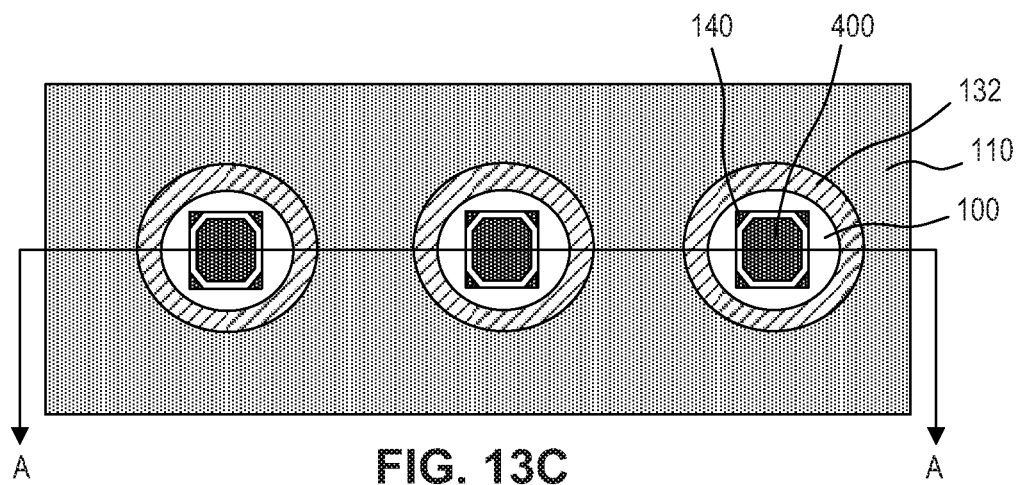
FIG. 13C is a top view illustration of FIG. 13A prior to formation of the sidewall passivation layer and top conductive contact in accordance with an embodiment of the invention.
Figure 13D:
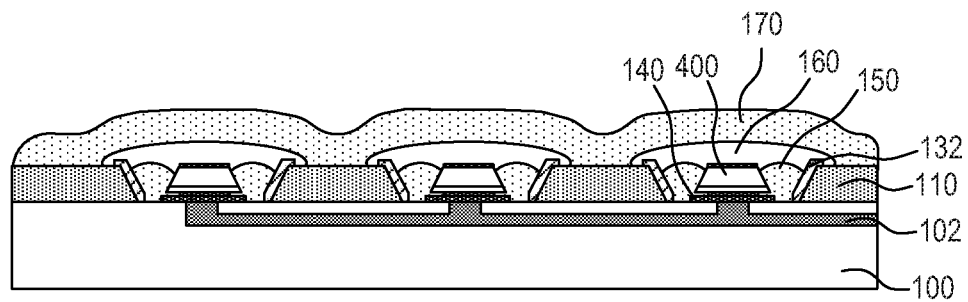
FIG. 13D is a cross-sectional side view illustration of the array of light emitting devices of FIG. 13A in electrical contact with an electrical line out of FIG. 2B in accordance with an embodiment of the invention.
Figure 13E:
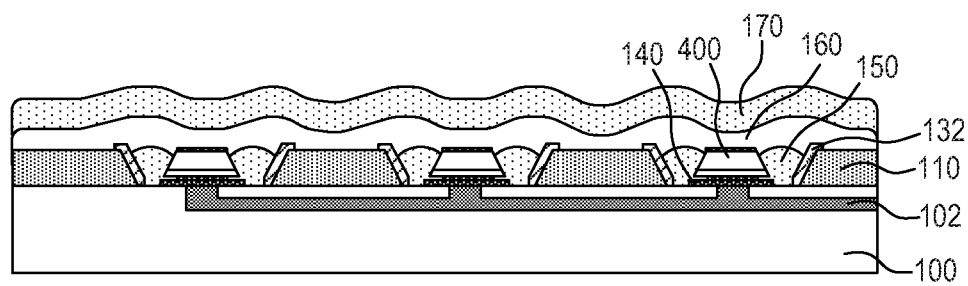
FIG. 13E is a cross-sectional side view illustration of the array of light emitting devices of FIG. 13B in electrical contact with an electrical line out of FIG. 2B in accordance with an embodiment of the invention.

FIG. 13C is a top view illustration of FIG. 13A prior to formation of the sidewall passivation layer 150 and top conductive contact layer 160 in accordance with an embodiment of the invention. FIG. 13D is a cross-sectional side view illustration of the array of light emitting devices of FIG. 13A in electrical contact with an electrical line out of FIG. 2B in accordance with embodiments of the invention. As shown a top passivation layer 170 is formed over the array of light emitting devices of FIG. 13A. FIG. 13E is a cross-sectional side view illustration of the array of light emitting devices of FIG. 13B in electrical contact with an electrical line out of FIG. 2B in accordance with embodiments of the invention. As shown a top passivation layer 170 is formed over the array of light emitting devices of FIG. 13B.

Figure 13F:
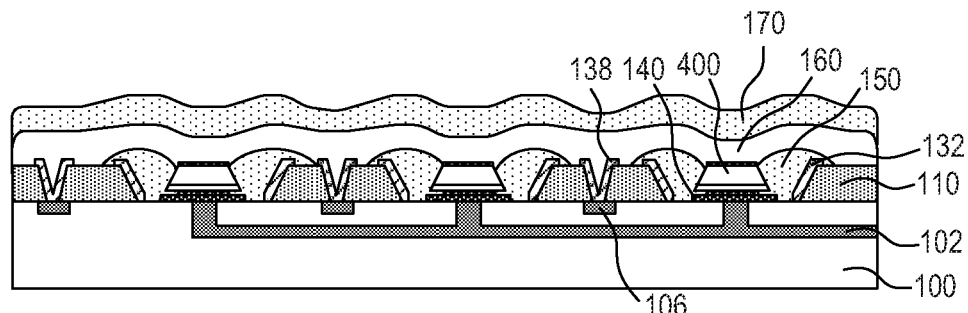
FIGS. 13F-13G are cross-sectional side view illustrations of an array of light emitting devices mounted within the reflective bank structure described with regard to FIG. 3L in electrical contact with an electrical line out of FIG. 2C in accordance with embodiments of the invention.
Figure 13G:
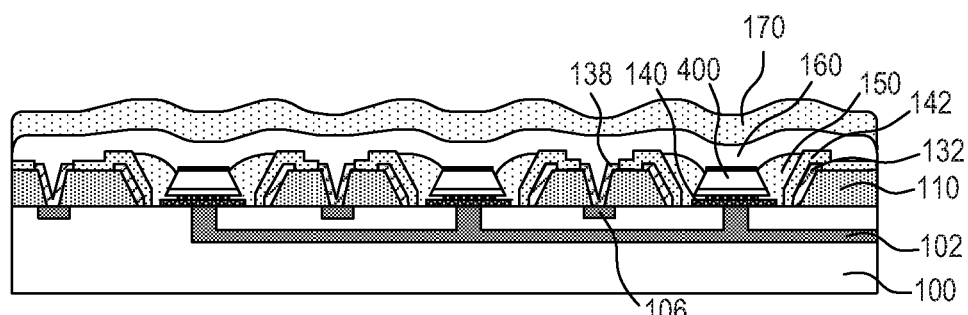

FIGS. 13F-13G are cross-sectional side view illustrations of an array of light emitting devices mounted within the reflective bank structure described with regard to FIG. 3L in electrical contact with an electrical line out of FIG. 2C in accordance with embodiments of the invention. The embodiments illustrated in FIGS. 13F-13G differ in that the embodiment of FIG. 13G includes a transparent insulator layer 142, while the embodiment of FIG. 13F does not. As shown, the inclusion of the transparent insulator layer 142 may assist in electrically isolating the reflective bank layers 132 from the top conductive contact 160.

Figure 13H:
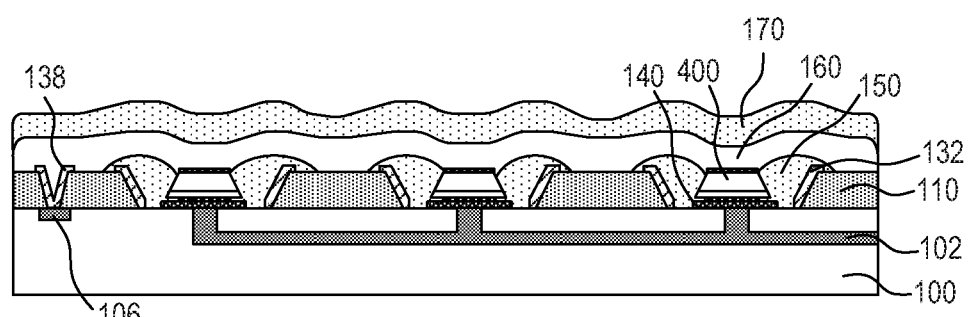
FIGS. 13H-13I are cross-sectional side view illustrations of an array of light emitting devices mounted within the reflective bank structure described with regard to FIG. 3M in electrical contact with an electrical line out of FIG. 2D in accordance with embodiments of the invention.
Figure 13I:
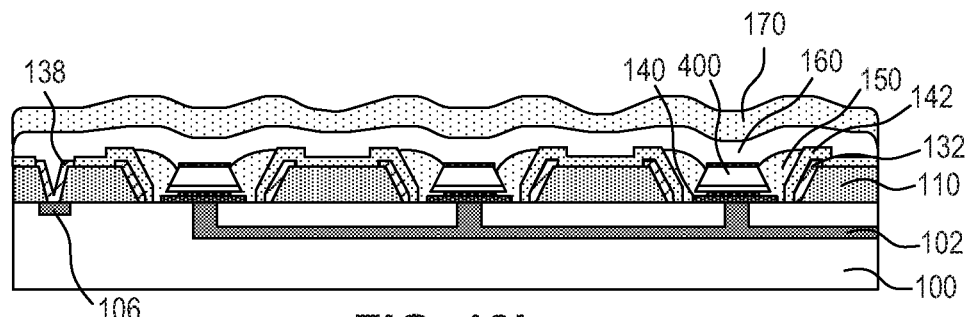

FIGS. 13H-13I are cross-sectional side view illustrations of an array of light emitting devices mounted within the reflective bank structure described with regard to FIG. 3M in electrical contact with an electrical line out of FIG. 2D in accordance with embodiments of the invention. The embodiments illustrated in FIGS. 13H-13I differ in that the embodiment of FIG. 13I includes a transparent insulator layer 142, while the embodiment of FIG. 13H does not. As shown, the inclusion of the transparent insulator layer 142 may assist in electrically isolating the reflective bank layers 132 from the top conductive contact 160.

Figure 13J:
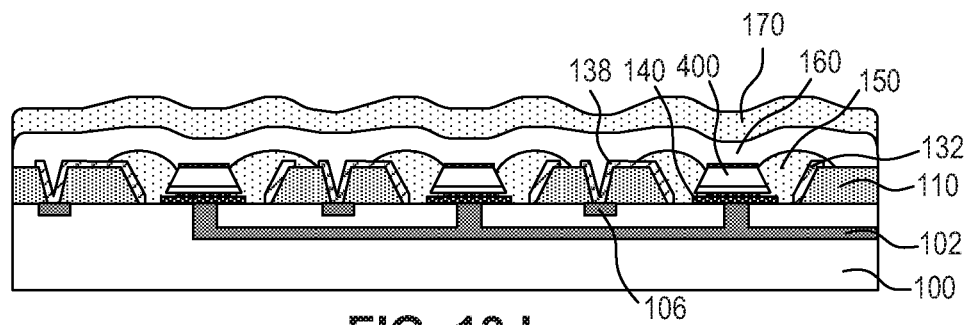
FIG. 13J-13K are cross-sectional side view illustrations of an array of light emitting devices mounted within the reflective bank structure described with regard to FIG. 3N in electrical contact with an electrical line out of FIG. 2C in accordance with embodiments of the invention.
Figure 13K:
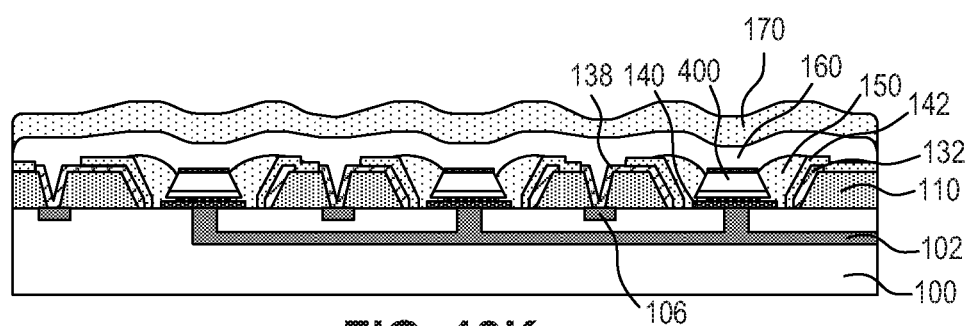

FIG. 13J-13K are cross-sectional side view illustrations of an array of light emitting devices mounted within the reflective bank structure described with regard to FIG. 3N in electrical contact with an electrical line out of FIG. 2C in accordance with embodiments of the invention. The embodiments illustrated in FIGS. 13J-13K differ in that the embodiment of FIG. 13K includes a transparent insulator layer 142, while the embodiment of FIG. 13J does not. As shown, the inclusion of the transparent insulator layer 142 may assist in electrically isolating the reflective bank layers 132 from the top conductive contact 160.

Figure 13L:
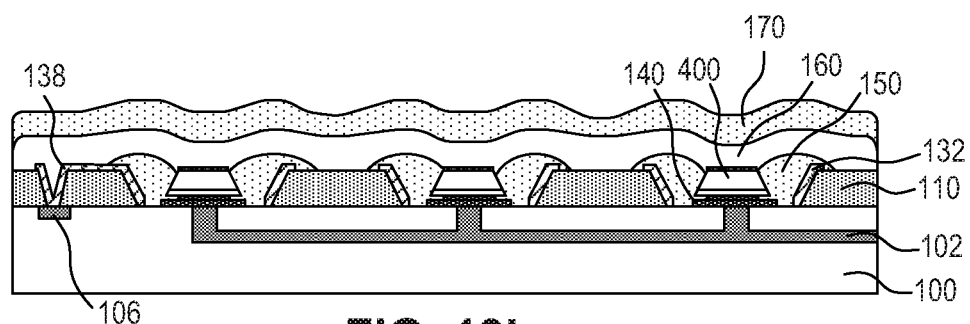
FIG. 13L-13M are cross-sectional side view illustration of an array of light emitting devices mounted within the reflective bank structure described with regard to FIG. 3O in electrical contact with an electrical line out of FIG. 2D in accordance with embodiments of the invention.
Figure 13M:
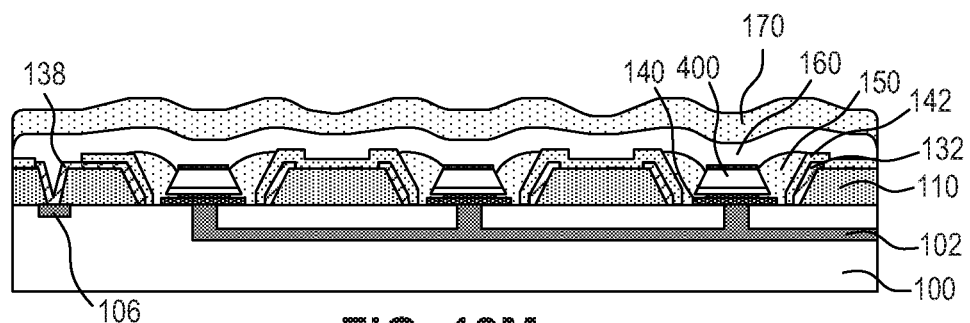

FIG. 13L-13M are cross-sectional side view illustration of an array of light emitting devices mounted within the reflective bank structure described with regard to FIG. 3O in electrical contact with an electrical line out of FIG. 2D in accordance with embodiments of the invention. The embodiments illustrated in FIGS. 13L-13M differ in that the embodiment of FIG. 13M includes a transparent insulator layer 142, while the embodiment of FIG. 13L does not. As shown, the inclusion of the transparent insulator layer 142 may assist in electrically isolating the reflective bank layers 132 from the top conductive contact 160. While not illustrated, in other embodiments, the top contact layer 160 illustrated in FIGS. 13E-13M may be replaced by an array of patterned top contact layers 160 as previously described and illustrated.

Figure 14A:
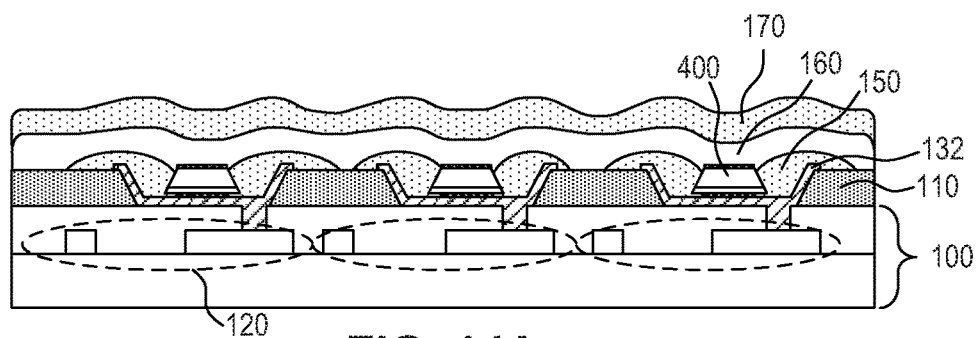
FIG. 14A-14B are cross-sectional side view illustrations of an array of light emitting devices mounted within the reflective bank structure described with regard to FIG. 3P in accordance with embodiments of the invention.
Figure 14B:
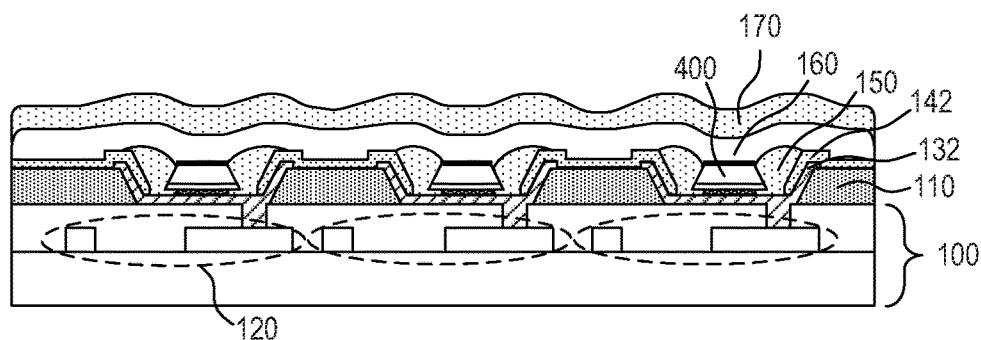

FIG. 14A-14B are cross-sectional side view illustrations of an array of light emitting devices mounted within the reflective bank structure described with regard to FIG. 3P in accordance with embodiments of the invention. As illustrated, after the transfer of the array of light emitting devices 400, a sidewall passivation layer 150 may be formed around the sidewalls of the light emitting devices 400 within the array of bank openings 112 similarly as described with regard to FIGS. 8A-8B. In the embodiments illustrated in FIGS. 14A-14B, a continuous top conductive contact layer 160 is formed over each light emitting device 400 and in electrical contact with the top electrodes 470, if present. The embodiments illustrated in FIGS. 14A-14B differ in that the embodiment of FIG. 14B includes a transparent insulator layer 142, while the embodiment of FIG. 14A does not. As shown, the inclusion of the transparent insulator layer 142 may assist in electrically isolating the reflective bank layers 132 from the top conductive contact 160.

Figure 14C:
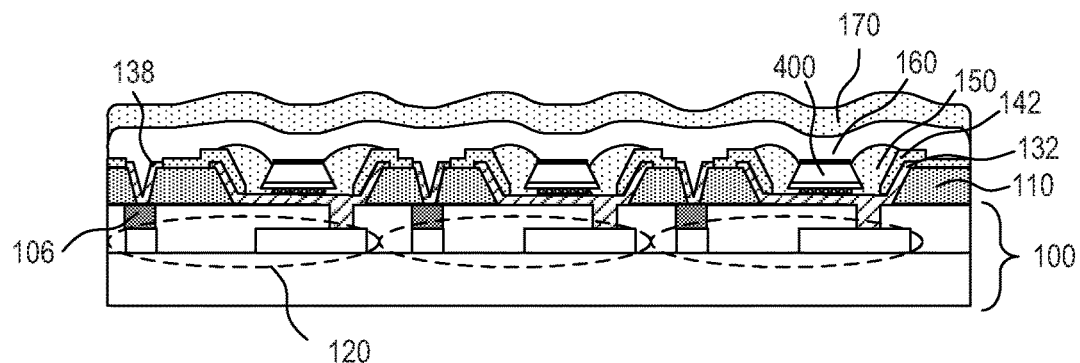
FIG. 14C is cross-sectional side view illustration of an array of light emitting devices mounted within the reflective bank structure described with regard to FIG. 3Q in accordance with an embodiment of the invention.

FIG. 14C is cross-sectional side view illustration of an array of light emitting devices mounted within the reflective bank structure described with regard to FIG. 3Q in accordance with an embodiment of the invention. In the embodiment illustrated in FIG. 14C, a continuous top conductive contact layer 160 is formed over an array of light emitting devices 400 and in electrical contact with the top electrodes 470, if present, and in contact with an array reflective via layers 138, if present.

Figure 14D:
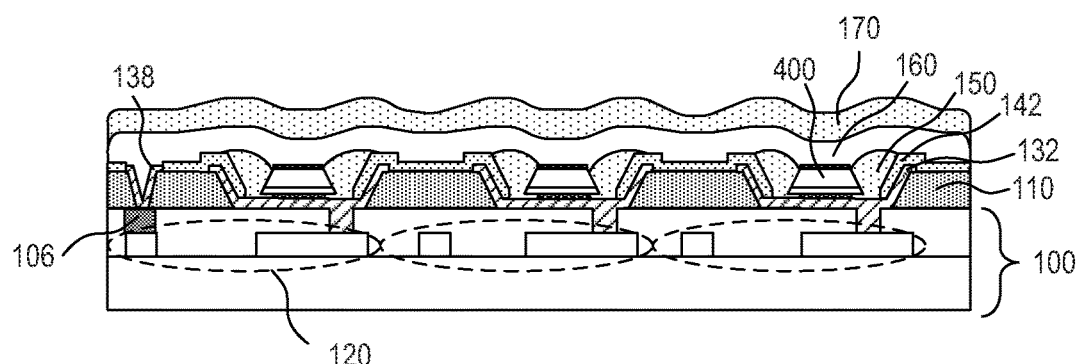
FIG. 14D is cross-sectional side view illustration of an array of light emitting devices mounted within the reflective bank structure described with regard to FIG. 3R in accordance with an embodiment of the invention.

FIG. 14D is cross-sectional side view illustration of an array of light emitting devices mounted within the reflective bank structure described with regard to FIG. 3R in accordance with an embodiment of the invention. In the embodiment illustrated in FIG. 14D, a continuous top conductive contact layer 160 is formed over an array of light emitting device 400 and in electrical contact with the top electrodes 470, if present, and in contact with a single reflective via layers 138, if present.

Figure 14E:
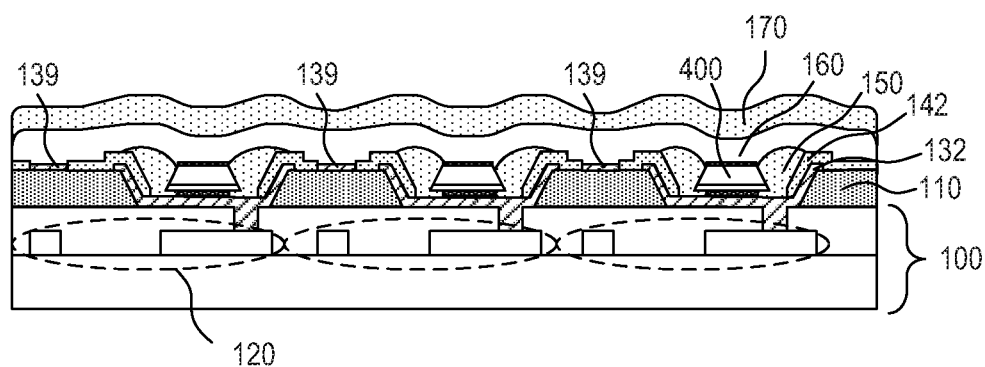
FIGS. 14E-14G are cross-sectional side view illustrations of an array of light emitting devices mounted within the reflective bank structures described with regard to FIG. 3S in accordance with embodiments of the invention.
Figure 14F:
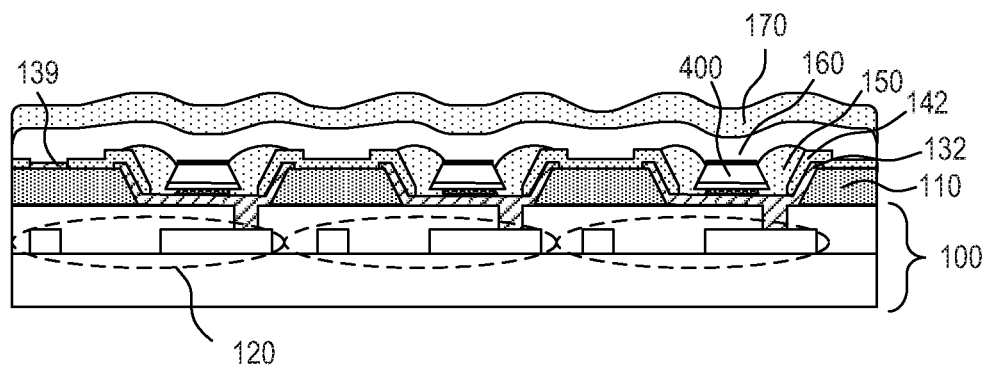
Figure 14G:
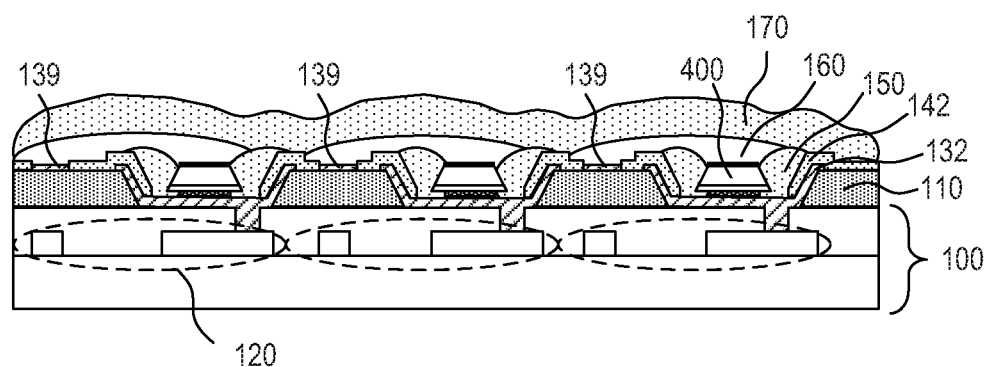

FIGS. 14E-14G are cross-sectional side view illustrations of an array of light emitting devices mounted within the reflective bank structures described with regard to FIG. 3S in accordance with embodiments of the invention. In the embodiment illustrated in FIG. 14E, a continuous top conductive contact layer 160 is formed over an array of light emitting devices 400 and in electrical contact with the top electrodes 470, if present, and in contact with an array of electrical lines out 139. In the embodiment illustrated in FIG. 14F, a continuous top conductive contact layer 160 is formed over an array of light emitting device 400 and in electrical contact with the top electrodes 470, if present, and in contact with a single electrical line out 139.

While FIGS. 14A-14F have been illustrated as including a continuous top conductive contact layer, in alternative embodiments, a patterned top conductive contact layer 160 may be formed over each light emitting device 400 in electrical contact with the top electrode 470, if present, as previously described and illustrated. For example, in an embodiment to FIG. 14G the top contact layer 160 may be replaced by an array of patterned top contact layers 160 formed over an array of light emitting devices 400 and in electrical contact with the top electrodes 470, if present, and in contact with an array of electrical lines out 139. Further, while FIGS. 14C-14G have been illustrated as including a transparent insulator layer 142, in other embodiments, a transparent insulator layer 142 is not present.

Figure 15A:
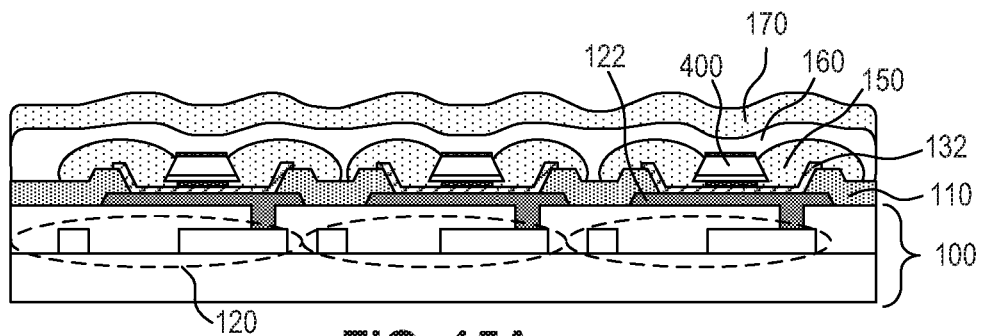
FIG. 15A-15B are cross-sectional side view illustrations of an array of light emitting devices mounted within the reflective bank structure described with regard to FIG. 3T in accordance with embodiments of the invention.
Figure 15B:
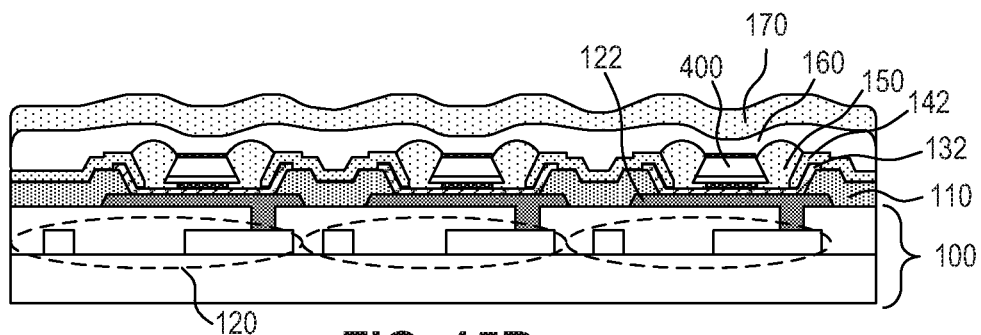

FIG. 15A-15B are cross-sectional side view illustrations of an array of light emitting devices mounted within the reflective bank structure described with regard to FIG. 3T in accordance with embodiments of the invention. As illustrated, after the transfer of the array of light emitting devices 400, a sidewall passivation layer 150 may be formed around the sidewalls of the light emitting devices 400 within the array of bank openings 112 similarly as described with regard to FIGS. 8A-8B. In the embodiments illustrated in FIGS. 15A-15B, a continuous top conductive contact layer 160 is formed over each light emitting device 400 and in electrical contact with the top electrodes 470, if present. The embodiments illustrated in FIGS. 15A-15B differ in that the embodiment of FIG. 15B includes a transparent insulator layer 142, while the embodiment of FIG. 15A does not. As shown, the inclusion of the transparent insulator layer 142 may assist in electrically isolating the reflective bank layers 132 from the top conductive contact 160.

Figure 15C:
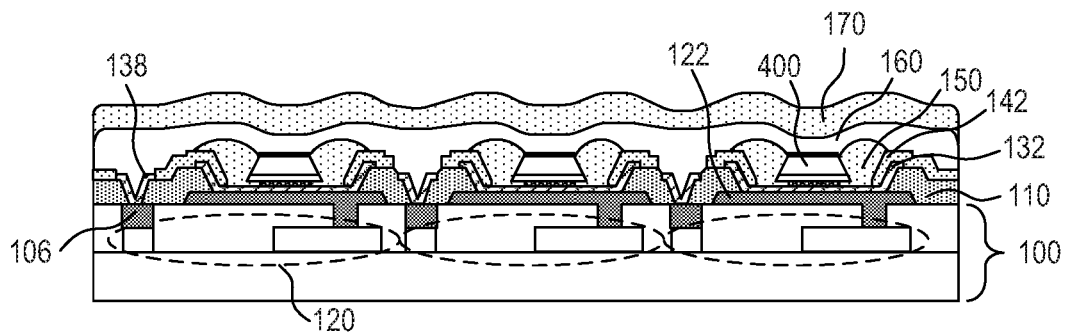
FIG. 15C is cross-sectional side view illustration of an array of light emitting devices mounted within the reflective bank structure described with regard to FIG. 3U in accordance with an embodiment of the invention.

FIG. 15C is cross-sectional side view illustration of an array of light emitting devices mounted within the reflective bank structure described with regard to FIG. 3U in accordance with an embodiment of the invention. In the embodiment illustrated in FIG. 15C, a continuous top conductive contact layer 160 is formed over an array of light emitting device 400 and in electrical contact with the top electrodes 470, if present, and in contact with an array reflective via layers 138, if present.

Figure 15D:
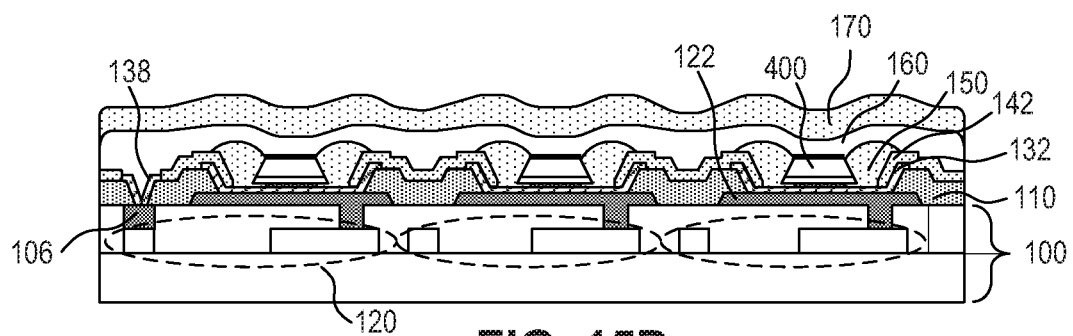
FIG. 15D is cross-sectional side view illustration of an array of light emitting devices mounted within the reflective bank structure described with regard to FIG. 3V in accordance with an embodiment of the invention.

FIG. 15D is cross-sectional side view illustration of an array of light emitting devices mounted within the reflective bank structure described with regard to FIG. 3V in accordance with an embodiment of the invention. In the embodiment illustrated in FIG. 15D, a continuous top conductive contact layer 160 is formed over an array of light emitting device 400 and in electrical contact with the top electrodes 470, if present, and in contact with a single reflective via layer 138, if present.

Figure 15E:
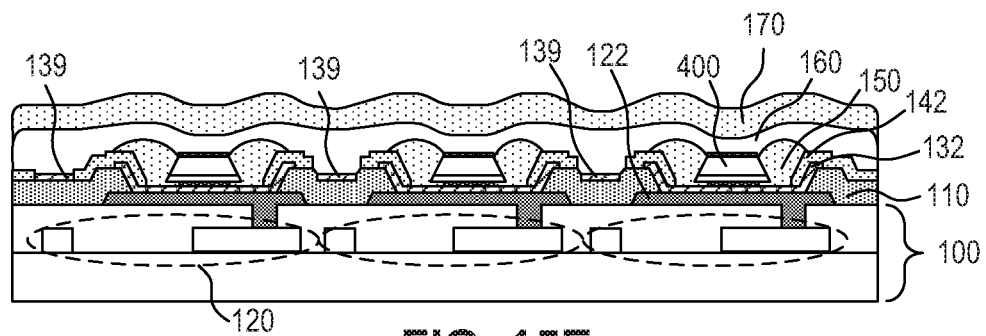
FIGS. 15E-15G are cross-sectional side view illustrations of an array of light emitting devices mounted within the reflective bank structures described with regard to FIG. 3W in accordance with embodiments of the invention.
Figure 15F:
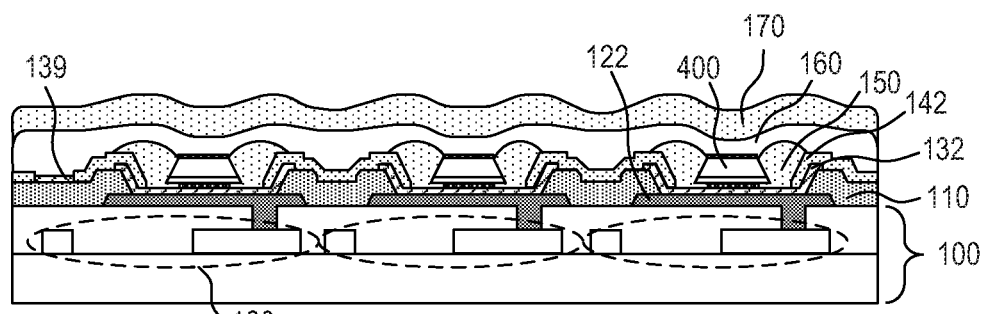
Figure 15G:
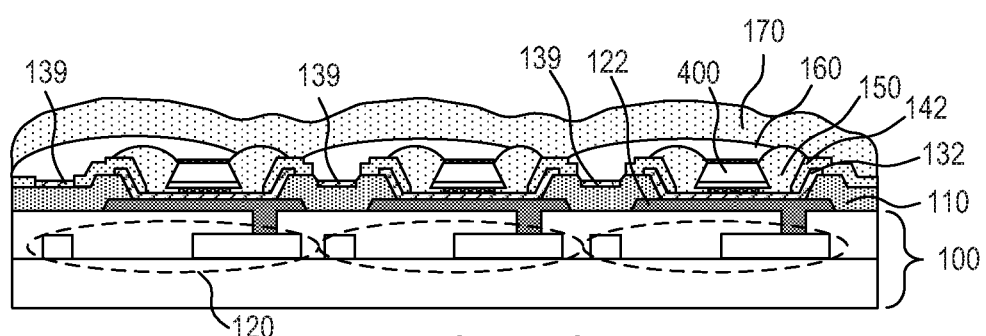

FIGS. 15E-15G are cross-sectional side view illustrations of an array of light emitting devices mounted within the reflective bank structures described with regard to FIG. 3W in accordance with embodiments of the invention. In the embodiment illustrated in FIG. 15E, a continuous top conductive contact layer 160 is formed over an array of light emitting devices 400 and in electrical contact with the top electrodes 470, if present, and in contact with an array of electrical lines out 139. In the embodiment illustrated in FIG. 15F, a continuous top conductive contact layer 160 is formed over an array of light emitting device 400 and in electrical contact with the top electrodes 470, if present, and in contact with a single electrical line out 139.

While FIGS. 15A-15F have been illustrated as including a continuous top conductive contact layer, in alternative embodiments, a patterned top conductive contact layer 160 may be formed over each light emitting device 400 in electrical contact with the top electrode 470, if present, as previously described and illustrated. For example, in an embodiment to FIG. 15G the top contact layer 160 may be replaced by an array of patterned top contact layers 160 formed over an array of light emitting devices 400 and in electrical contact with the top electrodes 470, if present, and in contact with an array of electrical lines out 139. Further, while FIGS. 15C-15G have been illustrated as including a transparent insulator layer 142, in other embodiments, a transparent insulator layer 142 is not present.

In utilizing the various aspects of this invention, it would become apparent to one skilled in the art that combinations or variations of the above embodiments are possible for mounting an array of light emitting devices within a reflective bank structure. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A light emitting structure comprising:
a substrate;
an insulating layer on the substrate;
a via layer extending through the insulating layer and in electrical connection with an electrical line in the substrate;
an array of bank openings extending completely through a thickness of the insulating layer, each bank opening including sidewalls;
an array of laterally separate reflective bank layers within an array of bank openings in the insulating layer, wherein each reflective bank layer spans the sidewalls of a corresponding bank opening and is on the substrate within the bank opening;
a corresponding array of vertical light emitting diode devices on the array of reflective bank layers within the array of bank openings; and
a top conductive contact layer in electrical contact with the array of vertical light emitting diode devices and the via layer, wherein the top conductive contact layer is formed of a transparent or semi-transparent material.

2. The light emitting structure of claim 1, wherein each reflective bank layer is electrically connected to circuitry within the substrate.

3. The light emitting structure of claim 1, wherein each vertical light emitting diode device in the array of vertical light emitting diode devices includes a micro p-n diode that includes a top p-doped or n-doped layer, a lower p-doped or n-doped layer, and one or more quantum well layers between the top and lower p-doped or n-doped layers, and wherein the micro p-n diode includes one or more layers based on II-VI materials or III-V materials.

4. The light emitting structure of claim 1, wherein the top conductive contact layer is formed of material selected from the group consisting of amorphous silicon, a transparent conductive oxide, and a transparent conductive polymer.

5. The light emitting structure of claim 1, wherein the electrical line is a cathode line.

6. The light emitting structure of claim 1, wherein the laterally separate reflective bank layers comprise a metallic film.

7. The light emitting structure of claim 1, wherein the laterally separate reflective bank layers include a multiple-layer stack.

8. The light emitting structure of claim 2, wherein a bottom surface of each reflective bank layer is on a conductive contact pad electrically connected to the circuitry within the substrate.

9. The light emitting structure of claim 3, wherein each vertical light emitting diode device in the array of vertical light emitting diode devices has a maximum width of 1 µm-100 µm.

10. The light emitting structure of claim 3, wherein each vertical light emitting diode device in the array of vertical light emitting diode devices has a maximum width of 1 µm-5 µm.

11. The light emitting structure of claim 3, wherein no vertical light emitting diode device spans along a sidewall of a corresponding bank opening.

12. The light emitting structure of claim 10, wherein each vertical light emitting diode device in the array of vertical light emitting diode devices has a maximum thickness of 5 µm or less.

13. The light emitting structure of claim 7, wherein the multi-layer stack includes a metallic layer selected from the group consisting of silver, aluminum, and titanium.

* * * * *